(12) United States Patent
Reynolds et al.

(10) Patent No.: US 8,358,226 B2
(45) Date of Patent: Jan. 22, 2013

(54) DETERMINING ACTUATION OF MULTI-SENSOR-ELECTRODE CAPACITIVE BUTTONS

(75) Inventors: Joseph Kurth Reynolds, Mountain View, CA (US); Tracy Scott Dattalo, Santa Clara, CA (US); Raymond A Trent, Jr., San Jose, CA (US); John M Feland, III, San Jose, CA (US); Izhak Baharav, Palo Alto, CA (US); John P Maloney, Jr., Mountain View, CA (US)

(73) Assignee: Synaptics Incorporated, Santa Clara, CA (US)

( * ) Notice: Subject to any disclaimer, the term of this patent is extended or adjusted under 35 U.S.C. 154(b) by 970 days.

(21) Appl. No.: 12/259,255

(22) Filed: Oct. 27, 2008

(65) Prior Publication Data

US 2009/0128374 A1    May 21, 2009

Related U.S. Application Data

(60) Provisional application No. 61/000,784, filed on Oct. 28, 2007.

(51) Int. Cl.
 *G08C 21/00* (2006.01)
(52) U.S. Cl. ..................................... 341/33; 178/18.06
(58) Field of Classification Search ............... 341/33
 See application file for complete search history.

(56) References Cited

U.S. PATENT DOCUMENTS

| | | | |
|---|---|---|---|
| 4,016,490 A | 4/1977 | Weckenmann et al. | |
| 4,733,222 A | 3/1988 | Evans | |
| 4,848,496 A | 7/1989 | Murakami et al. | |
| 5,305,017 A | 4/1994 | Gerpheide | |
| 5,657,012 A | 8/1997 | Tait | |
| 5,767,457 A | 6/1998 | Gerpheide et al. | |
| 5,880,411 A | 3/1999 | Gillespie et al. | |
| 5,942,733 A | 8/1999 | Allen et al. | |
| 6,310,611 B1 | 10/2001 | Caldwell | |
| 6,492,979 B1 | 12/2002 | Kent et al. | |
| 6,535,200 B2 | 3/2003 | Philipp | |
| 6,587,093 B1 | 7/2003 | Shaw et al. | |
| 6,610,936 B2 | 8/2003 | Gillespie et al. | |
| 6,642,857 B1 | 11/2003 | Schediwy et al. | |
| 7,030,860 B1 | 4/2006 | Hsu et al. | |
| 7,176,885 B2 | 2/2007 | Troxell et al. | |
| 7,253,643 B1 * | 8/2007 | Seguine | 324/686 |
| 7,256,714 B2 | 8/2007 | Philipp | |
| 7,323,885 B2 | 1/2008 | Gutendorf | |
| 7,323,886 B2 | 1/2008 | Lee | |

(Continued)

FOREIGN PATENT DOCUMENTS

WO    WO-02093542    11/2002

OTHER PUBLICATIONS

Macovetskyi, Michael et al., "Capcitance Sensing—PC-Compatible USB CapSense Matrix Keyboard", *Cypress Semiconductor Corporation*, (Feb. 16, 2007),1-8.

*Primary Examiner* — Rexford Barnie
*Assistant Examiner* — Angela Brooks

(57) ABSTRACT

Methods for determining actuation of a capacitive button are described. In some embodiments, indicia from the at least three distinct sensor electrodes associated with at least three sensor electrode elements comprising the capacitive button are received, the indicia indicative of interaction of an input object with the at least three distinct sensor electrodes. The actuation of the capacitive button is then determined, based at least in part on satisfying a set of criteria comprising: a location condition concerning a location of the input object relative to a center of the capacitive button, and a coupling condition concerning a change in capacitive coupling of the at least three distinct sensor electrodes associated with the at least three sensor electrode elements comprising the capacitive button.

30 Claims, 25 Drawing Sheets

U.S. PATENT DOCUMENTS

| | | |
|---|---|---|
| 7,932,897 B2 * | 4/2011 | Elias et al. ............... 345/174 |
| 8,004,497 B2 * | 8/2011 | Xiaoping ................... 345/173 |
| 2002/0015024 A1 | 2/2002 | Westerman et al. |
| 2002/0033795 A1 | 3/2002 | Shahoian et al. |
| 2002/0109672 A1 | 8/2002 | Kehlstadt et al. |
| 2004/0252109 A1 | 12/2004 | Trent, Jr. et al. |
| 2005/0052429 A1 | 3/2005 | Philipp |
| 2005/0088417 A1 | 4/2005 | Mulligan |
| 2006/0032680 A1 | 2/2006 | Elias et al. |
| 2006/0192690 A1 | 8/2006 | Philipp |
| 2006/0274042 A1 | 12/2006 | Krah et al. |
| 2007/0057167 A1 * | 3/2007 | MacKey et al. ........... 250/221 |
| 2007/0164756 A1 | 7/2007 | Lee |
| 2007/0230822 A1 * | 10/2007 | Bolender .................. 382/286 |
| 2007/0236450 A1 | 10/2007 | Colgate et al. |
| 2007/0273561 A1 | 11/2007 | Philipp |
| 2007/0285872 A1 | 12/2007 | Jeong |
| 2007/0296709 A1 | 12/2007 | GuangHai |
| 2008/0006453 A1 | 1/2008 | Hotelling |
| 2008/0006454 A1 | 1/2008 | Hotelling |
| 2008/0007539 A1 | 1/2008 | Hotelling |
| 2008/0078590 A1 * | 4/2008 | Sequine ................... 178/18.06 |
| 2008/0110739 A1 * | 5/2008 | Peng et al. ................ 200/5 R |
| 2009/0033343 A1 * | 2/2009 | Reynolds et al. ......... 324/688 |
| 2009/0273573 A1 | 11/2009 | Hotelling |

\* cited by examiner

DETERMINING ACTUATION OF MULTI-SENSOR-ELECTRODE CAPACITIVE BUTTONS

RELATED APPLICATIONS

This application is related to commonly assigned, copending U.S. application Ser. No. 12/259,182, entitled "Multiple-Sensor-Electrode Capacitive Button" with filing date Oct. 27, 2008 which is a non-provisional application and claims priority to the co-pending provisional patent application Ser. No. 61/000,784, entitled "Capacitive Buttons," with filing date Oct. 28, 2007, and assigned to the assignee of the present invention, which are both herein incorporated by reference in their entirety.

BACKGROUND

Capacitive sensing devices are widely used in modern electronic devices. For example, capacitive sensing devices have been employed in music and other media players, cell phones and other communications devices, remote controls, personal digital assistants (PDAs), and the like. These capacitive sensing devices are often used for touch based navigation, selection, or other functions. These functions can be in response to one or more fingers, styli, other objects, or combination thereof providing input in the sensing regions of respective capacitive sensing devices.

However, there exist many limitations to the current state of technology with respect to capacitive sensing devices. As one example, limitations are known to be associated with capacitive button sensing systems.

SUMMARY

In various embodiments, methods for determining actuation of a capacitive button having at least three sensor electrode elements associated with at least three distinct sensor electrodes are described. In one such embodiment, indicia from the at least three distinct sensor electrodes are received. An actuation of the capacitive button based at least in part on satisfying a set of criteria is indicated. This set of criteria comprises a location condition concerning a location of the input object relative to a center of the capacitive button. The set of criteria further comprises a coupling condition concerning a change in capacitive coupling of the at least three distinct sensor electrodes of the capacitive button.

In various other embodiments, capacitive button apparatuses are described. One such apparatus includes a first capacitive button and a second capacitive button. The first capacitive button has a first set of sensor electrode elements configured to enable the generation of at least three electrode values for determining actuation of the first capacitive button. This first set of sensor electrode elements has at least three sensor electrode elements associated with distinct sensor electrodes. The second capacitive button has a second set of sensor electrode elements configured to enable the generation of at least three electrode values for determining actuation of the second capacitive button. This second set of sensor electrode elements has at least three sensor electrode elements associated with distinct sensor electrodes.

In order to improve capacitive button performance, such as by reducing false actuations, supporting non-button actuation input, and the like, capacitive buttons described herein use multiple sensor electrodes.

BRIEF DESCRIPTION OF THE DRAWINGS

The accompanying drawings, which are incorporated in and form a part of this specification, illustrate embodiments of the technology for multiple-sensor-electrode capacitive buttons and, together with the description, serve to explain principles discussed below.

Figure 1:
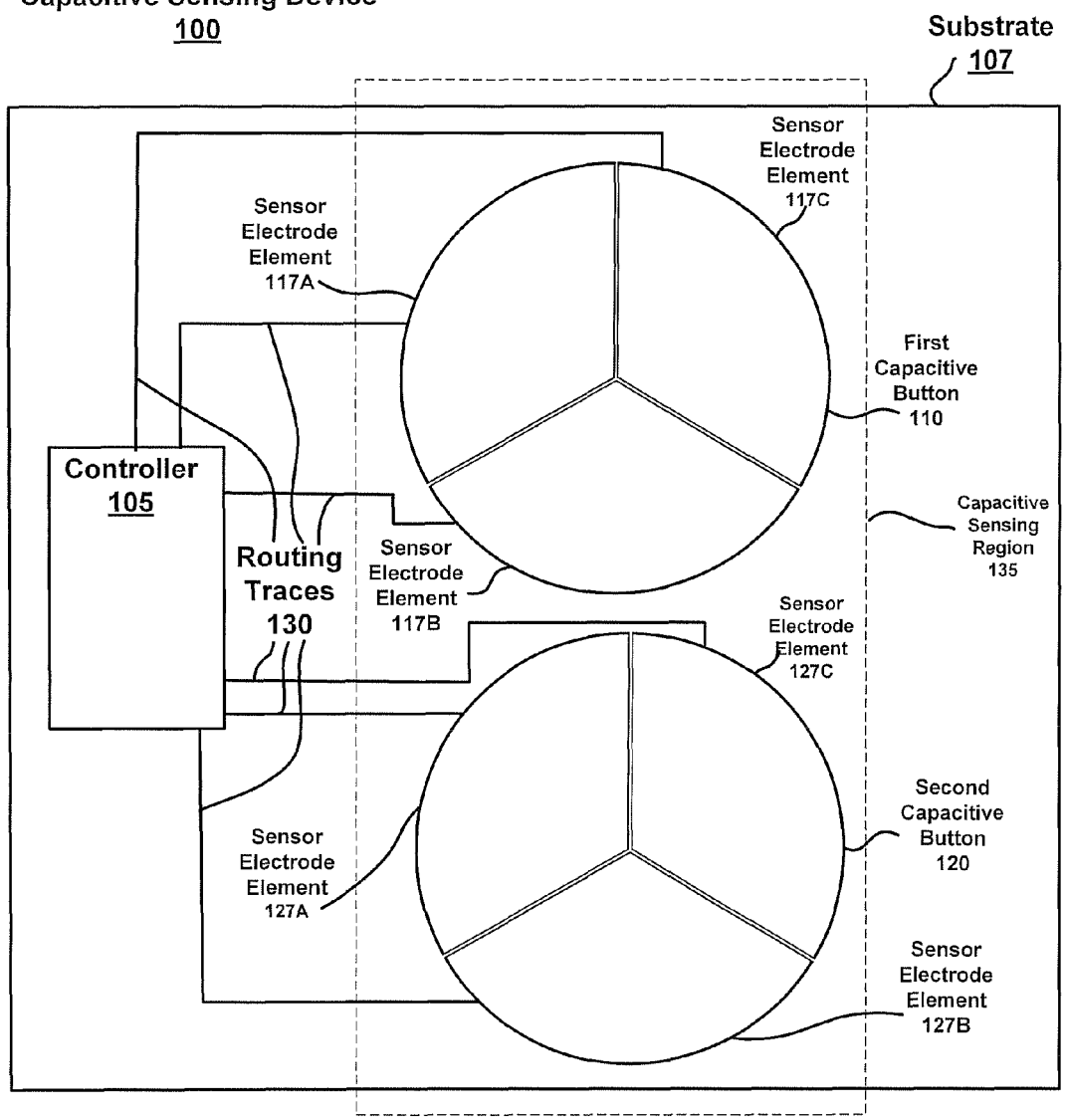
FIG. 1 is a block diagram of an example capacitive button arrangement in accordance with embodiments of the present technology.

The drawings referred to in this description should not be understood as being drawn to scale unless specifically noted.

DESCRIPTION OF EMBODIMENTS

Reference will now be made in detail to embodiments of the present technology, examples of which are illustrated in the accompanying drawings. While the present technology will be described in conjunction with embodiments, it will be understood that the descriptions are not intended to limit the present technology to these embodiments. On the contrary, the descriptions are intended to cover alternatives, modifications and equivalents, which may be included within the spirit and scope as defined by the appended claims. Furthermore, in the following detailed description, numerous specific details are set forth in order to provide a thorough understanding of embodiments of the present technology. However, one of ordinary skill in the art will understand that embodiments of the present technology may be practiced without these specific details. In other instances, well known methods, procedures, components, and circuits have not been described in detail as not to unnecessarily obscure aspects of the present technology.

Overview of Discussion

Embodiments in accordance with the present technology pertain to capacitive buttons and their usage. In one embodiment in accordance with the present technology, the capacitive sensing devices described herein improve distinguishing between input intended to actuate a capacitive button and input not intended to actuate a capacitive button. Indicia received from sensor electrodes associated with a capacitive button are used to determine electrode values. These electrode values are utilized to determine the actuation status of the capacitive button. Positional characteristics about one or more input objects may or may not be determined in support of gauging the actuation status of a capacitive button. The positional characteristics determined can include a myriad of diverse measurements related to the object(s) in a capacitive sensing region of the capacitive button, as discussed further below. Possible input objects include fingers, styli, and other input objects capable of conveying user input. The term "finger" is used herein to refer to any digit on a hand, including a thumb. The term "actuation" is used herein to refer to turning a capacitive button ON. Conversely, the term "activation" is used herein to refer to a sufficient user interaction that has occurred with respect to a sensor electrode.

In various embodiments, a capacitive button arrangement includes a plurality of multiple-sensor-electrode capacitive buttons ("MSE capacitive buttons"). Each MSE capacitive button is comprised of multiple sensor electrode elements belonging to distinct sensor electrodes. Where it may otherwise be unclear, "MSE capacitive button" is used in this document to distinguish from capacitive buttons that do not use a multiple-sensor-electrode approach. For example, a single capacitive button arrangement may include capacitive buttons of different types, including any combination of capacitive buttons having only a single sensor electrode element, exactly two sensor electrode elements, three sensor electrode elements, or any number of sensor electrode elements.

A sensor electrode in a capacitive button arrangement may have one or more sensor electrode elements. Thus, a single sensor electrode may include sensor electrode elements in multiple capacitive buttons, and thus be shared among those multiple capacitive buttons. A sensor electrode element that forms a portion of a sensor electrode is considered to belong to that sensor electrode, and is also considered to be associated with that sensor electrode. A set of sensor electrode elements including an element forming a portion of a sensor electrode is considered to be associated with that sensor electrode. Since the sensor electrode elements and sensor electrodes are used for capacitance sensing, they can also be termed "sensor electrode elements" and "sensor electrodes," respectively.

In various embodiments, each MSE capacitive button of a capacitive button arrangement is comprised of a set of sensor electrode elements associated with a plurality of sensor electrodes. Each of the sets of sensor electrode elements has at least three elements associated with distinct ones of the plurality of sensor electrodes. That is, each set of sensor electrode elements includes separate elements that form portions of at least three different sensor electrodes.

During operation, the plurality of sensor electrodes provides indicia that are received by a controller. The indicia reflect user input in the sensing region. Since user input in the sensing region affects the electric field surrounding the sensor electrodes, the indicia can be electric signals that change with the electric field surrounding the sensor electrodes. For example, the indicia may include voltages, currents, charges, frequencies, time constants, or any other items that varies with changes in the capacitive coupling to the sensor electrodes.

The controller utilizes the received indicia to generate at least three electrode values for each MSE capacitive button. Since one sensor electrode may have sensor electrode elements in multiple capacitive buttons, one electrode value may be associated with multiple capacitive buttons. Thus, the total number of electrode values generated by the controller may be less than three times the number of capacitive buttons, although that is not required. The electrode values generated by the controller may be linearly or non-linearly related to the capacitive coupling of the sensor electrodes (e.g. some representation of the capacitive coupling that is proportional to the change in capacitance, or that is proportional to a reciprocal of the change in capacitance). Since these electrode values are derived from indicia received from sensor electrodes, they can also be termed "sensor electrode values."

Oftentimes, the indicia and/or the electrode values is/are conditioned or filtered by the controller. The controller may do this by averaging, by subtracting baselines, by particular weighting functions determined by the capacitive button design, and the like.

The controller utilizes the electrode values to recognize user input, such as to determine whether or not a capacitive button is actuated. As discussed above, some embodiments determine positional characteristics about the input objects as part of the process for gauging the actuation status of a capacitive button while other embodiments do not. That is, embodiments of the present technology may calculate none, some, or all of the derivable positional characteristics.

Positional characteristics encompass a myriad of different information that may be derived about the interaction of input devices with MSE capacitive buttons. Many of the positional characteristics represent substantially independent spatial measurements of the user input within the sensing region. Some example positional characteristics represent estimates of the locations of inputs along one or more dimensions, at an instance in time or over a span of time. For example, the position of an input may be determined with respect to a 2D plane defined by the touch pad (e.g. as X and Y, as r and $\ominus$, or as any other appropriate set of coordinates).

Other examples of positional characteristics represent estimates of the amount of capacitive coupling to an input (e.g., as Z); the amount of capacitive coupling changes with the distance and size of the input, signals coupled into an input object, and the like. Additional examples of positional characteristics may include various time derivatives and integrals of other positional characteristics (e.g. of X, Y, or Z). Further examples of positional characteristics include averages, ratios, magnitudes, and combinations of any of the foregoing.

An MSE capacitive button may support any type of user interface. For example, they may be used with any of the devices which can be supported by non-MSE capacitive buttons. Examples include, and are not limited to: input devices such as keypads, keyboards, and remote controls; media devices such as cameras, video recorders or players, music recorders or players; communications or organizational devices such as personal digital assistants (PDAs), cell phones, GPS systems; and the like.

MSE capacitive buttons may also be indicated to the user in various ways. For example, any number of shapes and sizes of indicators may be placed between the sensor electrode elements and the user. This may include primarily visual indicators such as painted lines or lighted cutouts. This may also include primarily tactile indicators such as bumps, ridges, depressions, and the like. Additionally, according to some embodiments of the present technology, capacitive buttons are well suited to effecting a haptic response by providing information about anticipated or current button actuation directly or indirectly to a controller of a haptic feedback system.

The following discussion will begin with a detailed description focused on aspects of the structure in accordance with the present technology. This discussion will then be followed by a detailed description focused on aspects of the operation in accordance with the present technology.

Example Capacitive Button Arrangement

FIG. 1 is a block diagram of an example capacitive sensing device 100 in accordance with embodiments of the present technology. Capacitive sensing device 100 comprises a plurality of noncontiguous MSE capacitive buttons (two are shown, as first capacitive button 110 and second capacitive button 120) disposed on substrate 107 and capable of sensing objects within capacitive sensing region 135. First capacitive button 110, second capacitive button 120, and controller 105 are all shown disposed on the same substrate 107 in FIG. 1; disposing them on any number of separate substrates in other embodiments is possible and contemplated. The substrates can be rigid or flexible.

Capacitive sensing region 135 is a three-dimensional region extending from the capacitive buttons. Input objects in sensing region 135 may interact with the capacitive sensing device 100. The size and shape of capacitive sensing region 135 is defined by the mechanical and electrical characteristics of the capacitive sensing device 100 (e.g. shapes and sizes of surrounding materials, layout of electrodes and routing lines), the circuitry and algorithms of controller 105, the performance desired, and the like.

The MSE capacitive buttons of capacitive sensing device 100 are comprised of different sets of sensor electrode elements, where each set of sensor electrode elements have at least three members that are associated with different sensor electrodes. In FIG. 1, capacitive buttons 110 and 120 are each comprised of a set of three sensor electrode elements exactly: first capacitive button 110 has a first set including sensor electrode elements 117A-117C, and a second capacitive button 120 has a set including sensor electrode elements 127A-127C.

FIG. 1 shows a capacitive button arrangement in which sensor electrodes are not shared between MSE capacitive buttons. Specifically, the embodiment shown in FIG. 1 imposes a one-to-one relationship between sensor electrode elements of the two MSE capacitive buttons and a plurality of distinct sensor electrodes. This means that the two MSE capacitive buttons 110 and 120 do not have any sensor electrode elements associated with the same sensor electrode. (e.g. sensor electrode elements 117A-117C and 127A-127C all form portions of different sensor electrodes, and capacitive button 110 and 120 have no sensor electrodes in common.)

Although not shown in FIG. 1, one or more sensor electrodes in the capacitive sensing device 100 may be shared. The sharing may occur between any combination of MSE capacitive buttons, non-MSE capacitive buttons, other input devices, and the like. In the case where a sensor electrode is shared between MSE capacitive buttons, a many-to-one relationship exists between sensor electrode elements associated with that shared sensor electrode itself. In such a configuration, multiple sensor electrode elements, each forming a part of a different MSE capacitive button, would belong to the same sensor electrode. This many-to-one relationship allows a set of sensor channels to support more capacitive buttons than possible if a one-to-one relationship is imposed. This is discussed further below.

Regardless of whether or not the sensor electrodes are shared, each MSE capacitive button has at least three sensor electrode elements that are associated with different sensor electrodes. Thus, interaction with a capacitive button would cause changes in at least three sensor electrodes.

In some embodiment, some or all of the sensor electrode elements of an MSE capacitive button have a symmetric layout, and are thus disposed symmetrically. The symmetry may include rotational symmetry, mirror symmetry along one or more axes, or any other applicable form of symmetry. In some other embodiments, some or all of the sensor electrode elements of an MSE capacitive button have substantially equal areas. In some further embodiments, the sensor electrode elements of an MSE capacitive buttons all meet at a central area of their respective MSE capacitive buttons.

In yet other embodiments of the present technology, the sensor electrode elements of a capacitive button are disposed in such a way that the centers of different sensor electrode elements are substantially the same distance from a center of the capacitive button. Thus, at least two sensor electrode elements of the MSE capacitive button have centers that are substantially equidistant from a center of the MSE capacitive button. One way to gauge distances from the center is to examine estimated centroid locations of the sensor electrode elements and their capacitive button. The estimated centroid locations can be based on the area of each sensor electrode element. For example, in many embodiments where the capacitive button has approximately the shape traced out by its sensor electrode elements, and where the sensor electrode elements of the capacitive button are disposed about the center of the capacitive button symmetrically, a centroid of a first sensor electrode element of the capacitive button and a centroid of a second sensor electrode element of the capacitive button is substantially the same distance from the centroid of the capacitive button. The estimated centroid location can also be based on a weighted area of each sensor electrode element. For example, the areas of sensor electrode elements of an MSE capacitive button may be weighted by the amount of capacitive coupling that the sensor electrode elements are anticipated to have with input objects on a surface above the MSE capacitive button. In some embodiments, the centroid calculation ignores areas of the sensor electrode elements that are expected to experience little or no capacitive coupling changes from users during operation (e.g. areas having far away locations where significant capacitive coupling changes due to user input are expected to occur, areas shielded from effects of user input, and areas having dimensions or shapes that are expected to experience little or no capacitive coupling changes—such as narrow lines).

In further other embodiments, a combination of the above is implemented. For example, the sensor electrode elements of an MSE capacitive button may have both substantially equal areas and a symmetric layout. Examples of this are shown in FIG. 1, where all of the sensor electrode elements of capacitive button 110 (sensor electrode elements 117A-117C) are substantially equal in area and symmetrically disposed about a center of capacitive button 110. Similarly, sensor electrode elements 127A-127C of capacitive button 120 are also substantially equal in area and symmetrically disposed about a center of capacitive button 120.

Referring still to FIG. 1, sensor electrode elements 117A-117C and 127A-127C are ohmically coupled to controller 105 via routing traces 130. Furthermore, as noted in FIG. 1, first capacitive button 110 is noncontiguous with second capacitive button 120. This noncontiguity may be achieved by spacing the sets of sensor electrode elements apart. In some embodiments, first capacitive button 110 and second capacitive button 120 are disposed noncontiguously with respect to each other by spacing the first set of sensor electrode elements from the second set of sensor electrode elements (e.g. 117A-117C from the set of sensor electrode elements 127A-127C) by no less than one-half a finger width. In other embodiments, sensor electrode elements of noncontiguous capacitive buttons may be disposed closer to each other than one-half a finger width. The exact measure of one-half finger width would depend largely on the size of expected users. For many adult humans, one-half a finger width is about 3-8 (or even up to 10) mm for the pointer, middle, ring, or little fingers, while one-half a finger width would be about 6-12 (or even up to 15) mm for thumbs. The applicable finger width may vary depending on the orientation of the finger relative to the capacitive buttons (e.g. a 2-D projection of the input object presented to the capacitive button may be oval). The button spacing may vary as well with these considerations.

Thus, although FIG. 1 shows first capacitive button 110 in relatively close proximity to second capacitive button 120, FIG. 1 is meant to be a block diagram that is not strictly drawn to scale. Thus, first capacitive button 110 may not be in relatively close proximity to second capacitive button 120 in various physical implementations. For example, capacitive buttons 110 and 120 may be physically far apart, such as on different sides of an electronic display. As other examples, capacitive buttons 110 and 120 may also be spaced to make room for other user input devices such as mechanical switches or pointing sticks, to improve usability, to accommodate industrial design preferences, and the like.

Embodiments in accordance with the present technology are well suited to capacitive buttons having three or more sensor electrode elements each. In many embodiments, the capacitive buttons will have no more than four sensor electrode elements. Where a capacitive button has more than three sensor electrode elements, and especially if the capacitive button has more than four sensor electrode elements, it may be advantageous to ohmically couple some of the sensor electrode elements within the same capacitive button together. For example, for a capacitive button having six sensor electrode elements, it may be advantageous to short every three sensor electrode elements together and use them to form portions of the same sensor electrode. Other embodiments may prefer associating the six sensor electrode elements with 3, 4, 5, or 6 sensor electrodes.

Similarly, embodiments in accordance with the present technology are well suited to use with sensor electrodes that are shared or not shared between capacitive buttons. It should further be noted that embodiments in accordance with the present technology are well suited to any of various sizes, shapes, layouts, configurations, or orientations of sensor electrodes, sensor electrode elements, routing times, and the like. In many embodiments, the sensor electrode elements of the capacitive button are configured such that the capacitive button has a size that enables actuation by a human digit, such as a finger or a toe.

Figure 2A:
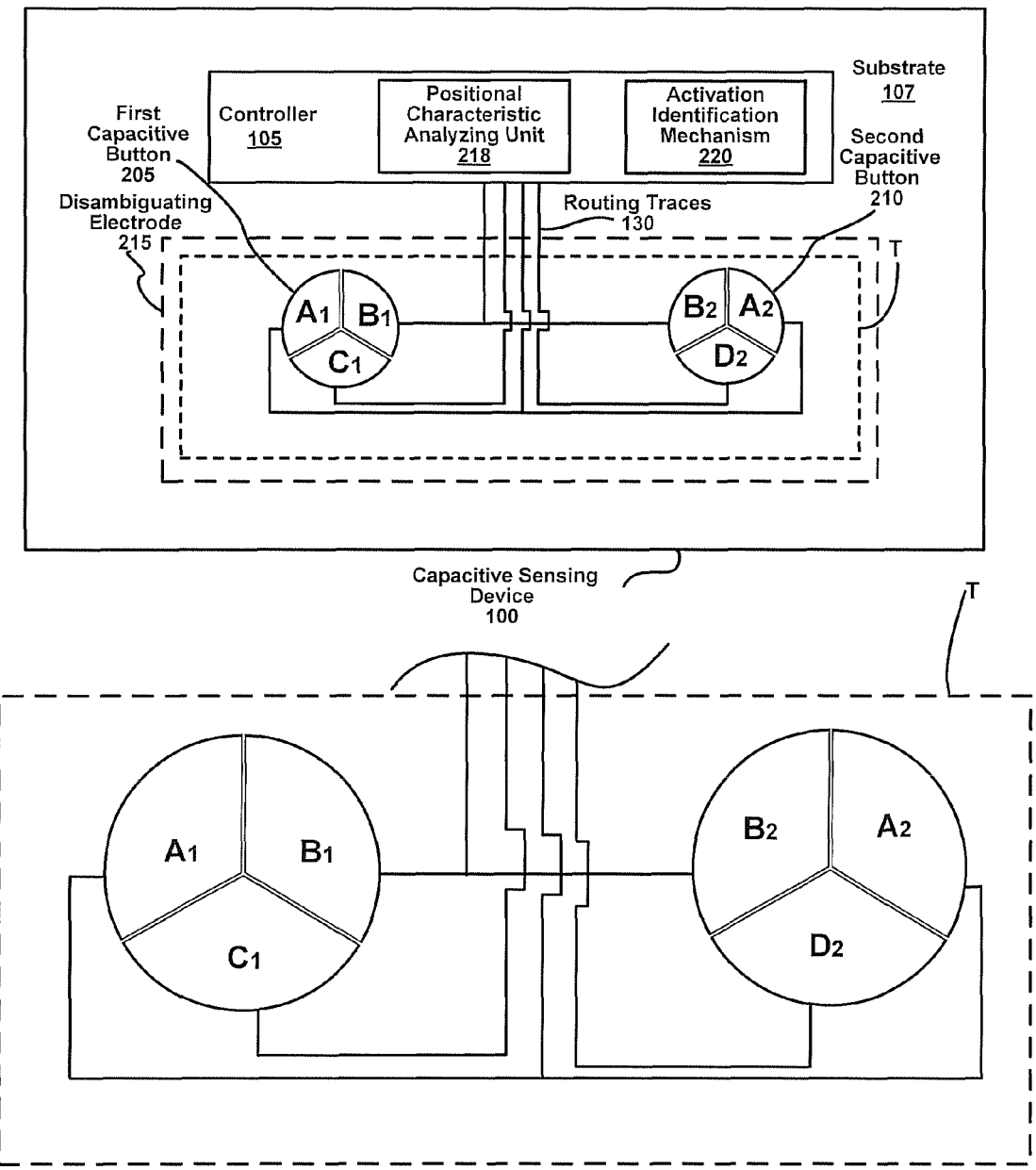
FIG. 2A is a block diagram of an example capacitive sensing device and an enlarged view of example components within the capacitive sensing device in accordance with embodiments of the present technology.

Referring to FIG. 2A, first capacitive button 110 includes sensor electrode elements $A_1$, $B_1$, and $C_1$ and second capacitive button 120 includes sensor electrode elements $A_2$, $B_2$ and $D_2$. Sensor electrode A comprises electrode elements $A_1$ and $A_2$, which are electrically coupled with each other. Sensor electrode B comprises sensor electrode elements $B_1$ and $B_2$, which are electrically coupled with each other. Sensor electrode C comprises electrode element $C_1$, and sensor electrode D comprises electrode element $D_2$. Thus, these six sensor electrode elements are associated with the four sensor electrodes A, B, C, and D, all of which are electrically coupled to controller 105.

Figure 4A:
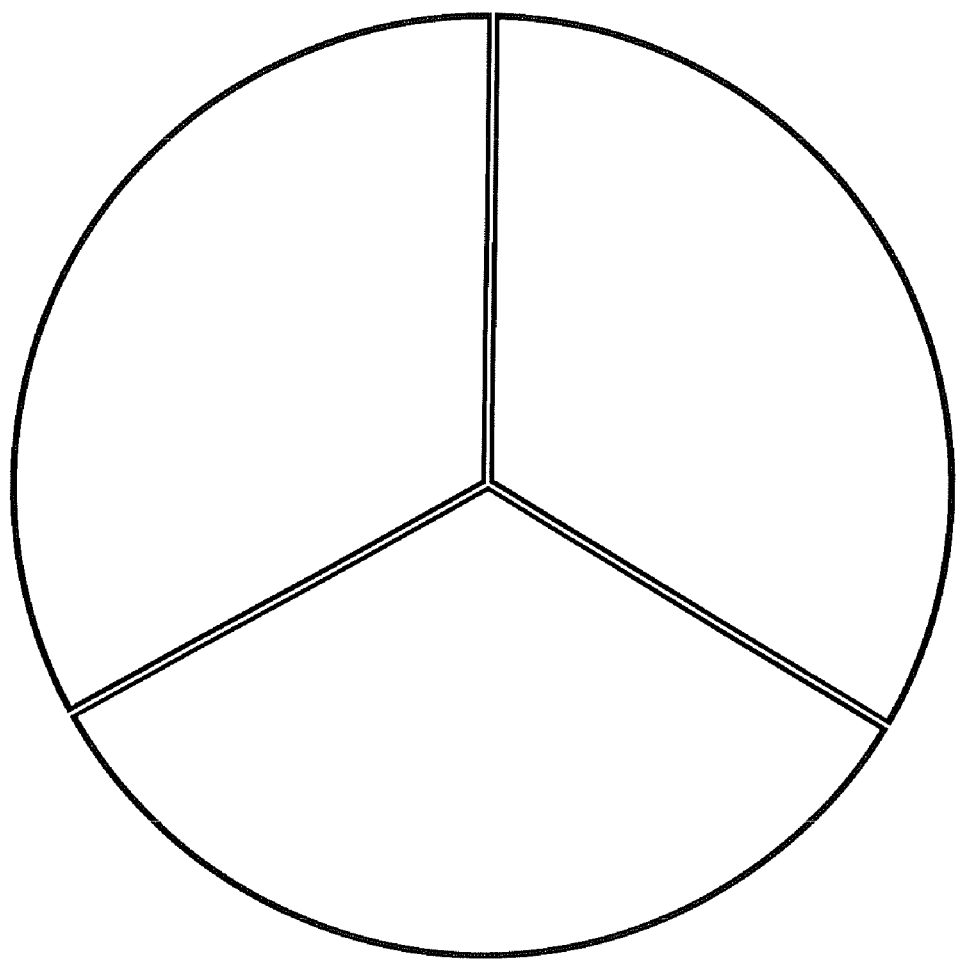
FIG. 4A is a diagram of a circular capacitive button with three sensor electrode elements in accordance with embodiments of the present technology.

As is discussed, the present technology is well suited to MSE capacitive buttons having sensor electrode elements of varying arrangements, shapes, and sizes. For example, FIG. 4A shows a circular MSE capacitive button comprising three sensor electrode elements in accordance with embodiments of the present technology. Each of the sensor electrode elements occupies a substantially equal sector of the circular capacitive buttons shape. This set of sensor electrode elements also has both rotational and mirror symmetries. Further, the sensor electrode elements meet at a center of the capacitive button.

Figure 4B:
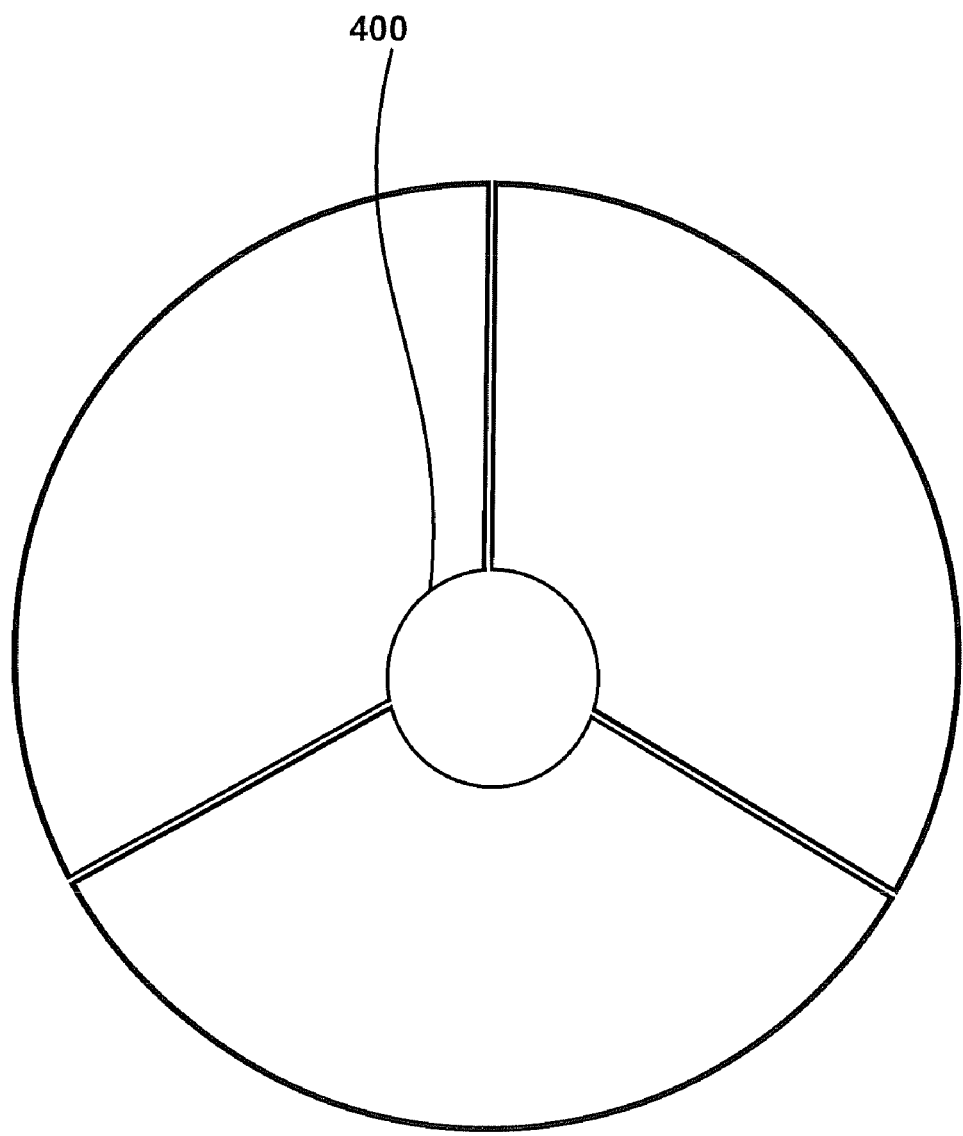
FIG. 4B is a diagram of an annular capacitive button with three sensor electrode elements surrounding an aperture in accordance with embodiments of the present technology.

FIG. 4B shows a MSE capacitive button having an "aperture" 400 in the pattern of sensor electrode elements, in accordance with embodiments of the present technology. Although a circular capacitive button having three sensor electrode elements is shown in FIG. 4B, it is understood that apertures can be introduced in sensor patterns of a variety of different MSE capacitive button designs. The aperture 400 may be a true hole that extends through the sensor electrode pattern and any substrates. Or, the aperture 400 may be simply an area where no sensor electrode element material is placed—the substrate may be solid or something else may be placed in aperture 400.

In FIG. 4B, a single aperture 400 is shown, positioned in a central region of the capacitive button, and the sensor electrode elements are placed outside and about the aperture. However, other numbers of apertures may be included in a capacitive button, and they may be located in other places other than a central region of the capacitive button. Similar to the example of FIG. 4A, the sensor electrode elements shown in FIG. 4B are about equal in area. The set of sensor electrode elements has both rotational and mirror symmetries, and the sensor electrode elements meet at a center of the capacitive button.

Figure 4C:
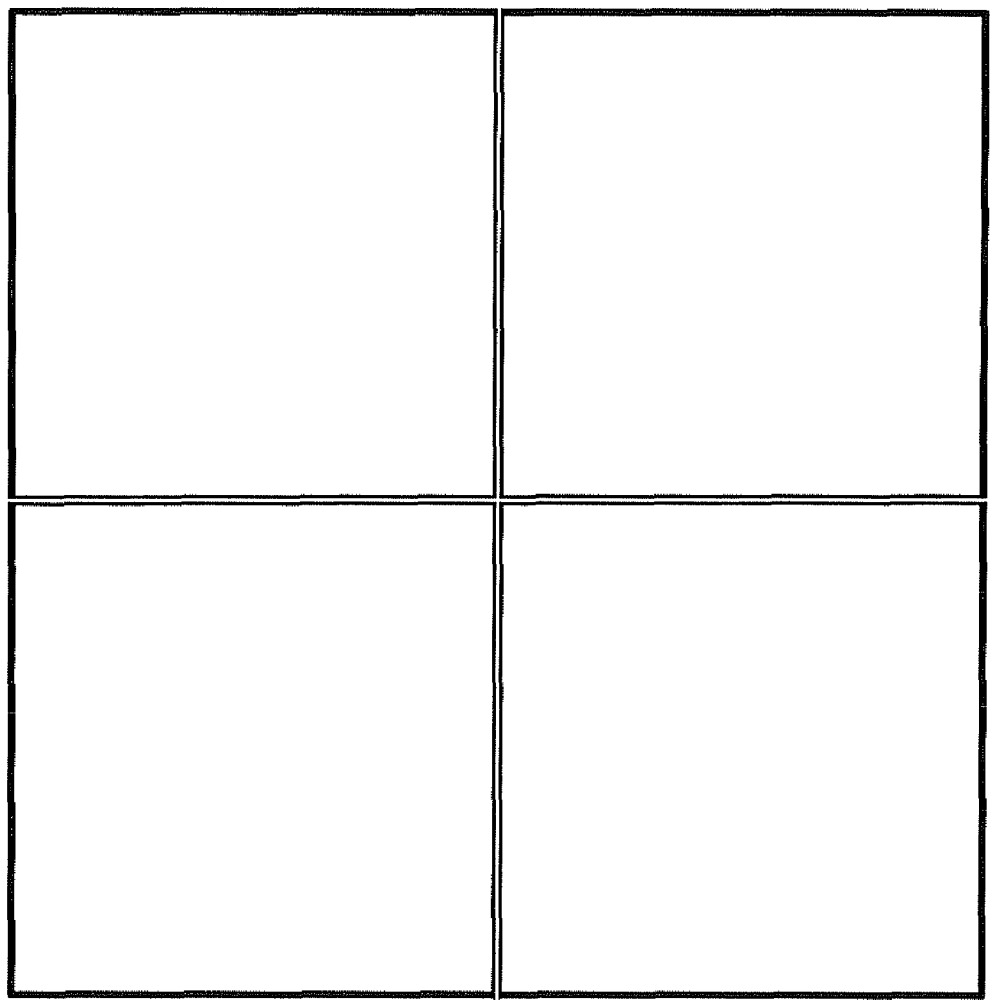
FIG. 4C is a diagram of a square-shaped capacitive button with four sensor electrode elements in accordance with embodiments of the present technology.

FIG. 4C shows a square-shaped MSE capacitive button comprising four square-shaped sensor electrode elements in accordance with embodiments of the present technology. Similar to the example of FIG. 4A, each of the sensor electrode elements are about equal in area, the set of sensor electrode elements has both rotational and mirror symmetries, and the sensor electrode elements meet at a center of the capacitive button. While square-shaped sensor electrode elements are shown in FIG. 4C, rectangles of other aspect ratios are possible. For example, other aspect ratios may be more useful depending on the input object size and orientation, on spacing between any capacitive buttons, and the like.

Figure 4D:
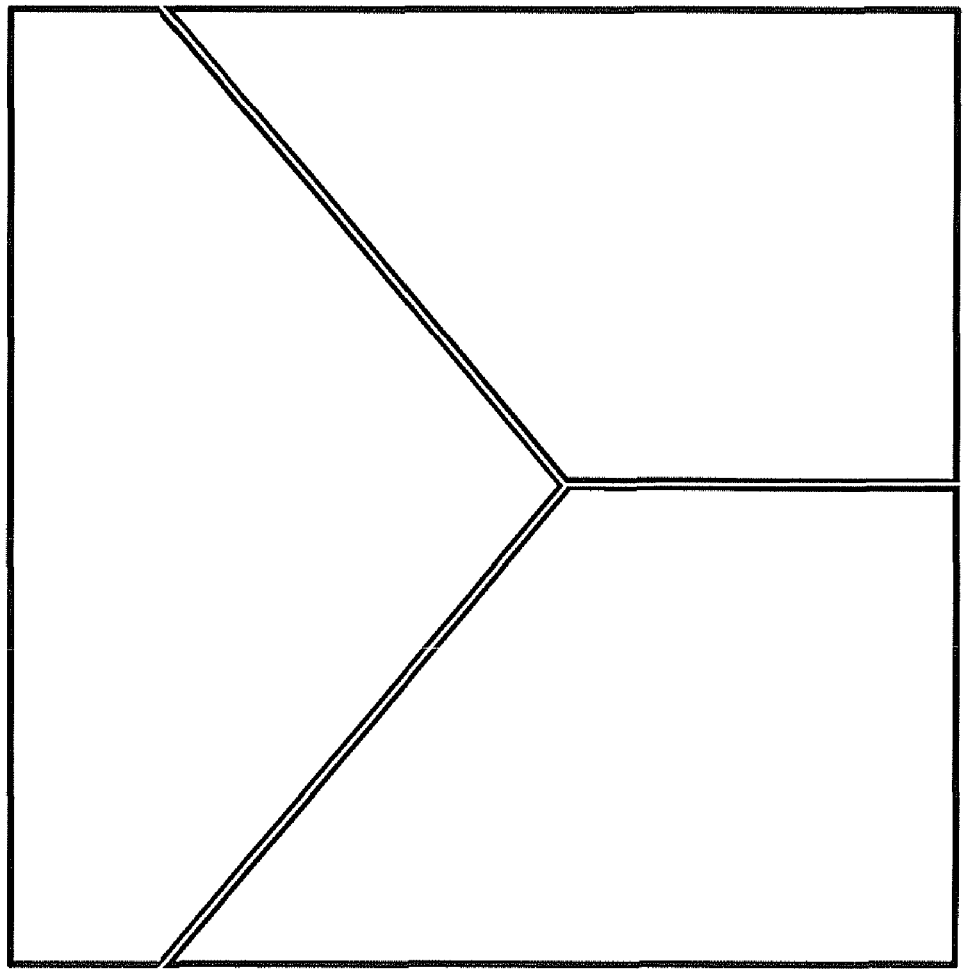
FIG. 4D is a diagram of a rectangular capacitive button with three sensor electrode elements in accordance with embodiments of the present technology.

FIG. 4D shows another rectangular MSE capacitive button. However, this one has three sensor electrode elements in accordance with embodiments of the present technology. These three sensor electrode elements are of unequal shapes, but still have substantially equal areas. The set of sensor electrode elements also has mirror symmetry, and the sensor electrode elements meet at a center of the capacitive button.

The embodiments shown in FIGS. 4C and 4D are examples of capacitive buttons with rectilinear portions, where each button has sensor electrode elements with angular sections. In addition to rectangles, other such capacitive buttons with rectilinear portions and angular sensor electrode elements are possible. For example, the capacitive button may have a "T" or "+" shape.

Figure 4E:
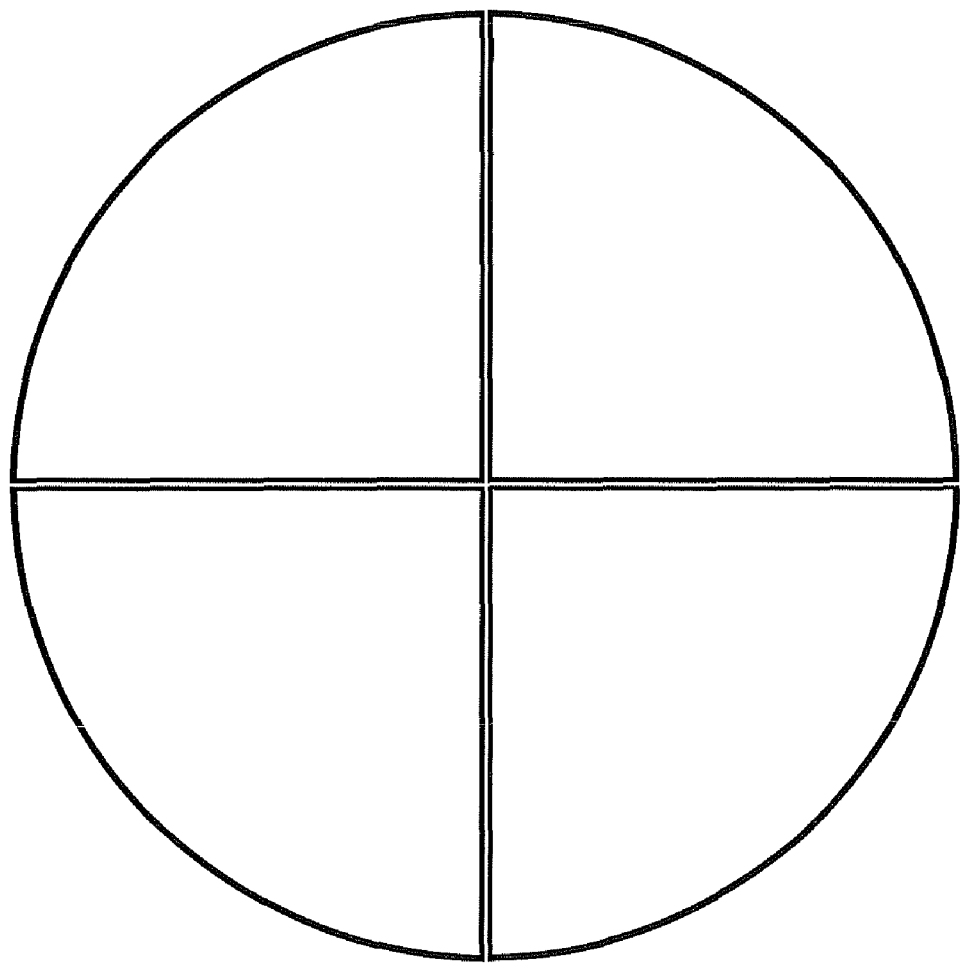
FIG. 4E is a diagram of a circular capacitive button with four sensor electrode elements in accordance with embodiments of the present technology.

FIG. 4E shows a circular MSE capacitive button comprising four sensor electrode elements in accordance with embodiments of the present technology. Like the example shown in FIG. 4A, each of the sensor electrode elements occupies an approximately equally-sized sector of a circle. The set of sensor electrode elements also has both rotational and mirror symmetries, and the sensor electrode elements meet at a center of the capacitive button.

FIG. 4A-4E all show sets of sensor electrode elements where all sensor electrode elements in a set have substantially equal areas. However, some embodiments may have sets where only some or none of the sensor electrode elements are similar in area. Similarly, FIG. 4A-4E all show sets of sensor electrode elements that have some type of symmetry and all meet at a center of the capacitive button and other common characteristics. However, other embodiments may not have such characteristics.

Continuing with FIG. 2A, a block diagram is shown of an example capacitive sensing device 100 with a controller coupled with noncontiguous capacitive buttons in accordance with embodiments of the present technology. The first capacitive button, typically shown as 205, is disposed on substrate 107. First capacitive button 205 is coupled with controller 105 via routing traces typically shown as 130. First capacitive button 205 is comprised of three sensor electrode elements $A_1$, $B_1$, and $C_1$. Dielectric material such as plastic (not shown) usually covers any conductive material (e.g. material comprising the sensor electrode elements and routing traces) that would otherwise be exposed to an assembler or user. In various embodiments, this protects the sensor electrode elements from the environment, prevents electrical shorts between an input object and the conductive material, and/or controls the capacitive coupling experienced by the sensor electrodes.

Similarly, a second capacitive button, typically shown as 210, is also disposed on substrate 107 and coupled with controller 105 via routing traces typically shown as 130. Second capacitive button 210 is comprised of three sensor electrode elements $A_2$, $B_2$, and $D_2$. Of note and as described herein, sensor electrode elements $A_1$ and $A_2$ are ohmically coupled with each other by both being routed to one sensing channel of controller 105 (a first sensing channel). Thus, sensor electrode elements $A_1$ and $A_2$ are sensor electrode elements of the first and second capacitive buttons 205 and 210, respectively, and are associated with a same sensor electrode A. Specifically, each of the sensor electrode elements $A_1$ and $A_2$ forms a portion of sensor electrode A, and sensor electrode A is shared by the first and second capacitive buttons 205 and 210. Similarly, sensor electrode elements $B_1$ and $B_2$ form one sensor electrode B and are routed to one sensing channel of controller 105 (a second sensing channel). Thus, electrode elements $B_1$ and $B_2$ are sensor electrode elements of the first and second capacitive buttons, 205 and 210, respectively, and are associated with the same sensor electrode B, and sensor electrode B is shared by the first and second capacitive buttons 205 and 210. Also of note is that sensor electrode elements C1 and D2 are not routed to any other sensor electrode elements. Thus, sensor electrode C is part of the first capacitive button 205 only, and sensor electrode D is part of the second capacitive button 210 only. Embodiments in accordance with the present technology are well suited to use with various numbers of shared sensor electrodes. In those embodiments where capacitive buttons have shared electrodes, the capacitive buttons are constructed to have at least one sensor electrode not in common (i.e. the combinations of sensor electrodes associated with the capacitive buttons differ).

In the upper portion of FIG. 2A, first capacitive button 205, second capacitive button 210, and portions of routing traces 130 are shown disposed within an upper dotted box T. As discussed below in detail, for purposes of clarity, FIG. 2A also includes an enlarged view of the features disposed within a lower dotted box T.

Controller 105 includes or is coupled with activation identification mechanism 220. Controller 105 may also include or be coupled with positional characteristics analyzing unit 218, if positional characteristics are determined as part of the button actuation analysis process. The functional operation of positional characteristics analyzing unit 218 and activation identification mechanism 220 are discussed below in detail.

FIG. 2A also shows a disambiguating electrode 215 as a dotted box. Disambiguating electrode 215 is disposed proximate to the set of sensor electrode elements of the first capacitive button 205. Disambiguating electrode 215 is configured to help distinguish user input intended to actuate the first capacitive button 205 from user input not intended to actuate the first capacitive button 205.

In many embodiments, disambiguating electrode 215 generates indicia reflecting changes in capacitive coupling experienced by the disambiguating electrode 215. Controller 105 processes the indicia from disambiguating electrode 215 to produce electrode values correlated to the disambiguating electrode 215. Controller 105 examines these disambiguating electrode values to better distinguish between input intended to cause button actuation and input not intended to cause button actuation.

For example, the disambiguating electrode values may help controller 105 differentiate between input provided by multiple smaller objects in the sensing region and input provided by a single, larger object in the sensing region. In many embodiments, input provided by multiple, smaller objects may be more likely to provide valid button input (e.g. it may be caused by finger presses), and input provided by a single, large object may be less likely to provide valid button input (e.g. it may be caused by palms of hands or cheeks of faces). Thus, in some embodiments, controller 105 is configured to suppress button actuations when a large object is determined to be interacting with the capacitive button arrangement. In some other embodiments, controller 105 is configured to inhibit (e.g. reject, suppress, or ignore) user inputs or indicia that would otherwise cause button actuations in response to disambiguating electrode values that indicate high enough probabilities that the user inputs are not meant to result in button actuations.

Although FIG. 2A shows disambiguating electrode 215 as a single, large electrode surrounding both first and second capacitive buttons 205 and 210, it is understood that other embodiments may not implement any disambiguating electrodes. In addition, other embodiments may implement any number of disambiguating electrodes with any shape, size, and configuration applicable to the capacitive sensing device design. For example, a disambiguating electrode may be implemented as a conductive trace or pattern located between sets of sensor electrode elements of two different capacitive buttons.

Figure 2B:
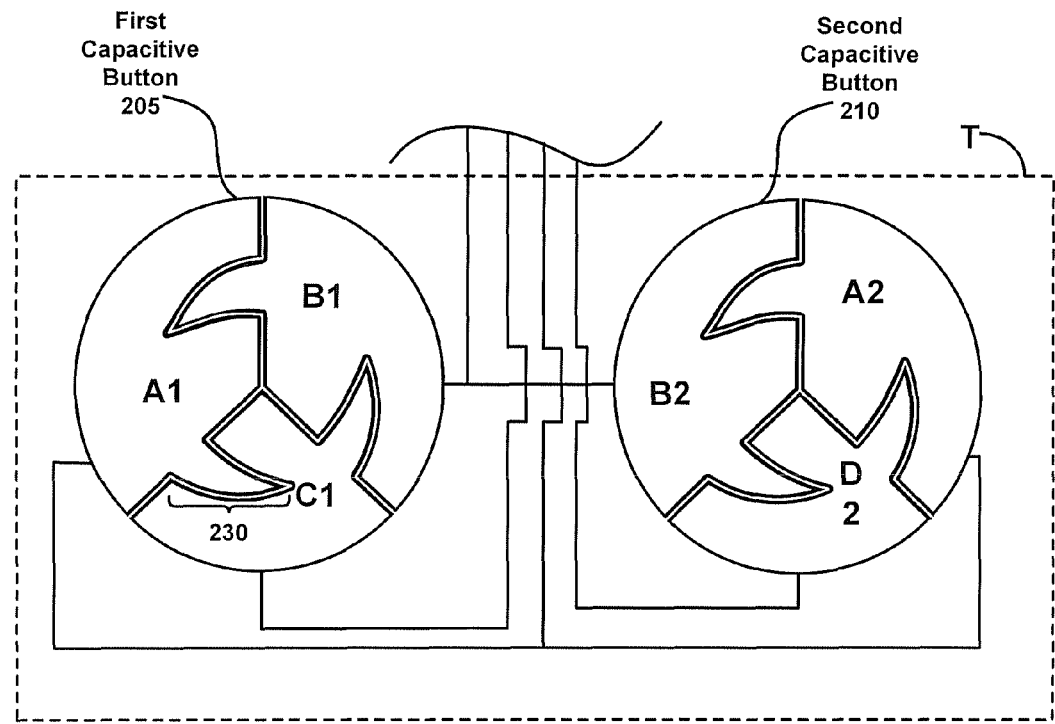
FIG. 2B is a block diagram of an enlarged view of example first and second capacitive buttons with interdigitated sensor electrode elements in accordance with embodiments of the present technology.

Referring now to FIG. 2B, a block diagram of example noncontiguous first and second capacitive buttons with interdigitated sensor electrode elements, in accordance with embodiments of the present technology is shown. In various embodiments, the first capacitive button 205 has a first set of sensor electrode elements. The first set of sensor electrode elements includes at least three sensor electrode elements associated with distinct sensor electrodes, and at least two sensor electrode elements of that first set are physically interdigitated with each other. That is, portions of at least two sensor electrode elements "poke into" each other. In the case shown in FIG. 2B, first capacitive button 205 comprises a set of three sensor electrode elements, $A_1$, $B_1$, and $C_1$, all of which are interdigitated with each other, thorn-shaped features (feature 230 is labeled for sensor electrode element $A_1$) of each sensor electrode element, $A_1$, $B_1$, and $C_1$, extend into a thorn-shaped space in an adjacent electrode element, $B_1$, $C_1$, and $A_1$. Of note, embodiments of the present technology are well suited for interdigitation in any number of shapes and forms, and numbers and shapes other than single thorns are contemplated.

Figure 5A:
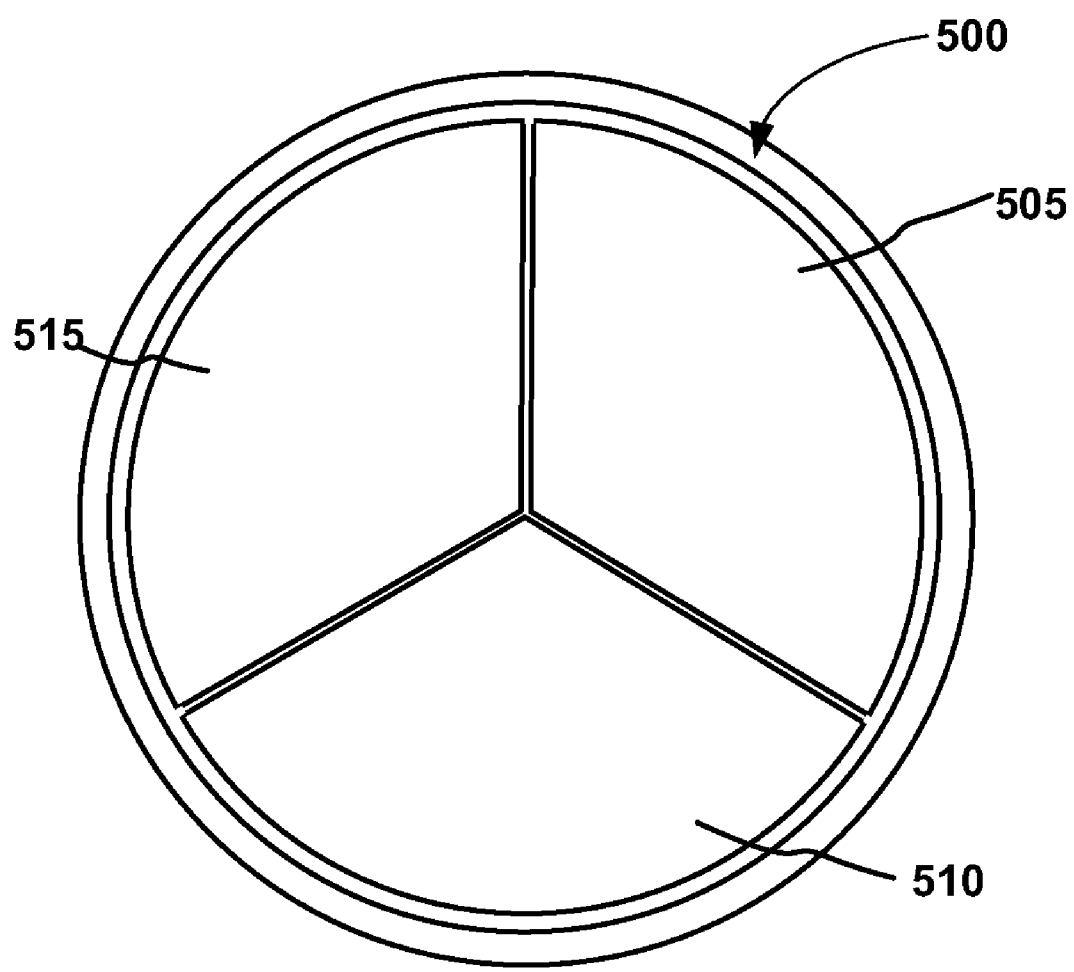
FIG. 5A is a diagram of a capacitive button with an emitter electrode element surrounding sensor electrode elements in accordance with embodiments of the present technology.
Figure 5B:
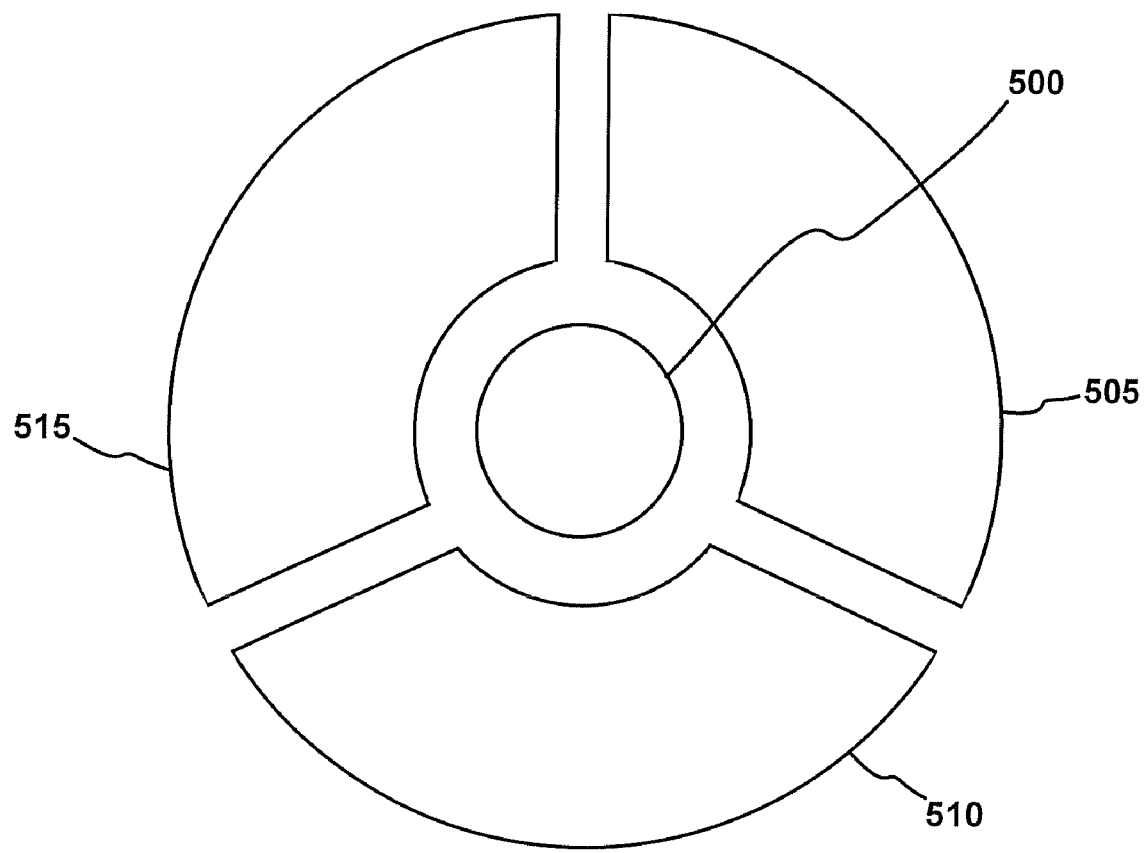
FIG. 5B is a diagram of a capacitive button with a separate emitter electrode element surrounded by sensor electrode elements in accordance with embodiments of the present technology.
Figure 5C:
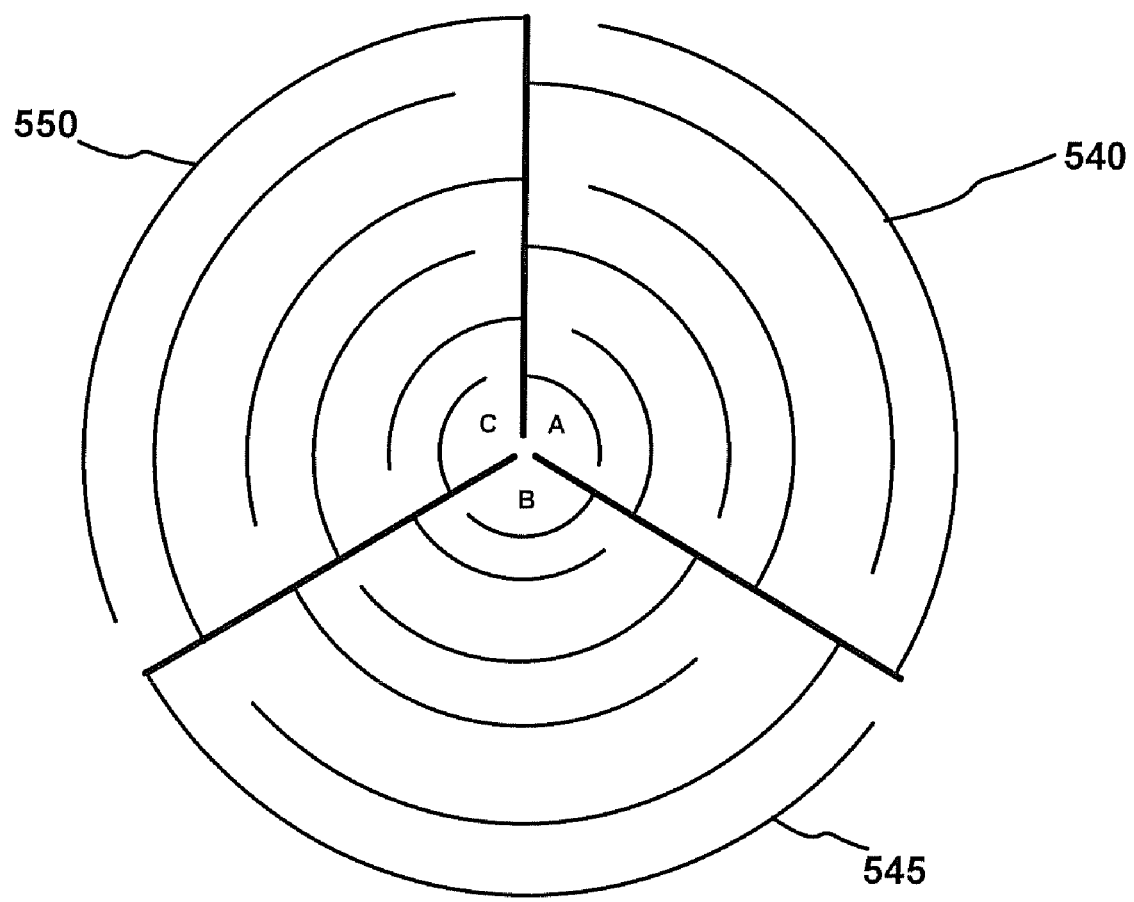
FIG. 5C is a diagram of a capacitive button with sensor electrode elements capable of emitting as well as sensing signals in accordance with embodiments of the present technology.

FIGS. 5A, 5B, and 5C show arrangements useful in some embodiments using "transcapacitive" sensing schemes. "Absolute" capacitive sensing schemes focus on changes in the amount of capacitive coupling between objects external to the sensing devices and sensor electrodes of the sensing device. In contrast, "transcapacitive" sensing schemes focus on changes in the amount of capacitive coupling between electrodes of the sensing device. Some transcapacitive embodiments of capacitive buttons, each having at least three sensor electrode elements, utilize separate emitter and receiver sensor electrode elements. The emitter sensor electrode elements are parts of emitter sensor electrodes, which are sensor electrodes capable of emitting electrical signals. The receiver sensor electrode elements are part of receiver sensor electrodes, which are sensor electrodes capable of receiving electrical signals from emitter sensor electrodes. Some transcapacitive embodiments of capacitive buttons, each having at least three sensor electrode elements, utilize sensor electrode elements of sensor electrodes capable of both emitting and receiving electrical signals. In many embodiments using either absolute or transcapacitive sensing, the objects external to the sensing devices are coupled to the chassis grounds of the sensing devices.

Referring now to FIG. 5A, a diagram of a capacitive button with a separate emitter sensor electrode element 500 surrounding receiver sensor electrode elements 505, 510, and 515 is shown in accordance with embodiments of the present technology. The emitter sensor electrode element 500 is associated with an emitter sensor electrode. In the embodiment shown in FIG. 5A, there is one emitter sensor electrode element 500 per capacitive button, although multiple emitter sensor electrode elements may be included per capacitive button. Thus, in transcapacitive sensing schemes such as those described in conjunction with FIG. 5A, the capacitive button arrangement includes at least one emitter sensor electrode element that is capacitively coupled with the set of receiver sensor electrode elements of the capacitive button. The emitter sensor electrode element is configured to emit electrical signals to be received by the set of receiver sensor electrode elements.

Emitter sensor electrode element 500 may surround the receiver sensor electrode elements 505, 510, and 515 that receive signals emitted by the emitter sensor electrode element 500, as shown in FIG. 5A. However, in other embodiments and as shown in FIG. 5B, the emitter sensor electrode element may be in an internal portion, such as a central portion, of the capacitive button. The internally located emitter sensor electrode element is surrounded by the receiver sensor electrode elements configured to receive signals emitted by the emitter sensor electrode.

It is understood that if additional MSE capacitive buttons are introduced to the arrangement shown in FIG. 5A, the emitter sensor electrode including emitter sensor electrode element 500 may or may not be shared between the capacitive buttons. That is, each capacitive button may have its own emitter sensor electrode element, or multiple capacitive buttons may share the same emitter sensor electrode (or even the same emitter sensor electrode element, if the element is properly shaped and placed). Similarly, receiver sensor electrodes may be shared or not shared between any MSE capacitive buttons added to the configuration shown in FIG. 5A.

It is also understood that the configuration shown in FIG. 5A can be driven in other ways. For example, in some embodiments, the element 500 is a receiver sensor electrode element, while the elements 505, 510, and 515 are independent emitter sensor electrode elements.

Referring now to FIG. 5B, a diagram of a capacitive button with a separate emitter sensor electrode element 520 surrounded by receiver sensor electrode elements 525, 530, and 535 in accordance with embodiments of the present technology is shown. In the embodiment shown in FIG. 5B, emitter sensor electrode element 520 may be in a central portion of the capacitive button, surrounded by the receiver sensor electrode elements 525, 530, and 535, and configured to receive signals emitted by emitter sensor electrode element 520.

Referring now to FIG. 5C, a diagram of a capacitive button with three sensor electrode elements 540, 545, and 550, at least one of which is capable of emitting as well as sensing signals in accordance with embodiments of the present technology, is shown. The sensor electrode elements 540, 545, and 550 are associated with distinct sensor electrodes A, B, and C, respectively. At least one of the distinct sensor electrodes (e.g. A, B, and/or C) associated with the sensor electrode elements 540, 545, and 550 of the capacitive button is capable of both emitting and receiving electrical signals. In such a case, the sensor electrode elements 540, 545, and 550, may be interdigitated with each other as shown in FIG. 5C, interdigitated in some other manner (e.g. 2B), or not be interleaved at all (e.g. have shapes similar to what are shown in the other figures).

In one embodiment of the example shown in FIG. 5C, the following process occurs during operation. At a first time, sensor electrode A emits signals while sensor electrodes B and C receive. Then, at a second time, sensor electrode B emits signals while at least sensor electrode C receives. This approach provides interaction information between sensor electrodes A-B, A-C, and B-C, which provides three independent capacitive measurements based on the three sensor electrodes A-C having sensor electrode elements in the capacitive button.

It can be seen that multiple other ways of implementing transcapacitive sensing using the configuration shown in FIG. 5C are possible. For example, adding to the process described above, sensor electrode A can also receive during the second time when sensor electrode B emits. Alternatively, also adding to the process described above, there can be a third time during which sensor electrode C emits while sensor electrodes A and B receive. As a separate example, sensor electrodes A and B can emit different signals while sensor electrode C receives during a first time, then sensor electrode A can emit while at least sensor electrode B receives.

It is understood that if additional MSE capacitive buttons are introduced to the arrangement shown in FIG. 5C, the sensor electrodes may or may not be shared or not shared between capacitive buttons. Emitter sensor electrodes are also termed "drivers," "driver electrodes," "driver sensor electrodes," "emitters," "emitter electrodes," and the like. Receiver electrodes are also termed "detectors," "detector electrodes," "detector sensor electrodes," "receivers," "receiver electrodes," and the like.

Accidental button actuation is often a bigger issue in embodiments sharing sensor electrodes between capacitive buttons than in embodiments not sharing sensor electrodes between capacitive buttons. This is because, when sensor electrodes are shared between capacitive buttons, inputs that interact with different sensor electrode elements of different capacitive buttons may produce results that mimic inputs that properly actuate another capacitive button. As a more specific example, a capacitive button arrangement with shared sensor electrodes may include a first capacitive button having three sensor electrode elements belonging to of sensor electrodes A-B-C, a second capacitive button having three sensor electrode elements belonging to sensor electrodes B-C-D, and a third capacitive button having three sensor electrode elements belonging to sensor electrodes A-C-D. An input that interacts with sensor electrode elements B and C of the second capacitive button and sensor electrode element A of the third capacitive button may mimic an input that properly interacts with sensor electrode elements A, B, and C of the first capacitive button. This may result in an unintended actuation of the first capacitive button.

Figure 6A:
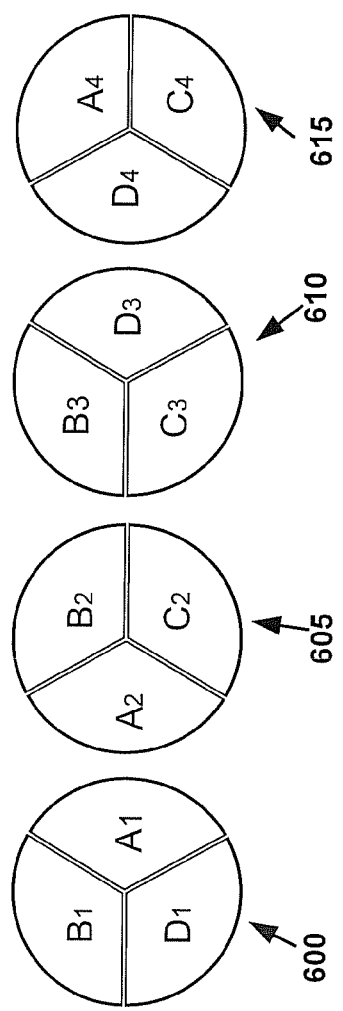
FIG. 6A is a diagram of four circular capacitive buttons sharing four sensor electrodes in accordance with embodiments of the present technology.

Referring to FIG. 6A, a diagram of four capacitive buttons, 600, 605, 610, and 615 sharing four sensor electrodes in accordance with embodiments of the present technology is shown. The capacitive button arrangement shown in FIG. 6A disposes buttons 600, 605, 610, and 615 in a straight line. Other embodiments may involve layouts with more or fewer capacitive buttons in linear or nonlinear arrangements. For example, various embodiments may include radically different numbers of capacitive buttons laid out in substantially different patterns.

In the embodiment shown in FIG. 6A, each of the capacitive buttons comprises a set of at least three sensor electrode elements. The orientation of the different capacitive buttons and the layout of the different sensor electrode elements associated with the same sensor electrodes in those capacitive buttons are selected such that the sensor electrode elements are positioned to correspond with each other in a way that places them closer together. This design can help reduce accidental button actuation, especially when sensor electrodes are shared between capacitive buttons. For example, an input that interacts with all of one capacitive button and accidentally interacts with a small part of an adjacent capacitive button may trigger fewer accidental actuations. This may be especially helpful in cases where capacitive buttons are placed less than half an input object width apart (e.g. less than half a finger width apart).

In some embodiments, a first capacitive button has a first set of sensor electrode elements and a second capacitive button has a second set of sensor electrode elements. A sensor electrode element of the first set is associated with the same sensor electrode as a sensor electrode element of the second set. The sensor electrode element of the first set is disposed to be physically closer to the sensor electrode element of the second set than any other sensor electrode element of the second set. Depending on the embodiment, the distance used to compare closeness can be the shortest distance from closest parts of sensor electrode elements, from centers of the sensor electrode elements, or the like. For some capacitive button designs, the resulting arrangement can be termed to have sensor electrode elements of shared sensor electrodes "face" each other in adjacent capacitive buttons.

In the embodiment shown in FIG. 6A, first capacitive button 600 and second capacitive button 605 each has three sensor electrode elements, and first capacitive button 600 and second capacitive button 605 have at least one shared sensor electrode in common. Specifically, sensor electrode A has sensor electrode elements in the first and second capacitive buttons 600 and 605 (sensor electrode elements $A_1$ in the first capacitive button 600 and sensor electrode elements $A_2$ in the second capacitive button 605). The $A_1$ sensor electrode element is arranged to be physically closer to the $A_2$ sensor electrode element than to any of the other sensor electrode elements of the second capacitive button 605. As further examples, similar placements can be seen for the $D_3$ and $D_4$ sensor electrode elements of third capacitive button 610 and fourth capacitive button 615. It is understood that sensor electrode elements of shared sensor electrodes need not be arranged in such a way between adjacent capacitive buttons.

Also shown in FIG. 6A is how sensor electrode elements of a shared sensor electrode may be disposed on a same side of the capacitive button arrangement. In some embodiments, a first capacitive button has a first set of sensor electrode elements and a second capacitive button has a second set of sensor electrode elements. A first sensor electrode element of the first set is associated with the same sensor electrode as a second sensor electrode element of the second set. The first sensor electrode element and the second sensor electrode element are disposed on a same side of the capacitive button arrangement. This design can help reduce accidental button actuations, especially when sensor electrodes are shared between capacitive buttons. For example, if input is presented from that same side where the first and second sensor electrode elements are disposed, and interacts with multiple capacitive buttons, fewer accidental button actuations may result.

In the embodiment shown in FIG. 6A, first capacitive button 600, second capacitive button 605, and third capacitive button 610 each has three sensor electrode elements, and all three capacitive buttons 600, 605, and 610 share sensor electrode B (sensor electrode element $B_1$ in the first capacitive button 600, sensor electrode element $B_2$ in the second capacitive button 605, and sensor electrode element $B_3$ in the third capacitive button 610). The sensor electrode elements $B_1$ and $B_2$ are arranged to both be on the same side of the arrangement (the "top" side of FIG. 6A as shown). Similarly, sensor electrode elements $B_2$ and $B_3$ are arranged to both be on the same side of the arrangement, as are sensor electrode elements $B_1$ and $B_3$. In fact, all three sensor electrode elements $B_1$, $B_2$, and $B_3$ are arranged to be on the same side. As a further example, similar placements can be seen for the $C_2$, $C_3$ and $C_4$ sensor electrode elements of second capacitive button 605, third capacitive button 610, and fourth capacitive button 615 (on a "bottom" side of FIG. 6A as shown). It is understood that sensor electrode elements of shared sensor electrodes need not be arranged in such a way.

Figure 6B:
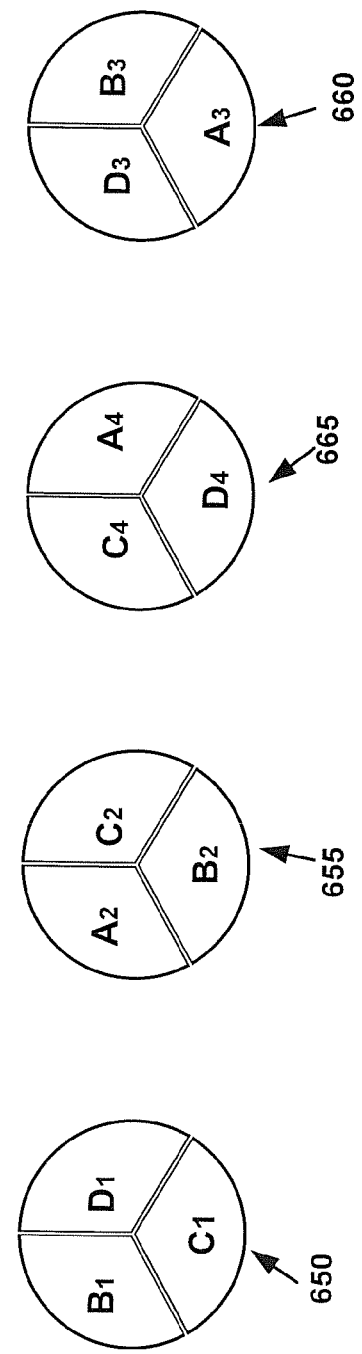
FIG. 6B is a diagram of four circular capacitive buttons sharing four sensor electrodes in accordance with embodiments of the present technology.

Referring to FIG. 6B, a diagram of four other capacitive buttons 650, 655, 660, and 665 sharing four sensor electrodes in accordance with embodiments of the present technology is shown. Each of the capacitive buttons 650, 655, 660, and 665 comprises a set of at least three sensor electrode elements. Sensor electrode elements associated with the same sensor electrode are positioned to correspond with each other in a way that places them farther apart. This design can help reduce accidental button actuation, especially when sensor electrodes are shared between capacitive buttons. For example, an input that simultaneously interacts with large parts of multiple capacitive buttons may trigger fewer accidental actuations. This may be especially helpful in cases where capacitive buttons are placed more than half an input object width apart (e.g. more than half a finger width apart).

In many such embodiments where multiple capacitive buttons share multiple sensor electrodes, the minimum separation distance between sensor electrode elements of shared sensor electrodes are substantially maximized.

In some embodiments, a first capacitive button has a first set of sensor electrode elements and a second capacitive button has a second set of sensor electrode elements. A first sensor electrode element of the first set is associated with the same sensor electrode as a second sensor electrode element of the second set. The first sensor electrode element is disposed to be physically farther away from the second sensor electrode element than any other sensor electrode element of the second set of sensor electrode elements.

In the embodiment shown in FIG. 6B, the capacitive buttons 650, 655, 660, 665 each has three sensor electrode elements associated with sensor electrodes chosen from a plurality of four sensor electrodes A-D. As can be seen in FIG. 6B, the sensor electrode elements of the same sensor electrode are placed as far apart from each other as reasonable. For example, sensor electrode element $C_1$ of first capacitive button 650 is farther apart from sensor electrode element $C_2$ of second capacitive button 655 than the other sensor electrode elements $A_2$ and $B_2$ of second capacitive button 655.

Figure 7:
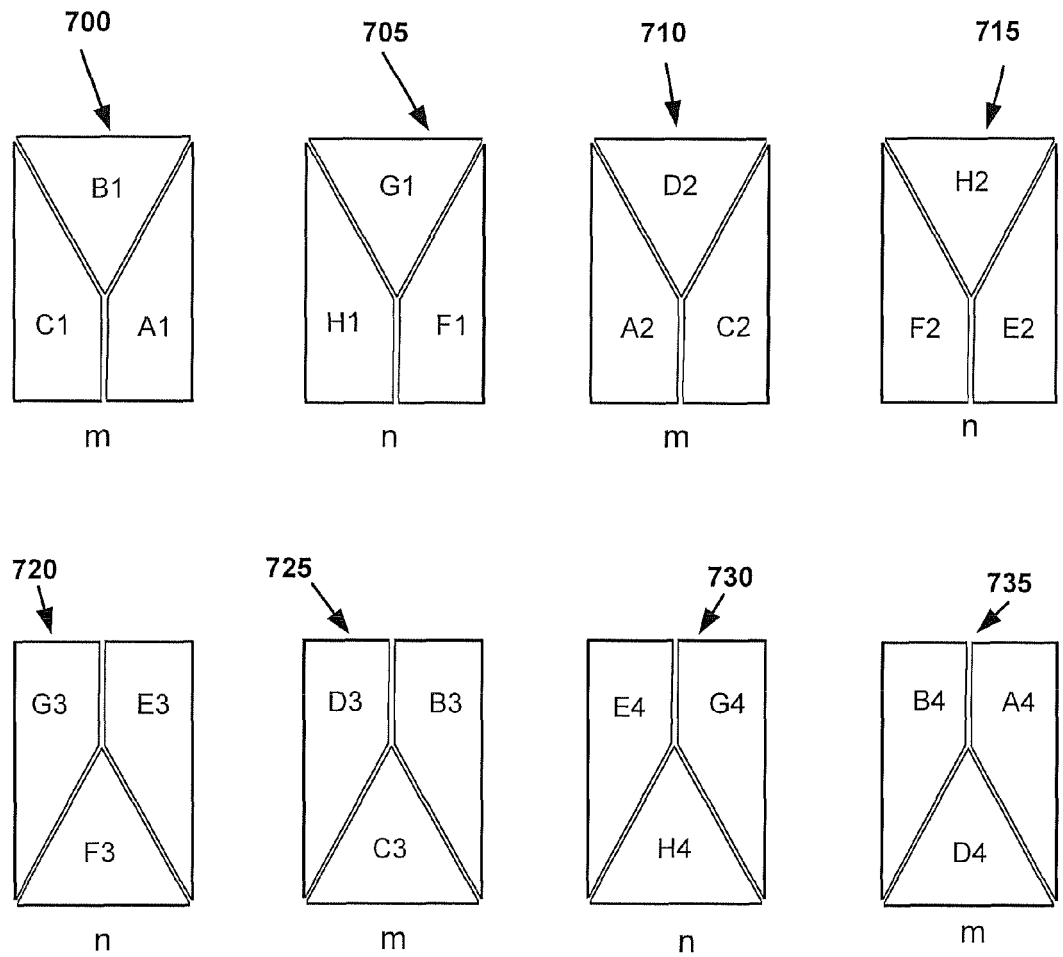
FIG. 7 is a block diagram of an example arrangement of capacitive buttons in accordance with embodiments of the present technology.

FIG. 7 is a block diagram of an example arrangement of capacitive buttons in accordance with embodiments of the present technology. FIG. 7 illustrates embodiments where neighboring capacitive buttons are designed not to share any sensor electrodes (have no sensor electrodes in common). This is accomplished by arranging the capacitive buttons and their associated sets of sensor electrode elements such that a first and second capacitive button having shared sensor electrodes are separated by a third capacitive button having no sensor electrodes in common with the first and second capacitive buttons.

Said in another way, FIG. 7 illustrates embodiments where a capacitive sensing device has a first capacitive button having a first set of sensor electrode elements and a second capacitive button having a second set of sensor electrode elements. The first and second capacitive buttons share at least one sensor electrode, such that a first sensor electrode element of the first set and a second sensor element of the second set are associated with a same sensor electrode. The capacitive sensing device further includes a third capacitive button with a third set of sensor electrode elements disposed between the first set of sensor electrode elements and the second set of sensor electrode elements. The third set of sensor electrode elements has at least three sensor electrode elements associated with distinct sensor electrodes, where no sensor electrode element of the third set of sensor electrode elements belongs to the same sensor electrode as any sensor electrode element of the first or second sets of sensor electrode elements.

Rectangular capacitive buttons are shown in FIG. 7, with each capacitive button having a set of sensor electrode elements. Two groups of capacitive buttons (group m and group n) are shown in FIG. 7, and include non-overlapping pluralities of sensor electrodes (sensor electrodes A-D and sensor electrodes E-H). As shown in FIG. 7, capacitive buttons in group m (capacitive buttons 700, 710, 725, and 735) share sensor electrodes A-D, and capacitive buttons in group n (capacitive buttons 705, 715, 720, and 730) share sensor electrodes E-H.

As shown in FIG. 7, the capacitive buttons are arranged such that capacitive buttons in group m (capacitive buttons 700, 710, 725, and 735) are separated by capacitive buttons outside of group m. Specifically, they are interspersed with capacitive buttons in group n (capacitive buttons 705, 715, 720, and 730). Thus, in this arrangement, neighboring capacitive buttons do not share any sensor electrodes. This approach may be helpful in avoiding unintentional button actuations. For example, a particular large input object that simultaneously interacts with multiple neighboring capacitive buttons would be less likely to trigger a valid combination of sensor electrode responses. As a specific example, no capacitive button shown in FIG. 7 uses the sensor electrode combination of B-A-H. An input object located between capacitive buttons 700 and 705 may trigger such a response, but would not accidentally actuate another button.

In many embodiments with where multiple capacitive buttons share multiple sensor electrodes, some capacitive buttons are placed close to each other while other capacitive buttons are placed far apart. In such cases, the approaches illustrated in FIGS. 6A, 6B, and 7 can be combined as appropriate. For example, the orientation and/or positioning of the sensor electrode elements of some capacitive button combinations (e.g. those close to each other) can be selected to optimize for the approach shown in FIG. 6A, while the orientation and/or positioning of sensor electrode elements of other capacitive button combinations (e.g. those far apart from each other) can be selected to optimize the approach shown in FIG. 6B. As another example, different groups of capacitive buttons (the groups sharing non-overlapping pluralities of sensor electrodes) can be placed to increase or decrease the distance between sensor electrode elements of the same sensor electrode, as appropriate. For example, the orientation and positioning of the sensor electrode elements shown in FIG. 7 are selected for a separation distance between the upper and lower rows of capacitive buttons that is large compared to the typical width of expected input objects, and for a separation distance between same-group-buttons in the same row is greater than the typical width of expected input objects.

Figure 8:
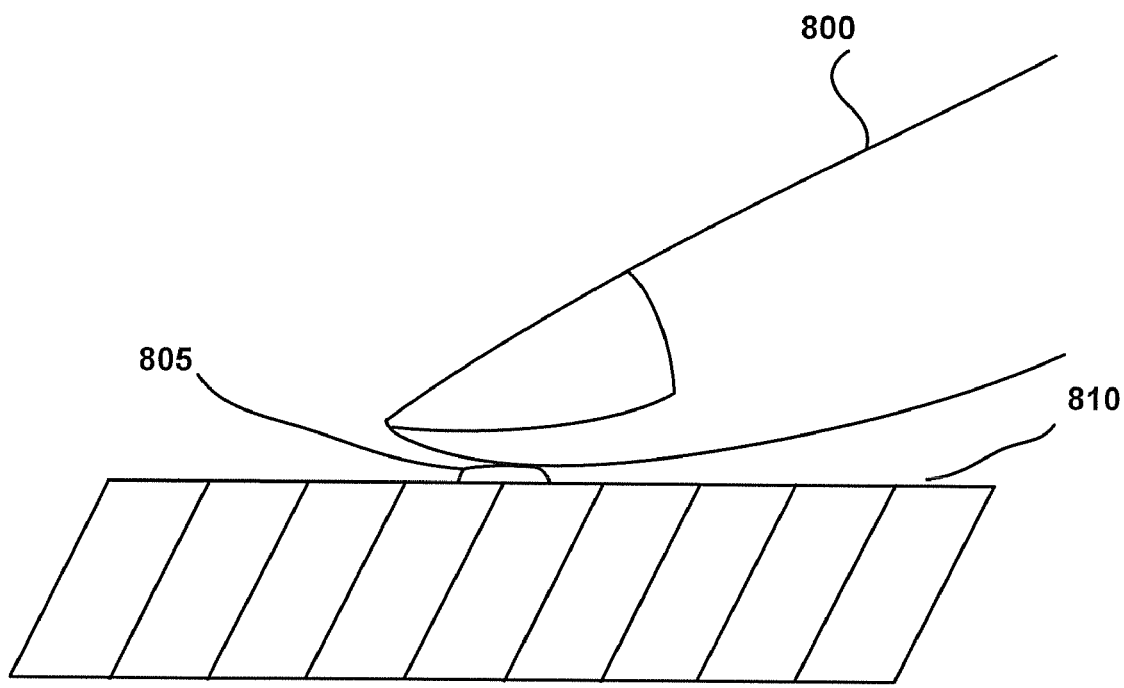
FIG. 8 is a cross-sectional view of a tactile feature in accordance with embodiments of the present technology.

FIG. 8 is a cross-sectional view of a tactile feature configured to provide tactile feedback for a capacitive button in accordance with embodiments of the present technology. Specifically, FIG. 8 shows tactile feature 805 disposed proximate to a capacitive button (not shown) located in structure 810. Tactile feature 805 can be used to provide tactile feedback to input object 800 (a finger is shown) to help a user in locating the capacitive button in structure 810, or to help inform a user of button actuation as the input object 800 interacts with the capacitive button located in structure 810. In particular, the tactile feedback may be used to help the user locate the input object 800 laterally.

Although a single protrusion is shown in FIG. 8, it is understood that any combination of protrusions, ridges, depressions, textures, other elements, and the like can be used to provide tactile feedback feature 805. Further, embodiments may position tactile features around or about central regions of capacitive buttons, or elsewhere in relation to the capacitive buttons.

Operation

As discussed above, in embodiments in accordance with the present technology, a capacitive button comprising a set of at least three sensor electrode elements associated with distinct sensor electrodes, offer improved button performance. Indicia received from sensor electrodes associated with a capacitive button are used to determine electrode values. These electrode values are utilized to determine the actuation status of the capacitive button. Positional characteristics about one or more input objects may be determined while gauging the actuation status of a capacitive button. Thus, determining the actuation status of the capacitive button may involve determining one or more positional characteristics of one or more input objects, and distinguishing between input intended for button actuation from other input not intended for button actuation (e.g. swiping gestures, input that interacts with multiple capacitive buttons simultaneous, and the like).

In some embodiments, a capacitive button may be tuned to actuate if an input object makes physical contact with a surface correlated with the capacitance button, and not if the input object is not in contact with the surface. However, physical contact is not inherently required for interaction with a capacitive button. An input object in a sensing region of the capacitive button, and hovering over a surface correlated to the capacitive button, may interact with it. Enough changes in capacitive coupling may result from such hovering input object for button actuation to occur. Thus, in other embodiments of the present technology, a capacitive button may be tuned to actuate in some cases when the input object is not in contact with any surfaces correlated with the capacitive button.

As will be described in detail below, FIGS. 3A-3E show representations of an input object interacting with capacitive buttons. Specifically, FIGS. 3A-3E show input object 300 (shown as a finger) located in various locations in the capacitive sensing region of first and second capacitive buttons 205 and 210, respectively. The specific discussions regarding FIGS. 3A-3E refers to using an absolute capacitance sensing scheme. However, it is understood that similar results can be achieved using other sensing schemes, including transcapacitive sensing schemes.

Figure 3A:
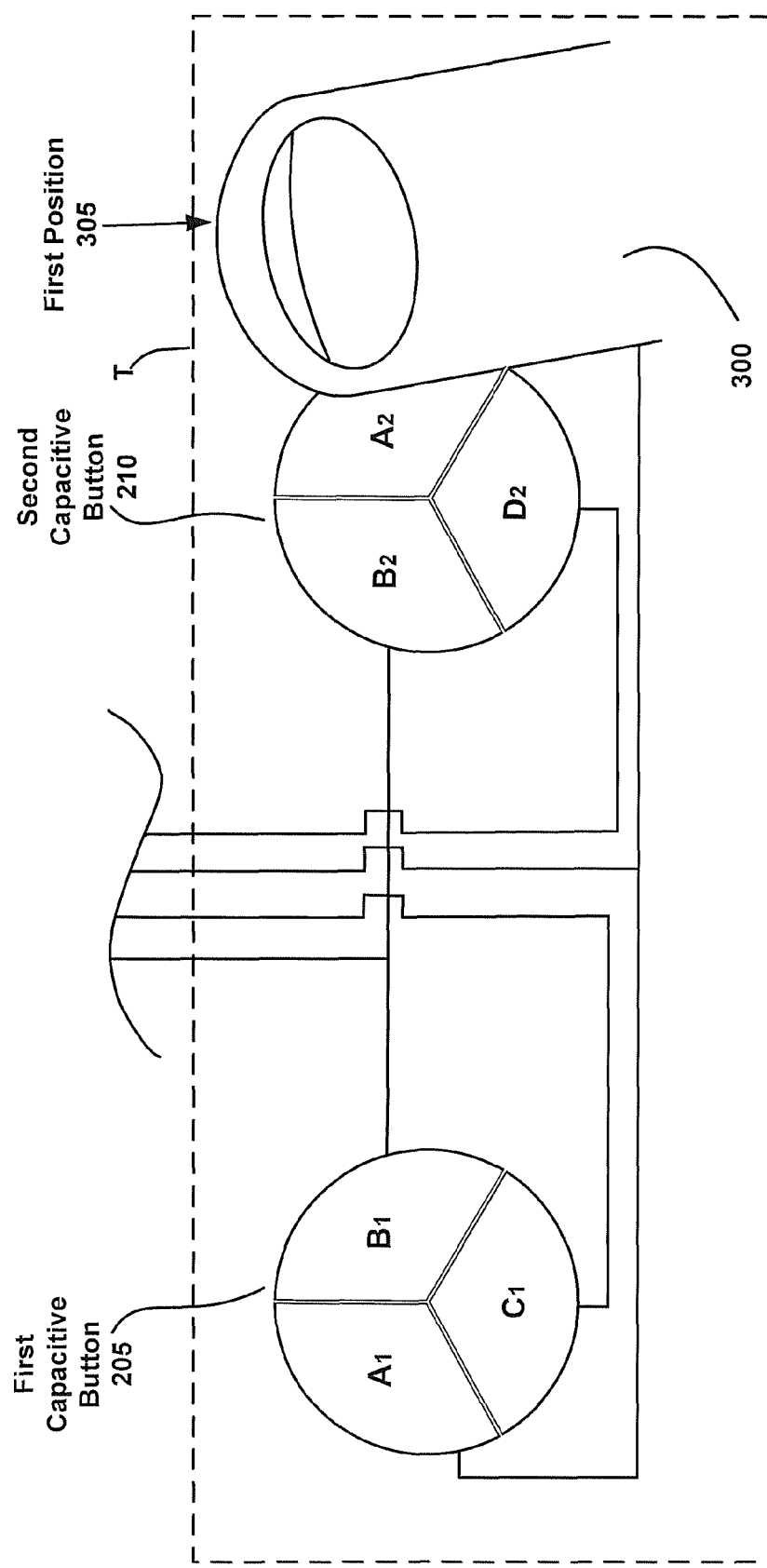
FIG. 3A is a block diagram of first and second capacitive buttons with an input object at a first position with respect to the capacitive buttons in accordance with embodiments of the present technology.

Although not shown in FIG. 3A, coupled with the first and second capacitive buttons 205 and 210 is a controller, such as the controller 105 of FIG. 2A. As previously noted, controller 105 can be couple with or include activation identification mechanism 220 of FIG. 2A for interpreting electrode values to determine button actuation.

Activation identification mechanism 220 is used to determine activation status of sensor electrodes, and may be implemented as circuitry, as software, or a combination thereof. In some embodiments, a sensor electrode is considered to be active if its associated electrode value is greater than or equal to an activation threshold value, and inactive if its associated electrode value is less than the activation threshold value. Different sensor electrodes may have the same or different activation threshold values.

In some embodiments, activation identification mechanism 220 may impose requirements such as particular trends of sensor electrode values over time to switch the determined state of a sensor electrode. For example, activation identification mechanism 220 may determine that a previously inactive sensor electrode is active if its associated electrode values crossed its activation threshold value in a particular way over time (e.g. increasing over time from below to above the applicable threshold value, or vice versa).

Further, some embodiments may impose "deactivation" threshold values that differ from activation threshold values on sensor electrodes considered to be in active states. Using differing activation and deactivation threshold values introduces hysteresis that may help "debounce" activation determinations. In other words, having hysteresis helps prevent "fluttering" of activation status for electrode values that are close to a threshold, such that determinations of status would not quickly swap between activated and inactivated states.

Similarly to activation threshold values, distinct sensor electrodes may have the same or different deactivation threshold values. The activation identification mechanism 220 may similarly impose requirements for recognizing no activation such as particular trends of sensor electrode values over time. For example, activation identification mechanism 220 may determine that a sensor electrode is inactive if its associated electrode values crossed the applicable activation threshold value in a particular way over time (e.g. decreasing over time from above to below the applicable threshold value, or vice versa). The required activation trends and the required deactivation trends can differ (e.g. differ in direction, magnitude, etc.).

In some embodiments, activation statuses of sensor electrodes have little or no effect on processing. For example, all of the sensor electrodes may always be producing indicia at a set frequency, processing may always be occurring at a constant rate, or the like. In contrast, in some embodiments, activation status is used to control processing such as sampling rate of indicia from the sensor electrodes, generation of electrode values, calculation of positional characteristics, determination of button actuations, and the like. This approach can be used to save power by reducing the amount of sampling or processing activity when there is no user input to the capacitive buttons.

In some embodiments, at least some of the sensor electrodes are not used to produce indicia, or at least some of the electrode values that can be calculated are not, until after the activation identification mechanism 220 provides one or more indications that trigger such production. For example, the trigger can include that at least one of the sensor electrodes is activated, that at least some number of sensor electrodes are activated, that a select group of sensor electrodes are activated, that at least some number of a select group of sensor electrodes are activated, and the like.

Similarly, in some embodiments, the rate at which sensor electrodes are used to produce indicia is slower until the activation identification mechanism 220 provides one or more indications that trigger a higher rate. Some other embodiments may use indications from the activation identification mechanism 220 to affect the rate at which electrode values are generated, which sensor electrodes the electrode values are generated, which buttons actuation status is determined for (if any), and the like.

In a simple embodiment, a capacitive button is determined to be actuated when all of the sensor electrodes correlated with the capacitive button are active.

Controller 105 can further couple with or include positional characteristics analyzing unit 218 for determining button actuation. In some embodiments, positional characteristics analyzing unit 218 is configured to determine one or more positional characteristics of one or more input objects with respect to a capacitive button system. These positional characteristics are then evaluated against various criteria for gauging button actuation.

Some embodiments include disambiguating electrodes such as disambiguating electrode 215 (shown in FIG. 2A). In such embodiments, the controllers (e.g. controller 105 of FIG. 2A) may also process the indicia from disambiguating electrodes to produce disambiguating electrode values. The controllers may then use the disambiguating electrode values in effecting button actuation. For example, the controllers may reject or suppress potential button actuations if the disambiguating electrode values indicate something else aside from what appears to be a valid button press (e.g. the presence of a relatively large object such as a palm of a hand, a face, or other non-button input body part).

Referring now to FIG. 3A, a block diagram of first and second capacitive buttons 205 and 210, respectively, is shown in accordance with embodiments of the present technology. First capacitive button 205 comprises sensor electrode elements $A_1$, $B_1$ and $C_1$ of sensor electrodes A, B, and C. Second capacitive button 210 comprises sensor electrode elements $A_2$, $B_2$, and $D_2$ of sensor electrodes A, B, and D. Input object 300 (a finger is shown), is located at first position 305 over a small portion of the right side of second capacitive button 210.

In such a case, the sensor electrodes A-D of the first and second capacitive buttons 205 and 210 would provide indicia that are received by a controller such as controller 105 of FIG. 2A. As appropriate, controller 105 utilizes indicia received from sensor electrodes A-D to generate electrode values, where at least three electrode values are associated with each capacitive button (e.g. capacitive buttons 205 and 210). As shown in FIG. 3A, first capacitive button 205 and second capacitive button 210 share sensor electrodes, thus electrode values are generated only for four sensor electrodes A-D even though there are six sensor electrode elements. Some of the same electrode values are correlated with both capacitive buttons 205 and 210. The generated electrode values are then utilized to determine button actuation status. This may involve using the electrode values to determine positional characteristics of the input object 300 in relation to first and second capacitive buttons 205 and 210, respectively.

Referring again to FIG. 3A, the input object 300 is located at first position 305, above and "vertically" close to and directly above a sliver of sensor electrode element $A_2$ of second capacitive button 210. In the discussion below, "vertical" is used to describe the dimension into and out of the figure as drawn, while "lateral" is used to describe the two dimensions that define planes parallel to the figure as drawn.

The indicia provided by sensor electrodes A-D are reflective of the effect of input object 300 on the amount of capacitive coupling sensed by sensor electrodes A-D. Thus, the indicia provided by sensor electrodes A-D would result in electrode values reflective of the input object 300 being close to and directly above a small portion of sensor electrode element $A_2$ of second capacitive button 210. In most embodiments, the indicia would reflect changes in capacitive coupling with sensor electrode element $A_2$ due to the overlapping input object 300, and perhaps smaller changes in capacitive coupling with sensor electrode element $D_2$ due to fringe capacitance. Controller 105 would process the received indicia and arrive at electrode values that describe no input object overlapping with a small part of sensor electrode A, close to sensor electrode D, and not close to sensor electrodes B and C. In some embodiments, with such a set of electrode values, controller 105 would determine that the input object is somewhere near the right side of the second capacitive button 210, since that is the location where a single input object would be able to trigger such a set of electrode values. In some embodiments, second capacitive button 210 would not be determined to be actuated in such a case.

As discussed above, in some embodiments, the electrode values generated for what is shown in FIG. 3A would likely indicate that no activation thresholds have been satisfied. This result may affect the sampling or the processing of data by the capacitive sensing device. For example, in some embodiments, this may stop processing of input or sampling at a slower rate. As another example, in other embodiments, the electrode values generated for what is shown in FIG. 3A may indicate interaction sufficient to trigger further processing of input or to begin sampling at a higher rate.

Figure 3B:
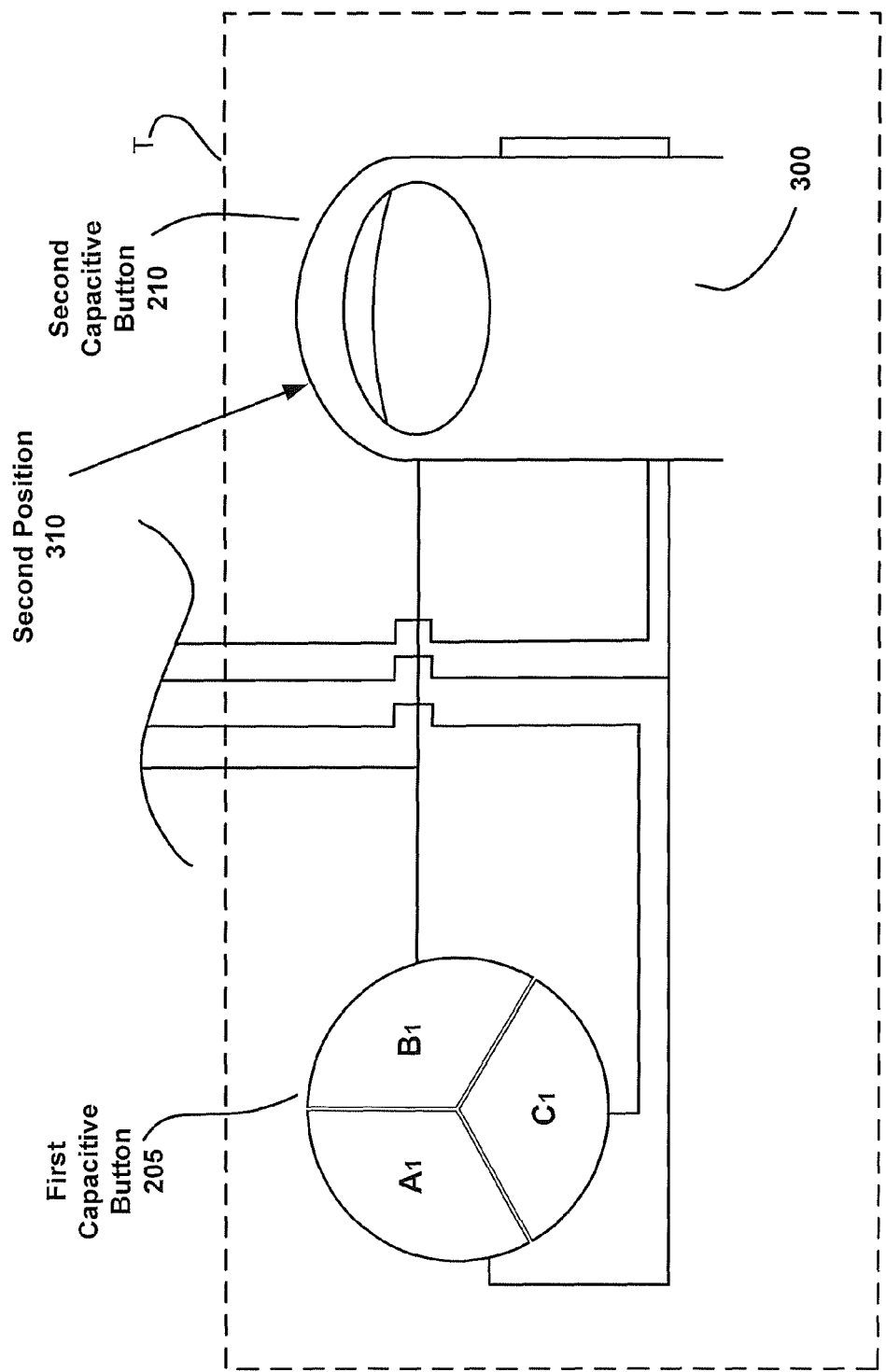
FIG. 3B is a block diagram of first and second capacitive buttons with an input object at a second position with respect to the capacitive buttons in accordance with embodiments of the present technology.

Referring now to FIG. 3B, a block diagram of capacitive buttons is shown in accordance with embodiments of the present technology. First and second capacitive buttons 205 and 210 are shown with input object 300 at a second position 310 over the entire set of sensor electrode elements $A_2$, $B_2$, and $D_2$ of second capacitive button 210. Sensor electrode elements $A_2$, $B_2$, and $D_2$ are parts of sensor electrodes A, B, and D, respectively. The sensor electrodes A-D provide indicia relating to input object 300 at second position 310, which reflects input object 300 interacting with sensor electrodes A, B, and D. Controller 105 utilizes the indicia from sensor electrodes A-D to generate the electrode values usable for gauging button actuation.

In many embodiments, activation identification mechanism 220 would indicate that activation threshold values for the sensor electrodes A, B, and D have been exceeded in a case as shown in FIG. 3B. Since A-B-D is a valid capacitive button combination (that of second capacitive button 210), a simple implementation may determine that second capacitive button 210 is actuated based only on these values.

More complex implementations may examine one or more positional characteristics determined by a positional characteristics analyzing unit 218 to determine button actuation. These more complex implementations would determine and evaluate if select positional characteristics meet particular criteria required for actuating second capacitive button 210. For example, some embodiments may pose requirements on the prior location(s) of the input object 300. In some embodiments, if input object 300 moved in toward the button laterally (e.g. from position 305) before reaching second position 310, then controller 105 may not recognize a button actuation.

However, if input object 300 arrived in vertically to position 310 without much lateral movement, the controller 105 may recognize a button actuation.

Figure 3C:
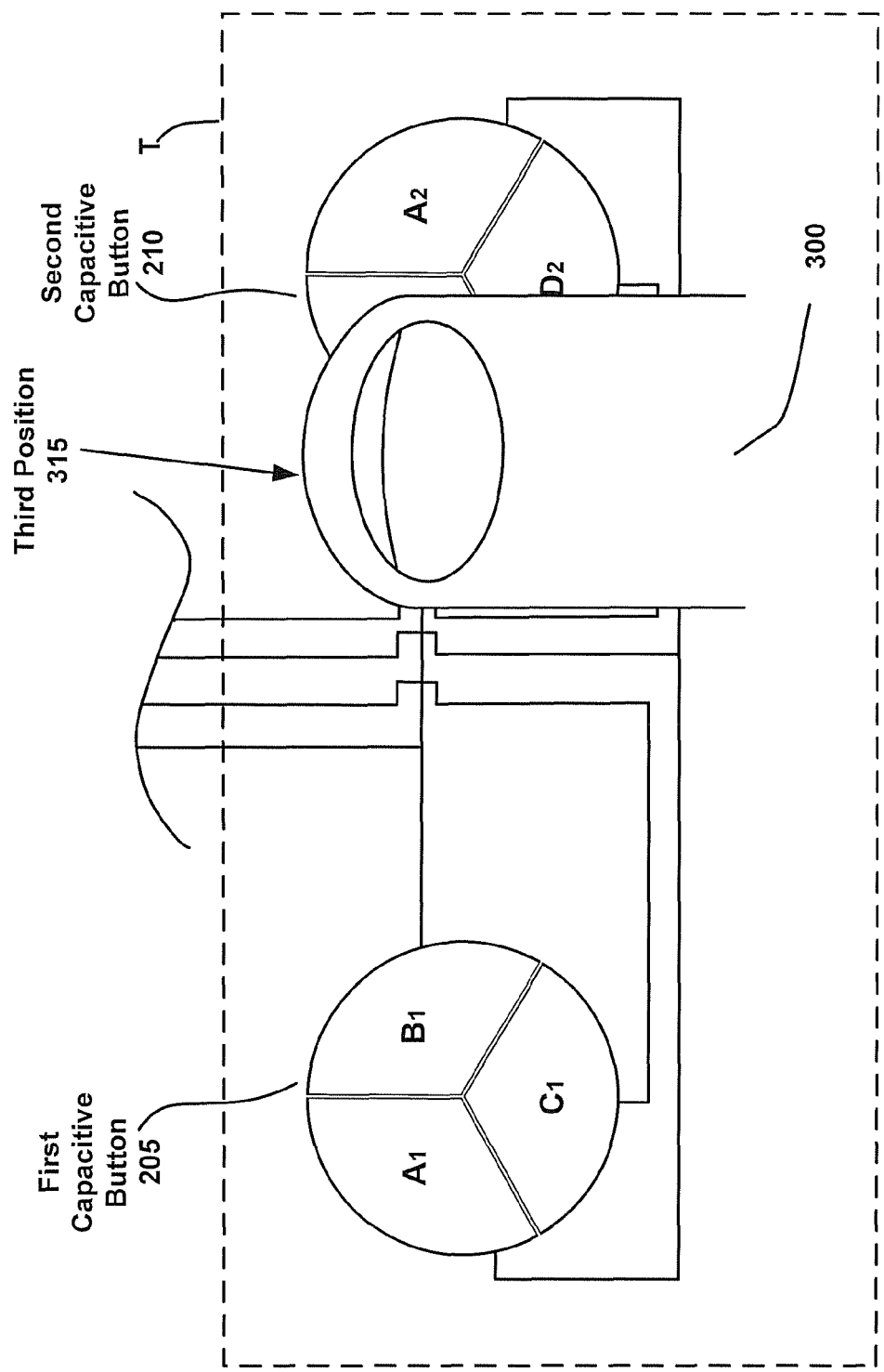
FIG. 3C is a block diagram of first and second capacitive buttons with an input object at a third position with respect to the capacitive buttons in accordance with embodiments of the present technology.

Continuing now with FIG. 3C, a block diagram of capacitive buttons is shown in accordance with embodiments of the present technology. First and second capacitive buttons 205 and 210, respectively, are shown with input object 300 at a third position 315 over a left portion of sensor electrode elements $A_2$, $B_2$, and $D_2$ of second capacitive button 210. Specifically, input object 300 of FIG. 3C is disposed close to and covers portions of sensor electrode elements $B_2$, and $D_2$ of sensor electrodes B and D. The indicia provided by sensor electrodes A-D provide reflect input object 300 at third position 315, which reflects input object 300 interacting mostly with sensor electrodes B and D.

Third position 315 places the input object 300 a bit off-center over sensor electrode element $B_2$ of second capacitive button 210. This means that the resulting indicia and electrode values would reflect a relatively larger amount of user interaction with sensor electrode B and a relatively lesser amount of user interaction with sensor electrode D. In some embodiments, sensor electrode A results may also be slightly affected due to fringing effects (although such effects are likely to be minimal) and sensor electrode C results are not significantly affected.

In many embodiments, actuation identification mechanism 220 would indicate that sensor electrodes B and perhaps D are activated, and second capacitive button 210 would not be determined to be actuated. Controller 105 may determine no button actuation independent of prior interaction by input object 300 with first and second capacitive buttons 205 and 210 (e.g. independent of how input object 300 reached third position 315).

Figure 3D:
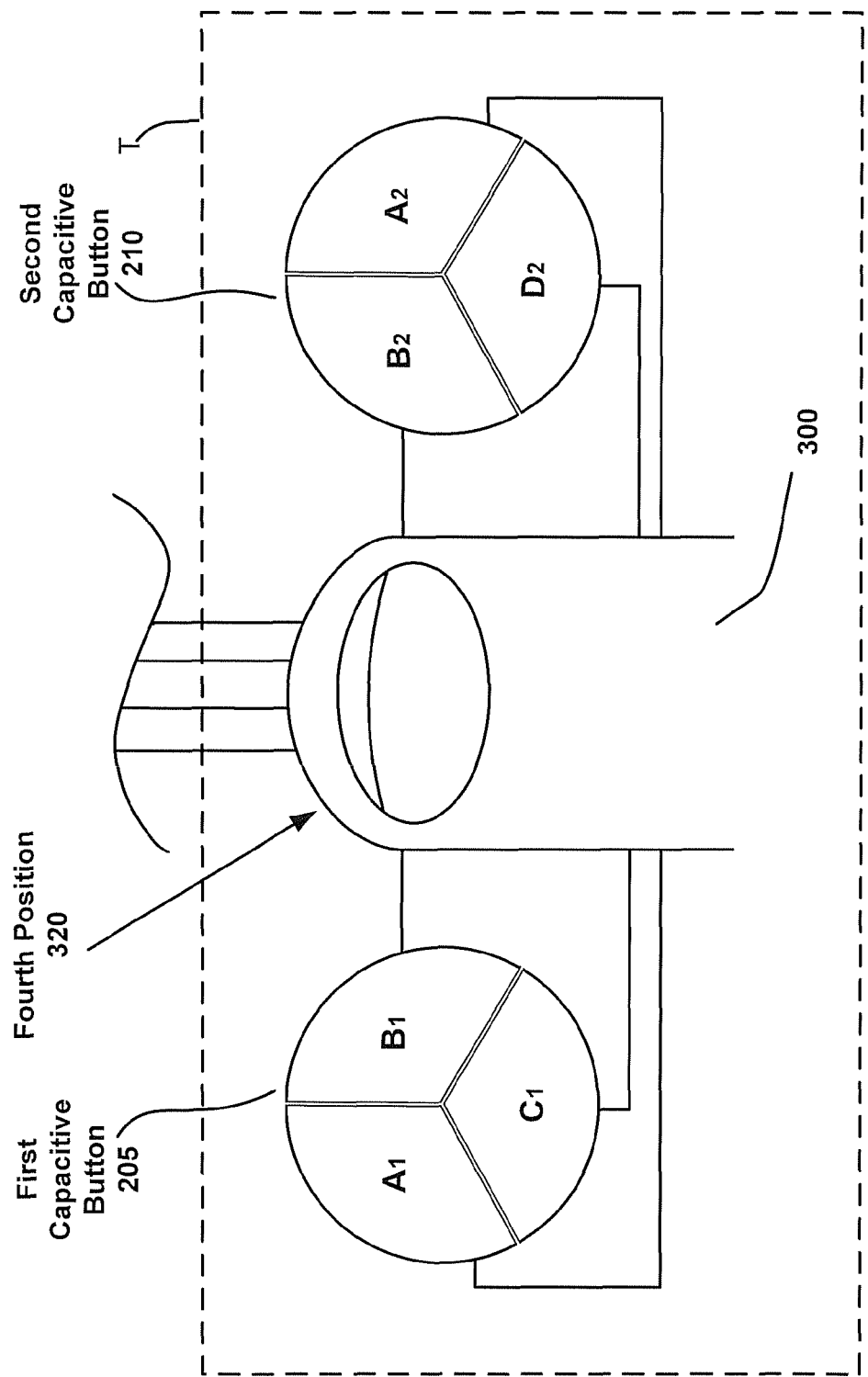
FIG. 3D is a block diagram of first and second capacitive buttons with an input object at a fourth position with respect to the capacitive buttons in accordance with embodiments of the present technology.

Continuing now with FIG. 3D, a block diagram of capacitive buttons is shown in accordance with embodiments of the present technology. First and second capacitive buttons 205 and 210, respectively, are shown with input object 300 at a fourth position 320 between first and second capacitive buttons 205 and 210. Input object 300 of FIG. 3D is not near any portions of first and second capacitive buttons 205 and 210. Hence, indicia from sensor electrodes A-D would reflect such, and no button actuation results.

It is worth noting that input object 300 in fourth position 320 overlaps with the routing traces of all four sensor electrodes A-D. Thus, it may be possible for input object 300 to interact capacitively with the routing traces, affect the indicia generated by sensor electrodes A-D, and cause incorrect button actuations. In most embodiments, this potential problem can be addressed by positioning the routing traces farther away from the input object 300 in the third dimension (into and out of the page in FIG. 3D), by proper shielding of the routing traces, by disposing the routing traces elsewhere (e.g. in areas that input objects are unlikely to be near), minimizing the area available for capacitive coupling, a combination thereof, or the like.

Figure 3E:
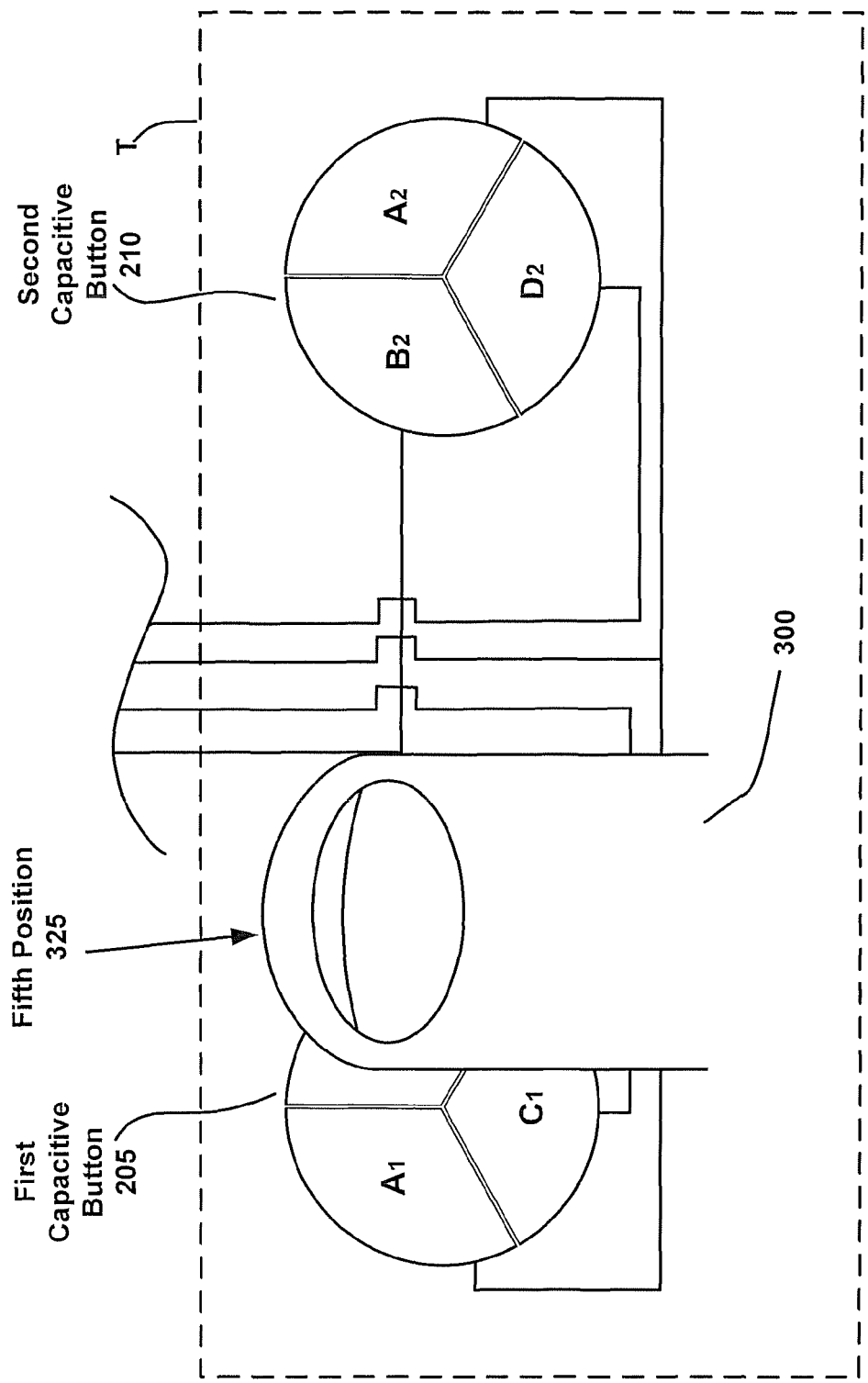
FIG. 3E is a block diagram of first and second capacitive buttons with an input object at a fifth position with respect to the capacitive buttons in accordance with embodiments of the present technology.

Referring now with FIG. 3E, a block diagram of capacitive buttons is shown in accordance with embodiments of the present technology. First and second capacitive buttons 205 and 210, respectively, are shown, with input object 300 at a fifth position 325 over first capacitive button 205.

Input object 300 of FIG. 3E is positioned over a right portion of the sensor electrode elements $A_1$, $B_1$ and $C_1$ of first capacitive button 205, and covers portions of sensor electrode elements $B_1$ and $C_1$ of sensor electrodes B and C. The sensor electrodes A-D provide indicia relating to input object 300 at fifth position 325, which reflects input object 300 interacting mostly with sensor electrodes B and C. In many embodiments, the change in capacitive coupling is sufficient to cause sensor electrode B, and perhaps sensor electrode C, to be activated. In some embodiments, sensor electrode A results may also be slightly affected due to fringing effects (although such effects are likely to be minimal) and sensor electrode D results are not significantly affected. In many embodiments, with such a set of indicia and resulting sensor electrode values, no button actuation is recognized.

Figure 3F:
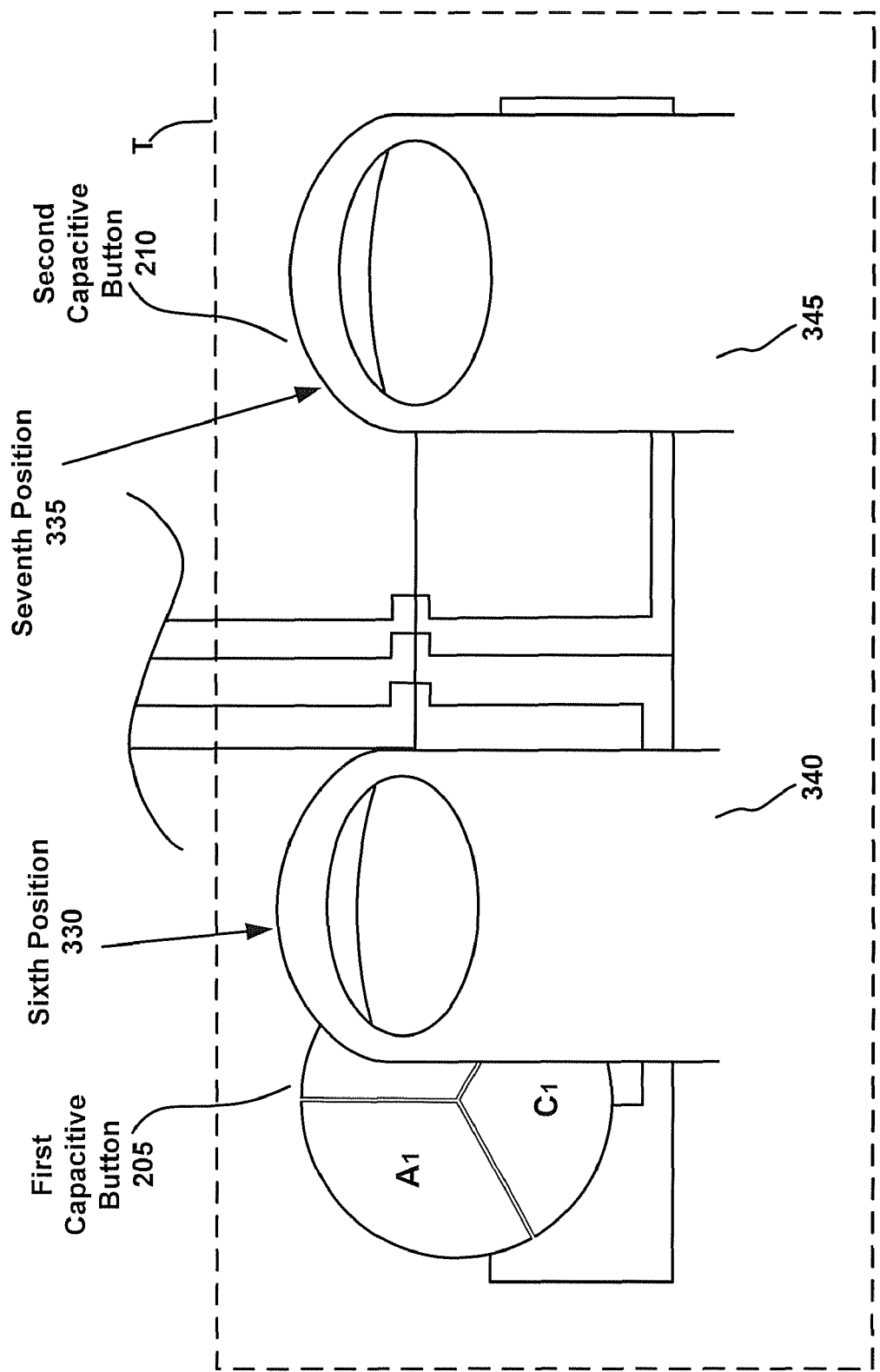
FIG. 3F is a block diagram of first and second capacitive buttons with two input objects concurrently in the sensing region of the capacitive buttons in accordance with embodiments of the present technology.

Referring now to FIG. 3F, a block diagram of capacitive buttons is shown in accordance with embodiments of the present technology. First and second capacitive buttons 205 and 210, respectively, are shown with input objects 340 and 345 (fingers are shown) concurrently disposed in sensing region of capacitive buttons 205 and 210. Input object 340, at sixth position 330, overlaps sensor electrode elements $B_1$ and $C_1$ of sensor electrodes B and C. Input object 345, at seventh position 335, covers an entire set of sensor electrode elements (that of second capacitive button 210). In other words, input object 345 is close to and overlaps sensor electrode elements $A_2$, $B_2$, and $D_2$ of sensor electrodes A, B, and D With a case such as what is shown in FIG. 3F, the resulting indicia typically indicates user interaction with all four sensor electrodes A-D.

In many embodiments, this would result in all of the sensor electrodes A-D activated. In some embodiments, the controller may suppress or reject all button actuation possibilities, since having all sensor electrodes A-D activated may cause ambiguity about whether the user intended to actuate either or both of capacitive buttons 205 and 210. This is especially likely if the input objects 340 and 345 arrived substantially simultaneously in sixth position 330 and seventh position 335.

If the arrival of input objects 340 and 345 in sixth position 330 and seventh position 335 are sufficiently separated in time, then button actuation may have occurred earlier. In many embodiments, if input object 345 arrives at seventh position 335 substantially before the arrival of input object 340 at sixth position 330, then input object 345 may have caused actuation of second capacitive button 210 before input object 340 arrived at sixth position 330. However, in many embodiments, if input object 345 arrives at seventh position 335 substantially after the arrival of input object 340 at sixth position 330, then input object 345 may not have caused actuation of second capacitive button 210.

Further, in many embodiments, input object 340 would not cause actuation of first capacitive button 205 regardless of if input object 340 arrives at sixth position 330 before, after, or at the same time as input object 345 arriving at seventh position 335. In those embodiments, the interaction of input object 340, at sixth position 330, with first capacitive button 205 is not sufficient to result in actuation of first capacitive button 205.

Some embodiments may recognize that sensor electrodes B and perhaps C are experiencing an amount of interaction indicative of user input interacting with more than one sensor electrode element of the respective sensor electrodes. In such embodiments, the controller may suppress, reject, or ignore button actuation possibilities since such amounts of interaction may cause ambiguity about whether the user intended to actuate either or both of the capacitive buttons 205 and 210.

It should be noted that there would be less ambiguity for a scenario such as shown in FIG. 3F if sensor electrodes were not shared between first and second capacitive buttons 205 and 210. If sensor electrodes were not shared, and six distinct sensor electrodes are used (one for each sensor electrode element), then the indicia from the sensor electrodes would indicate that an input object is over part of first capacitive button 205 (not centered) and a second input object is over the second capacitive button 210 (likely centered). In such a case, the controller may allow actuation of the second capacitive button 210.

Of note, the present technology may also be utilized in conjunction with haptic feedback. A haptic feedback mechanism may be used to provide haptic feedback in response to activation of one or more sensor electrodes. Alternatively or in addition to providing feedback in response to sensor electrode activation, haptic feedback may be provided in response to button actuation. The timing of feedback may be provided on the "press" of a capacitive button, on the "release" of a capacitive button, or both. Also, different haptic feedback may be provided for activation of a sensor electrode vs. actuation of a button, for activation of different sensor electrodes, for actuation of different capacitive buttons, for press versus release, for suppressed button actuation (e.g. suppression in response to indicia from one or more disambiguating electrodes or other inputs), and the like. For example, the haptic feedback may be continuous or pulsed, or otherwise vary in magnitude or frequency. Haptic feedback may also be used in combination with other types of feedback, including visual and auditory feedback.

Figure 9:
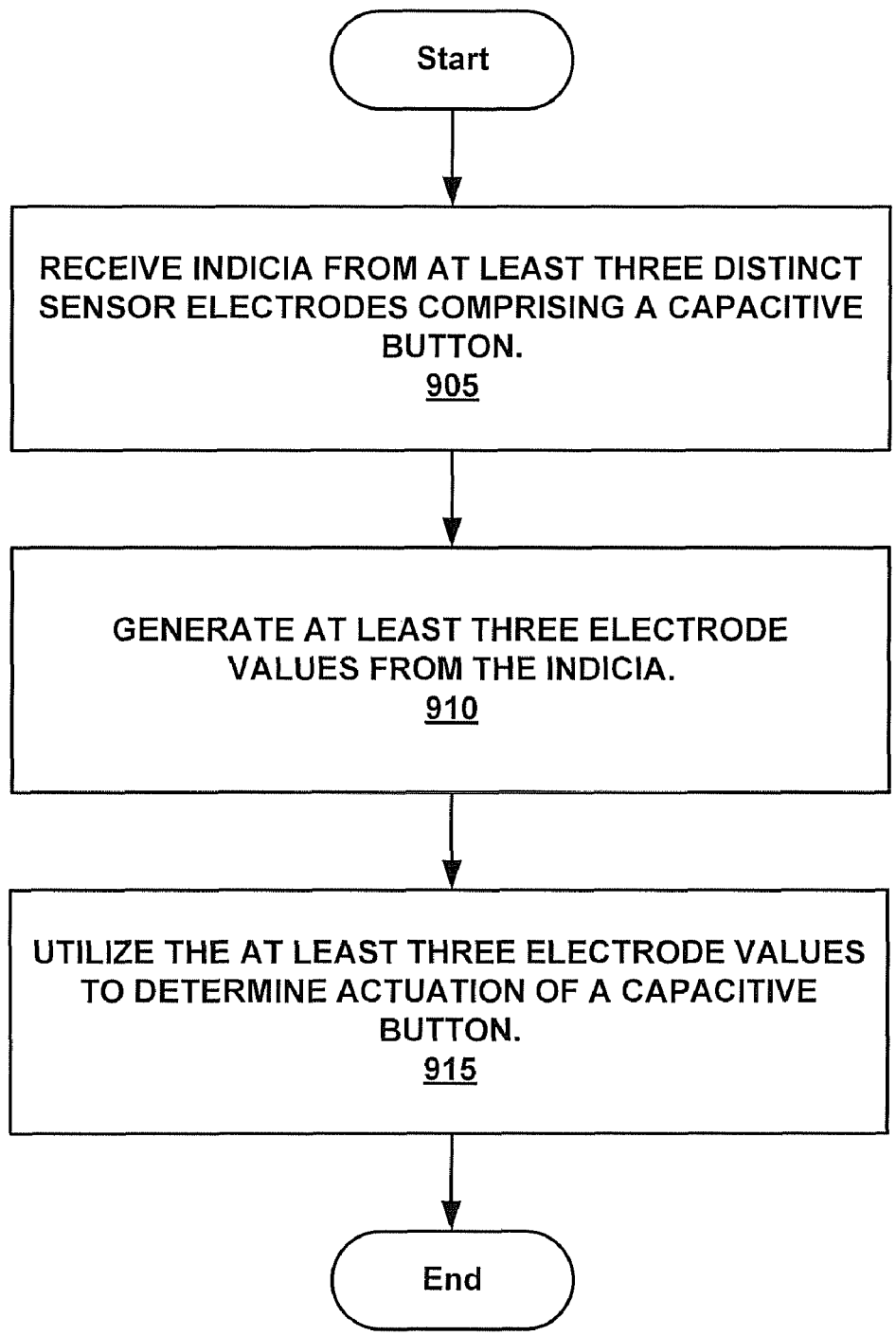
FIG. 9 is a flowchart of an example method for determining actuation of a capacitive button in accordance with embodiments of the present technology.

FIG. 9 is a flow diagram 900 of a method for determining actuation of a capacitive button, according to one embodiment. Thus, although flow diagram 900 shows three steps in a particular order, it is understood that different implementations may include different numbers of steps in other orders. Reference will be made to the capacitive sensing device 100 of FIGS. 1 and 2 in the description of flow diagram 900 in the discussion below for convenience. It is understood that the steps described below may be used with any of the different MSE capacitive button systems described herein.

In 905, in one embodiment, the method receives indicia from at least three distinct sensor electrodes comprising a capacitive button. In some implementations, this involves driving sensor electrodes to measure the amount of capacitive coupling of the sensor electrodes to an external object.

In some other implementations, 905 may involve emitting electrical signals using an emitter sensor electrode that is separate from the at least three distinct sensor electrodes. The electrical signals would be configured for effecting receipt of the indicia from the at least three distinct sensor electrodes.

In yet other implementations, 905 may involve emitting electrical signals using at least two of the at least three distinct sensor electrodes. As discussed above, using the same sensor electrodes to emit and receive means that the capacitive sensing device will likely time multiplex between different emitter-receiver combinations. The electrical signals emitted by the at least two of the at least three distinct sensor electrodes would be configured for effecting receipt of the indicia from the at least three distinct sensor electrodes.

In 910, in one embodiment, the method generates at least three electrode values from the indicia received from the at least three sensor electrodes.

In 915, in one embodiment, the method utilizes the at least three electrode values to determine actuation of the capacitive button. Actuation determination in 915 can involve direct examination of the electrode values themselves, such as by comparing at least one of the electrode values to an activation threshold value. For example, this can be done with an activation identification mechanism 220 that can indicate when indicia received from particular sensor electrodes exceed one or more activation thresholds, as discussed above. Further, the temporal characteristics of the electrode values may also be evaluated in determining button actuation.

Alternatively, actuation determination in 915 can involve indirect examination of the electrode values by calculating positional characteristics, such as with a positional characteristics analyzing unit 218. For example, actuation determination may involve determining one or more position characteristics of one or more input objects with respect to the capacitive button. The positional characteristics may be determined for an instance in time or over a span of time. For example, position may be estimated using the electrode values.

Further, actuation determination in 915 can involve a combination of the approaches described above. For example, embodiments may use any combination of examining electrode values directly, evaluate changes to electrode values over time, determine and examine positional characteristics, evaluate temporal changes to positional characteristics, and the like.

As discussed above, the number and order of the parts of flow diagram 900 can change in specific implementations. For example, one or more additional blocks can be added to support distinguishing false actuations using a disambiguating electrode. Specifically, the capacitive sensing device 100 can include one or more disambiguating electrodes disposed proximate to the capacitive button, and the flow diagram 900 can include receiving indicia from such disambiguating electrode(s). The flow diagram 900 can further include generating one or more disambiguating values from the indicia received from the disambiguating electrode(s), and utilizing the disambiguating value(s) to determine a false actuation of the capacitive button.

As another example, the capacitive sensing device 100 can be configured to effect haptic feedback by directly controlling a haptic feedback system, or by providing an indication that haptic feedback should be provided. Flow diagram 900 can then be expanded to include effecting haptic feedback in response to a determination of button actuation.

Electronic systems can include and operate with MSE capacitive buttons. For example, an electronic system can include an output device capable of providing human-observable output, a plurality of capacitive buttons, and a controller. The plurality of capacitive buttons includes a substrate, a first set of sensor electrode elements disposed on the substrate, and a second set of sensor electrode elements disposed on the substrate. The first set of sensor electrode elements has at least three sensor electrode elements associated with distinct sensor electrodes of a plurality of sensor electrodes; that is, at least three sensor electrode elements of the first set do not share sensor electrodes with each other (however, if there are more than three sensor electrode elements in the first set, they may share sensor electrodes in some cases). Similarly, the second set of sensor electrode elements also has at least three sensor electrode elements that do not share sensor electrodes with each other. In some embodiments, one or more sensor electrode elements of the first set may be associated with the same sensor electrode(s) as one or more sensor electrode element of the second set. That is, the first and second sets of sensor electrode elements may share sensor electrodes.

The controller is coupled to the plurality of capacitive buttons and is configured to receive indicia from the plurality of sensor electrodes, to generate at least three electrode values using the indicia received from sensor electrodes associated with the first set of sensor electrode elements, and to utilize the at least three electrode values to determine actuation of the first capacitive button.

The controller is further configured to effect human-observable output using the output device in response to actuation of the capacitive button. This can be done by controlling the output device, or indirectly by indicating to some other device that the output device should provide human-observable output.

The output device can be any appropriate device that outputs something observable by human senses such as sight, hearing, smell, taste, and touch. For example, the output device may provide visual output, auditory output, kinesthetic output, or a combination thereof. In some embodiments, the output device is a sound device, and the controller causes one or more sounds using the sound device. In other embodiments, the output device is a force feedback device, and the controller causes haptic feedback using the force feedback device.

Determining Actuations of MSE Capacitive Buttons

More generally, methods and apparatuses for determining the actuation of multiple-sensor-electrode capacitive buttons are described in accordance with embodiments of the present technology, the capacitive button arrangements described herein are used in determining the actuation of one or more capacitive buttons in the capacitive button arrangements. Each of the capacitive buttons has at least three sensor electrode elements associated with at least three distinct sensor electrodes.

In the discussion herein, "indicia" is used to denote both the case of a single indicium, and the case of multiple indicia (e.g. from multiple sensor electrodes simultaneously, from a same sensor electrode over time, or a mix of both). This has been done for convenience of explanation.

More particularly, and referring to FIG. 2A, in some embodiments, indicia are received from the at least three distinct sensor electrodes, A, B, and C, which are associated with the at least three sensor electrode elements, $A_1$, $B_1$, and $C_1$, comprising first capacitive button 205. When an input object (not shown), such as a finger, interacts with first capacitive button 205, the indicia indicates the interaction of the input object with the at least three sensor electrode elements, $A_1$, $B_1$, and $C_1$. In some embodiments, actuation of first capacitive button 205, based at least in part on satisfying a set of criteria, is then determined. In many embodiments, this set of criteria can be used to distinguish input intended to cause button actuation from input not intended to cause button actuation.

In embodiments of the present technology, satisfying at least the following set of criteria results in a determination of the actuation of an MSE capacitive button: satisfying a condition associated with a location of an input object relative to the center of the MSE capacitive button (a "location condition"), and satisfying a condition associated with a change in capacitive coupling (a "coupling condition"). The term "condition" is used to herein to indicate a criterion. Possible conditions include, and are not limited to, requirements in value, time, direction, space, history, and the like. Oftentimes, as discussed below, conditions may involve thresholds. All of these thresholds may be predetermined (e.g. at design, manufacture, use) or determined dynamically.

For example, a location condition concerning a location of the input object relative to the center of the capacitive button can be implemented using a maximum distance from the center of the capacitive button, a range of distances from the center of the capacitive button where the input object can be at, a region about the center of the capacitive button where the input object should be in, and the like. Generally, the location of the input object is gauged at least in part based on the indicia received from the sensor electrodes associated with the sensor electrode elements comprising the capacitive button. Thus, the location can be derived through direct examination of the indicia, processing of the indicia into some other form (e.g. electrode values, modified electrode values, etc.) that may or may not be further processed before evaluation, and the like.

As another example, a coupling condition concerning a change in capacitive coupling can be implemented as a requirement on a magnitude of a change in capacitive coupling of the sensor electrodes associated with the sensor electrode elements comprising the capacitive button. The magnitude of the change in capacitive coupling can be required to satisfy a first threshold magnitude, such as to be below, to meet, or to exceed the first threshold magnitude. Generally, the magnitude of the change in capacitive coupling is gauged at least in part based on the indicia received. The change in capacitive coupling is often determined as a change in capacitance. The change in capacitive coupling can be that of each sensor electrode, or that of a button (e.g. determined using a total change in capacitive coupling of all sensor electrodes having sensor electrode elements in the applicable capacitive button).

For example, in many embodiments, part of the set of criteria that must be satisfied for a capacitive button to be actuated is that the location of the input object must satisfy a condition associated with a location of the input object. For example, locations away from where input objects typically are when actuating a capacitive button may indicate input meant for something else other than button actuation. In some embodiments, and referring to FIG. 2A, this set of criteria comprises a location of the input object relative to a center of first capacitive button 205. The location of the input object is gauged at least in part based on the indicia, satisfies a condition associated with a distance from the center of first capacitive button 205.

In many embodiments, a "centered" position of an input object refers to that position of an input object that is close to an MSE capacitive button's center, based at least in part on, but not limited to, the MSE capacitive button's weighting factor, area, shape, and overlapping of the input object with the MSE capacitive button. In some embodiments, an input object sufficiently overlaps with the MSE capacitive button when a distance of the input object from the center of the MSE capacitive button is no more than, or less than, a threshold distance. Thus, in some embodiments, the location condition comprises the location of the input object being within a threshold distance of the center of the capacitive button. In some other embodiments, an input object is "centered" when it is in a defined region about the center of the MSE capacitive button.

In many embodiments, and still referring to FIG. 2A, part of the set of criteria that must be satisfied for an MSE capacitive button to be actuated is a change in capacitive coupling of the at least three distinct sensor electrodes A, B, and C, associated with the at least three sensor electrode elements, $A_1$, $B_1$, and $C_1$, comprising first capacitive button 205. The change in capacitive coupling is based at least in part on the indicia, and a condition associated with a change in capacitive coupling is applied. For example, small changes in the amount of capacitive coupling may reflect noise, accidental input, environmental changes, or input meant for something else other than button actuation.

A measure of the overall change in capacitive coupling, of a MSE capacitive button, due to an input object is referred to herein as "Z". "Z" can be calculated by totaling the indicia of the sensor electrodes that have at least one sensor electrode element in the MSE capacitive button. This can be done directly or indirectly, and pre- or post-processing may occur. For example, the indicia of the sensor electrodes can be converted to digital electrode values, and the electrode values filtered, weighted, etc. For example, Equation 1 shows a "Z" calculation for an MSE capacitive button with three sensor electrode elements associated with three sensor electrodes, A, B, and C. The electrode values derived from indicia received from each sensor electrode is represented by "S," such that $S_A$ is the electrode value for sensor electrode A, $S_B$ is the electrode value for sensor electrode B, and $S_C$ is the electrode value for sensor electrode C. Note that that a modified electrode value may be one that is clipped to a maximum or minimum value. For example, if the unmodified electrode value is greater than a maximum allowed electrode value, the modified electrode value is set to the maximum allowed electrode value or some other value.

$$Z = S_A + S_B + S_C \qquad \text{(Eq. 1)}$$

In many embodiments, sufficient user engagement, in which "Z" is greater than some threshold, satisfies a threshold magnitude of change in capacitive coupling. Typically, sufficient user engagement can be estimated by changes in the amount of capacitive coupling that are sufficiently large in magnitude. User disengagement can be estimated by magnitudes in changes in the amount of capacitive coupling that are sufficiently small. "Sufficient" herein refers to user interaction that is sufficient to trigger activation of a sensor electrode or actuation of an MSE capacitive button. Thus, sufficient interaction with a sensor electrode may result in sensor electrode activation, while sufficient interaction with a capacitive button may result in button actuation.

In many embodiments, the magnitude of the change in capacitive coupling of the at least three distinct sensor electrodes associated with an MSE capacitive button is gauged at least in part based on the indicia. This can be done by using the indicia to determine at least three distinct electrode values, where each distinct electrode value of the at least three distinct electrode values is associated with a different sensor electrode of the at least three distinct sensor electrodes. A total of the distinct electrode values can then be used. The total can be a direct summation of the electrode values or modified electrode values, or some type of indirect accumulation of the electrode values (e.g. a filtered summation of changes). In many embodiments where electrode values are determined, the coupling condition may be implemented by requiring the total of the distinct electrode values to be greater than a threshold magnitude.

In some embodiments, the magnitude requirement imposes a limit on only one side of a range of potential magnitudes, such as "Z>5". In some other embodiments, the magnitude requirement imposes limits on both sides of a range of potential magnitudes, such as "5<z<8".

In some embodiments, the coupling condition is satisfied if the change in capacitive coupling indicates user engagement with the capacitive button followed by user disengagement with the capacitive button. For example, the coupling condition may require a sequence of occurrences in which "Z" is first greater than a first threshold, and then "Z" is later less than a second threshold. Of note, these thresholds do not have to be the same threshold. Differing thresholds can introduce hysteresis, which helps to prevent the criterion from fluttering quickly between "satisfied" and "not satisfied.".

Referring to FIG. 2A, in some embodiments, a condition associated with the change in capacitive coupling is satisfied when any electrode value of an electrode value for each of the at least three distinct sensor electrodes, A, B, and C, satisfies a requirement associated with the change in capacitive coupling. Where electrode values are determined for the sensor electrodes, such as at least one for each of the at least three distinct sensor electrodes, A, B, and C, the electrode values can be used in any comparisons or evaluations. In other words, in some embodiments, only one of the at least three electrode values associated with the at least three distinct sensor electrodes, A, B, and C, must satisfy a threshold for the coupling condition to be met and for an MSE capacitive button to potentially be actuated.

For example, in some embodiments, the magnitude of the change in capacitive coupling of the at least three distinct sensor electrodes is gauged at least in part based on the indicia. This can be accomplished by using the indicia to determine at least three distinct electrode values, where each distinct electrode value of the at least three distinct electrode values is associated with a different sensor electrode of the at least three distinct sensor electrodes. At least one of the distinct electrode values being greater than the first threshold magnitude can thus satisfy the coupling condition in those embodiments.

For example, a condition may be a single threshold at 6.2, and require an electrode value greater than 6.2. If the "S" value of any of the three sensor electrodes, A, B, or C, is greater than the value of 6.2, then the condition is satisfied and the MSE capacitive button may be actuated if all other criteria (if any) in the set of criteria are met. While an example utilizing "S" values are described herein in relation to conditions associated with the capacitive coupling of sensor electrodes, the present technology is well suited to utilizing determinations other than "S" values.

In some embodiments, a condition associated with the change in capacitive coupling is satisfied in part when the change in the capacitive coupling occurs at least at a threshold rate. In other words, the change in capacitive coupling due to an input object is determined over time and evaluated. In some embodiments, an input object's engagement, and hence capacitive coupling, with an MSE capacitive button changes as the input object approaches the MSE capacitive button. As the input object approaches at certain speed and location combinations, it causes changes in capacitive coupling satisfying the threshold rate. In some embodiments, this threshold rate is a condition that must be satisfied in order for the MSE capacitive button to be actuated. Depending on the implementation, satisfying this rate condition can mean changes that occur at a rate that is less than, no more than, equal to, no less than, or greater than the threshold rate. Further, depending on the implementation, the rate of change in capacitive coupling may be an instantaneous or an average rate.

In many embodiments, the rate of change in capacitive coupling is meant as a measure of an approach rate of an input object towards an MSE capacitive button. Thus, the rate of change in capacitive coupling in those embodiments may roughly estimate the approach rate as a first time derivative of "Z" as shown in Equation 2.

$$\text{First time derivative of } Z = \frac{dZ}{dt} \qquad \text{(Eq. 2)}$$

As shown, embodiments of the present technology are well suited to calculating derivatives of "Z" (e.g. difference equations for discrete time differences). Embodiments of the present technology are also well suited to calculating integrals of Z (e.g. discrete time sums). As will be described herein, embodiments of the present technology enable derivatives of "Z" to be calculated to attain positional characteristics, such as but not limited to the following: positions, speeds, and velocities of one or more input objects.

In some embodiments, part of a set of criteria that must be satisfied for an MSE capacitive button to be actuated is the satisfaction of a condition associated with a duration of time during which an input object interacts with an MSE capacitive button. For example, satisfaction of conditions for short durations may indicate noise, environmental effects, accidental input, input meant for something else other than button actuation, and the like. In some embodiments, the duration condition is satisfied where indicia indicate an input object sufficiently interacting with the capacitive button for a duration of time. In those embodiments, the duration condition concerns an amount of time that the input object interacts with the capacitive button. The duration condition comprises that the amount of time being greater than a first threshold duration. In other embodiments, the duration condition is satisfied where indicia indicate an input object not sufficiently interacting with the capacitive button for a duration of time. Of note, different embodiments that impose duration conditions on "sufficiently interacting" and "not sufficiently interacting" may have sets of criteria that require the same or different time durations for "sufficiently interacting" and "not sufficiently interacting."

As discussed, the determination of the actuation and/or deactuation of an MSE capacitive button, involves in part satisfying a certain set of criteria. The set of criteria includes various conditions, which may be associated with predetermined threshold values. Other possible conditions in the set of criteria include, and are not limited to: the lateral speed of an input object; the lateral speed of an input object during a time period when a coupling condition is satisfied (e.g. time of sufficient change in capacitive coupling); the total lateral distance traveled by an input object; a distance between a location of an input object and the center of an MSE capacitive button; and a reduction in capacitive coupling. "Lateral" is used herein to indicate directions in a plane corresponding to a local portion of the sensing region (e.g. a part of a curved surface). In the figures shown, lateral would be in directions in the plane of the paper. Meanwhile, "vertical" is used to indicate directions into and out of the plane of the figures.

As will be described in more detail herein, a "clean press" of an input object to an MSE capacitive button is a situation in which the input object is clearly "pressed" onto a surface associated with the MSE capacitive button. In many embodiments, this means that a large number of conditions, such as those described herein, has been satisfied. A "clean lift" of an input object from an MSE capacitive button is a situation in which the input object is clearly "lifted" from a surface associated with the MSE capacitive button. In many embodiments, this means that a large number of conditions, such as those described herein, has been satisfied. In many embodiments, a "clean press" leads to an indication of the actuation of the capacitive button at a time when the set of criteria is satisfied. This is often referred to "actuation at press," and simulates many of the mechanical buttons. The capacitive button device can further provide repeated indications of button actuation in response to the input object still interacting with the capacitive button sufficiently "cleanly" after an initial clean press. This would simulate the response of mechanical keyboards, for example.

Furthermore, a "sloppy press" of an input object to an MSE capacitive button is a situation in which the input object is not as clearly "pressed" onto a surface associated with the MSE capacitive button (it may have wandered laterally into interaction with the MSE capacitive button, for example). In many embodiments, this means that a smaller number of conditions, such as those described herein, has been satisfied. Meanwhile, a "sloppy lift" of an input object from an MSE capacitive button is a situation the input object is not as clearly "lifted" from a surface associated with the MSE capacitive button (it may have wandered out laterally from interaction with the MSE capacitive button, for example). In many embodiments, this means that a smaller number of conditions, such as those described herein, has been satisfied.

In some embodiments, a "sloppy press" followed by a "clean lift" leads to actuation on release. In some embodiments, a "clean press" followed by a "clean lift" leads to actuation on release only, or actuation on both press and release (two distinct button actuations). Thus, in some embodiments, the location condition on the input object is imposed on a location of the input object. The location being one at a time defined by when the set of criteria is no longer satisfied (e.g. the location just before the coupling condition or some other condition is no longer satisfied). The condition comprises the location being within a threshold distance of the center of the capacitive button. The time when the set of criteria is no longer satisfied should occur substantially immediately after a time when the set of criteria is satisfied (to indicate a release). In response to this, actuation of the capacitive button is indicated no earlier than the time when the set of criteria is no longer satisfied.

In some embodiments, part of a set of criteria that must be satisfied for an MSE capacitive button to be actuated is a speed condition concerning a lateral speed of an input object relative to an MSE capacitive button. The lateral speed of the input object, gauged at least in part based on the indicia received from the at least three distinct sensor electrodes, has to satisfy a condition associated with speed. For example, high speeds while interacting with a capacitive button may indicate input meant for something else other than button actuation. In some embodiments, this is implemented as a speed condition comprising the lateral speed of the input object being less than a threshold speed during a time when the coupling condition is satisfied, wherein the lateral speed of the input object is gauged at least in part based on the indicia.

In some embodiments where positions are determined (e.g. X and Y positions in a Cartesian system), lateral speed may be calculated by taking the magnitude of the time derivatives of X and Y. This is shown using Equation 3 below:

$$\text{Lateral Speed} = \left\| \frac{d\vec{x}}{dt} + \frac{d\vec{y}}{dt} \right\| \quad \text{(Eq. 3)}$$

It is understood that, although Cartesian coordinates are used in most of the example equations shown, that any applicable coordinate system can be used. Thus, the equations may not be used as shown. Further, it is understood that embodiments may not directly calculate any of these positional characteristics, since evaluation of positional characteristics may be direct or indirect.

One way to implement the speed condition is to monitor an input object for low lateral speed during a time which an MSE capacitive button actuation is possible.

Accordingly, in some embodiments, part of a set of criteria that must be satisfied for an MSE capacitive button to be actuated is a criterion concerning a lateral speed of an input object relative to an MSE capacitive button, during a time of sufficient change in capacitive coupling. Generally, the lateral speed is gauged at least based in part on the indicia received from the at least three distinct sensor electrodes.

In some embodiments, a part of a set of criteria that must be satisfied for an MSE capacitive button to be actuated is a criterion on a lateral distance of movement of an input object relative to the MSE capacitive button, during a time of capacitive coupling with the input object, based at least in part on the indicia. The input needs to satisfy a condition associated with the lateral distance of movement. For example, large amounts of lateral movement while interacting with a capacitive button may indicate input meant for something else other than button actuation. In many embodiments, this distance condition can be implemented by considering a total lateral distance traveled by the input object relative to the capacitive button during a time when the coupling condition is satisfied. The distance condition comprises the total lateral distance being less than a threshold lateral distance. Generally, the total lateral distance is gauged based at least in part on the indicia.

For example, in some embodiments where positions are determined (e.g. X and Y positions in a Cartesian system), the lateral distance traveled when the coupling condition is satisfied can be calculated as a time integral of the lateral speed. This is shown in Equation 4:

$$\text{Lateral Distance of Movement} = \int \left\| \frac{d\vec{x}}{dt} + \frac{d\vec{y}}{dt} \right\| dt \qquad \text{(Eq. 4)}$$

If Equation 4 is used as expressed above, in order to calculate the lateral distance of movement, the integral of the speed is calculated. Integrating may begin when at least one sensor electrode is activated; if a sensor electrode is never activated, then an integral is never performed. Or, a continuous integral is reset when the electrode activated/deactivated.

A total lateral distance of movement refers to the total distance that was traveled by an input object over some period(s) in time. For example, assume that nine MSE capacitive buttons are disposed proximate to each other, and lined up in a single row. An input object passes over and interacts with all nine buttons in one single pass. The total lateral distance of movement, if for the amount of time when the input object interacted sufficiently with one of the capacitive buttons, would be the distance traveled only while the input object sufficiently interacted with that one capacitive button. In contrast, the total lateral distance of movement for the entire time that the input object interacts with the set of nine buttons would be much greater.

In some embodiments, part of a set of criteria that must be satisfied for an MSE capacitive button to be actuated is a "vertical approach" of an input object relative to an MSE capacitive button. The vertical approach of the input object is gauged at least in part on the indicia, and needs to satisfy a condition associated with the vertical approach. "Vertical approach" is used here to indicate input object approach in the direction typical for button actuation. For capacitive buttons with associated surfaces, this often means directions of approach that are substantially orthogonal to the surfaces. For example, approaches to the capacitive button that are not sufficiently "vertical" may indicate input meant for something else other than button actuation.

In many embodiments, this vertical approach requirement can be implemented as a approach condition concerning a direction of approach by the input object. The direction of approach by the input object is evaluated relative to the capacitive button during a time when the coupling condition is satisfied. The approach condition comprises the direction of approach being substantially orthogonal to a local portion of a surface associated with the capacitive button. Generally, the direction of approach is gauged based at least in part on the indicia.

Many different methods can be used to gauge the input object's verticalness of approach to an MSE capacitive button. As one example, the lateral speed is compared with the approach rate. In many embodiments, this can be estimated as in Equation 5. In equation 5, ratios with higher magnitudes indicate greater verticalness.

$$\text{Verticalness of Approach} = dZ/\|d\vec{x} + d\vec{y}\| \qquad \text{(Eq. 5)}$$

In some embodiments, part of a set of criteria that must be satisfied for a capacitive button to be actuated concerns a location of an input object relative to a center of the MSE capacitive button during a time of sufficient change in capacitive coupling due to the input object. The location is evaluated at least in part based on the indicia. In many embodiments, many locations of the input object are considered. For example, in some embodiments, the input object must satisfy a condition associated with a distance between an initial position and a final position of the input object. As discussed, these positions may be determined using any coordinate system (e.g. Cartesian coordinates) or other frame of reference. Once these positions are known, the distance between the initial position and the final position of the input object can be determined.

In some embodiments, part of a set of criteria that must be satisfied for a capacitive button to be actuated involves two substantially non-overlapping conditions on a same characteristic. In other embodiments, one condition includes two substantially non-overlapping requirements on a same characteristics. In many embodiments, the conditions (or requirements) need to be satisfied in a particular order. For example, some embodiments impose a first condition associated with a magnitude of a change in capacitive coupling to recognize sufficient interaction of the input object with an MSE button (e.g. some type of "press"). After that first condition is satisfied, the embodiments impose a second condition on the magnitude of a later change in capacitive coupling to recognize no sufficient interaction of the input object with an MSE button (e.g. some type of "lift."). The second condition does not overlap with the first condition in that the magnitude required for "press" is greater than the magnitude required for "release." By including non-overlapping conditions, hysteresis is introduced and therefore reduces the likelihood of determinations of button actuation that quickly flutter between actuation and no actuation.

Take the example in which a first condition applied to a first event requires a calculated threshold value to be less than 6 to cause actuation of an MSE capacitive button. Further, a second condition applied to an event occurring directly after the first event requires a calculated threshold value to be greater than 6 to cause deactuation of an MSE capacitive button. If the capacitive button device calculates a value to be 6, the determination of button actuation may flutter between actuation and no actuation.

As described herein, "Z" represents the change in capacitive coupling of input object with an MSE capacitive button. Thus, a time derivative of Z may be used to estimate an approach rate of the input object towards an MSE capacitive button, and the time derivative of Z may also be used to estimate a recession rate of the input object from the MSE capacitive button. The approach rate, as well as the recession rate may be roughly estimated as a first time derivative of "Z" as shown in Equation 2, above. Using one convention where Z increases with proximity of the input to the capacitive button, a positive dZ/dt indicates that the input object is approaching an MSE capacitive button, and a negative dZ/dt indicates that the input object is receding from the MSE capacitive button. Under another convention, the reverse is true.

In some embodiments, the rate of recession is considered as part of the set of criteria that must be satisfied for a capacitive button to be actuated. In some embodiments, conditions on the rate of recession are imposed indirectly. For example, a "vertical recession" can involve comparison of the recession rate with lateral speed when the input object is receding. Analogs to Equation 5 can be used.

In some embodiments, a set of criteria that must be satisfied for a capacitive button to be actuated comprises a coupling condition on a change in capacitive coupling of the at least three distinct sensor electrodes, where the coupling condition has multiple requirements. In some embodiments, the magnitude of change in capacitive coupling must satisfy a first threshold magnitude and satisfy a second threshold magnitude. For example, the first threshold magnitude may be satisfied if the magnitude of the change in capacitive coupling is greater than the first threshold magnitude, while the second threshold magnitude may be satisfied if the magnitude of the change in capacitive coupling is less than the second threshold magnitude. Unless both thresholds are satisfied, no actuation of the MSE capacitive button will be determined or indicated. In many embodiments, this can be implemented as the magnitude of the change in capacitive coupling being less than a second threshold magnitude, wherein the second threshold magnitude is greater than the first threshold magnitude.

For example, too much user engagement with the capacitive button arrangement may indicate something other than input intended to actuate one or more capacitive buttons. Too much user engagement may involve an MSE capacitive button sensing too great a change in capacitive coupling, or may involve multiple MSE capacitive buttons together sensing changes in capacitive coupling that are too high. For example, if a "total Z" (a value reflective of a total of the changes in capacitive coupling for a number of sensor electrodes, including sensor electrodes from different capacitive buttons. Usually, a greater number of sensor electrodes than there are sensor electrodes associated with a capacitive button are included) is too high for the entire set of multiple MSE capacitive buttons, then it might be determined that no actuation is intended. For instance, the "total Z" may be too high because the object sensed by the MSE capacitive buttons is too large (e.g. the buttons are sensing a leg, a cheek, or other body part not meant to interact with the capacitive button arrangement). As another example, the "total Z" may be too high because multiple input objects are interacting multiple capacitive buttons, especially if the multiple capacitive buttons are not designed to accept multiple input objects. Thus, in those embodiments, for the capacitive button to be actuated, the applicable "total Z" must be less than (or at least no more than) some threshold. Note that, in some cases, Z may be calculated based on modified electrode values. As discussed above, these modified electrode values may be clipped to one or more maximum or minimum values.

Since, in many embodiments, the change in capacitive coupling increases with the area of overlap between an input object with the sensor electrodes, indicia from the sensor electrodes can also be used to reduce false button actuations by inhibiting indications of button actuation. As one example, this can be accomplished by monitoring for indicia reflective of input not intended for button actuation, and limiting processing of the indicia (or derivatives of the indicia, such as electrode values or positional characteristics) in response. As another example, this can be accomplished by processing indicia and derivatives as usual, and suppressing the indication of button actuations in response to indications of input not intended for button actuation. As a further example, this can be accomplished by rejecting indicia (or derivatives of indicia) that appear unintended for button actuation, and continuing to process other indicia or input. In a simple example, inhibition may continue until all significant user input is removed (e.g. all applicable sensor electrodes are inactive). As can be seen, there are many ways to implement the inhibition of indicating button actuation in response to input that appear unintended for button actuation, including any combination of the above.

Depending on the implementation and the input received, potential button actuation can be inhibited for only some capacitive buttons of a button arrangement (e.g. those buttons that appear affected by the input that appear not intended for button actuation) or all capacitive buttons of a button arrangement. Further, the inhibition can last for a time period after the input that caused the original inhibition has finished.

In one example, some embodiments utilize a total of the changes in capacitive coupling for a number of sensor electrodes, including sensor electrodes from different capacitive buttons. (Usually, a greater number of sensor electrodes than there are sensor electrodes associated with a capacitive button are included). A "total Z" that reflects a total of the indicia or electrode values of that number of sensor electrodes is determined. If this total Z is greater than a start-suppressing threshold, then capacitive button actuation may be inhibited. As another example, some embodiments utilize a total of the changes in capacitive coupling for all of the sensor electrodes in the capacitive button arrangement. If a "total Z" that reflects a total of all of the changes in capacitive coupling to all sensor electrodes is greater than another start-suppressing threshold, then capacitive button actuation may be inhibited. In some embodiments, the inhibition will extend only for the time when the start-suppressing threshold is satisfied. In some embodiments, the inhibition can extend for some time period after the "total Z" is less than a stop-suppressing threshold. The start-suppressing threshold and the stop-suppressing thresholds may be the same threshold value. However, in many embodiments, they will differ in order to introduce hysteresis and help reduce the likelihood of the capacitive button device fluttering between suppressing and not suppressing button actuations. In another embodiment, the stop-suppressing condition can include one or more stop-suppressing thresholds concerning electrode values, modified electrode values, or other derivatives of the indicia.

As discussed above, in some embodiments, the inhibition of capacitive button actuation is based on indicia received from a subset of all of the sensor electrodes. For example, in some embodiments, if electrode values of some sensor electrodes in the MSE capacitive button arrangement satisfy start-suppressing criteria, then no capacitive button actuation results even if the indicia otherwise satisfy capacitive button actuation requirements. The start-suppressing criteria may include any combination of thresholds for electrode values, history of electrode values, a general fraction of sensor electrodes satisfying requirements on thresholds, history, etc., which sensor electrodes satisfy requirements on thresholds, history, etc., and the like.

Furthermore, like the change in total capacitive coupling embodiments described above, there may be a time-out after the electrode values satisfy start-suppressing criteria, or satisfy stop-suppressing criteria. Additionally, start-suppressing criteria and stop-suppressing criteria may be the same, or be different (e.g. to introduce hysteresis).

Moreover, in some embodiments, capacitive button actuation may be inhibited only partially. For example, during partial inhibition, stricter capacitive button actuation criteria may be imposed and other capacitive button actuation criteria rejected (e.g. in various embodiments, the indicia must indicate a "clean press," a "clean lift, or a "clean press" followed by a "clean lift", all with additional or stricter limits, etc.). As another example, the inhibition may only apply to certain MSE capacitive buttons in a capacitive button arrangement (e.g. the MSE capacitive buttons closest to an estimated position of an input object causing the inhibition).

In some embodiments, the change in capacitive coupling of the at least three distinct sensor electrodes of the MSE capacitive button is determined based on a total of the indicia of the at least three distinct sensor electrodes. The indicia can be used directly, or a derivative of the indicia (e.g. electrode values or modified electrode values) can be used in the totaling. For example, and as described herein, Equation 1 can be used to calculate a sum of the electrode values associated with three sensor electrodes that have sensor electrode elements in an MSE capacitive button, to arrive at a "Z". In many embodiments, this "Z" is a gauge of user engagement with the MSE capacitive button that includes the sensor electrodes providing the values summed, since it reflects a total of the indicia of all sensor electrodes having elements in the MSE capacitive button. In some embodiments where sensor electrodes are shared, Equation 1 may need to be modified to include subtracting out effects on the individual electrode value that is unrelated to user interaction with the applicable MSE capacitive button (e.g. due to some type of user interaction with the sensor electrode, outside of the applicable MSE capacitive button).

Additionally, the term, "total", in reference to phrases such as "a total of the indicia", refers generally to processing that results in some type of accumulated measure of indicia. For example, the indicia or values derived from the indicia (e.g. electrode values) may be averaged, filtered, weighted, and the like, before being used for determination of the total. Moreover, the "total of the indicia" can be an indirect measure of the total such as via use of electrode values determined from indicia.

In some embodiments, determining the change in capacitive coupling of the at least three distinct sensor electrodes comprises determining a total of electrode values of at least three distinct sensor electrodes less the electrode value(s) of at least one sensor electrode outside of the MSE capacitive button. For example, user engagement may be gauged by considering a total of the electrode values of all sensor electrodes having sensor electrode elements in the MSE capacitive button less the electrode values of at least one sensor electrode not having any sensor electrode element in the MSE capacitive button. The sensor electrode may be associated with a button other than one being interacted with by the user, or the sensor electrode may be associated with a sensor electrode element located outside of the area of the intended button operation (e.g. a ring-shaped element such as element 500 of FIG. 5A).

In many embodiments, this can be accomplished by receiving indicia from an unassociated sensor electrode. The unassociated sensor electrode not associated with any sensor electrode elements of the capacitive button. The magnitude of the change in capacitive coupling of the at least three distinct sensor electrodes is gauged at least in part based on the indicia. If a total of indicia is used, some embodiments use the indicia from the at least three distinct sensor electrodes to determine distinct electrode values for the at least three distinct sensor electrodes, and use the indicia from the unassociated sensor electrode to determine an unassociated electrode value. Then, these embodiments use a difference between a total of the distinct electrode values and the unassociated electrode value. In some embodiments with disambiguating electrodes, differences between totals of the distinct electrode values and applicable electrode value(s) of the disambiguating electrode(s) are used.

More particularly, in some embodiments, if there are any sensor electrodes not interacting with the input object, then the change experienced by those sensor electrodes can be subtracted as common mode error (e.g. noise, interfering signals, unintended input, etc.). A version of this is shown in the following Equation 6:

$$Z = S_A + S_B + S_C - \text{(common mode error)} \quad \text{(Eq. 6)}$$

In the case that sensor electrodes are shared between MSE capacitive buttons, such that some or all of the sensor electrodes have sensor electrode elements in more than one MSE capacitive button, then it becomes especially desirable to subtract the indicia associated with the one or more sensor electrodes outside of the MSE capacitive button. In many embodiments, a weighted version of those indicia is utilized. A version of this is shown in Equation 7 below:

$$Z = S_A + S_B + S_C - (\alpha S_D) \quad \text{(Eq 7)}$$

The weighting factor, $\alpha$, varies with the configuration of the capacitive button arrangement (e.g. related to the number of sensor electrode elements per MSE capacitive button). In some embodiments, the weighting factor is 2. $S_D$ is the change in the amount of capacitive coupling of a sensor electrode outside of the MSE capacitive button.

Referring now to FIG. 6A, a set of four MSE capacitive buttons sharing four sensor electrodes (sensor electrodes A, B, C, and D) is shown in accordance with embodiments of the present technology. The sensor electrodes having sensor electrode elements in capacitive buttons 600, 605, 610, and 615 are B-A-D, A-B-C, B-D-C, and D-A-C, respectively. The layout of the MSE capacitive buttons is such that MSE capacitive button 600 is on the left while MSE capacitive button 615 is on the right. The equations for calculating Z for the four MSE capacitive buttons, if the approach shown in Equation 7 is applied, are as shown in Equations 8 below:

$$Z_{600} = S_B + S_A + S_D - \alpha_{600} S_C$$

$$Z_{605} = S_B + S_A + S_C - \alpha_{605} S_D$$

$$Z_{610} = S_B + S_C + S_D - \alpha_{610} S_A$$

$$Z_{615} = S_C + S_D + S_A - \alpha_{615} S_B \quad \text{(Eqs. 8)}$$

In some embodiment, the weighting factors for different capacitive buttons may be the same or substantially similar.

Even though FIG. 6A shows a set of four MSE capacitive buttons sharing exactly four different sensor electrodes, A-D, many other numbers of sensor electrodes are possible. For example, there may be three MSE capacitive buttons sharing three, four, nine, or other number of sensor electrodes.

A capacitive button arrangement as described above may also distinguish and respond to input not meant for button actuation. Using an input including a swiping motion as an example, a capacitive button arrangement may respond to a swipe by closing one or more windows or applications, scrolling, clearing a screen, or the like.

In some embodiments, a swipe interaction with the capacitive button is determined (and indicated if appropriate) if a lateral speed of the input object relative to the MSE capacitive button is in a range of lateral speeds. Generally, a fast lateral speed is desired, since fast lateral speeds typically often that the user input is intended to be a swipe. For example the range of lateral speeds may be a range that includes zero, or no motion (e.g. less than a maximum value, or no more than a maximum value). As another example, the range of lateral speeds may include infinity (e.g. greater than a minimum value, or no less than a minimum value). As yet another example, the range may require a speed between minimum and maximum speeds (e.g. the higher end being bound by: less than a maximum value, or no more than a maximum value while the lower end is bounded by: greater than a minimum value, or no less than a minimum value). The bounds behave as a type of minimum and maximum thresholds for the lateral speeds exhibited by input objects.

The direction of the swipe can also be determined, and indicated as appropriate. For example, in some embodiments using Cartesian X-Y coordinates, an input may be considered a Y-swipe if the speed in the Y direction is substantially greater than the speed in the X direction, an X-swipe if the speed in the X direction is substantially greater than the speed in the Y direction, and a diagonal swipe if the speed in the Y and X directions are relatively close in magnitude. It is understood that analogous versions of this approach can be applied to embodiments using other frames of reference.

In some embodiments using Cartesian X-Y coordinates, a swipe interaction may be determined, and indicated as appropriate, if the speed in the Y direction (e.g. $\|d\vec{y}/dt\|$) is substantially greater than the speed in the X direction (e.g. $\|d\vec{x}/dt\|$), or vice versa. It is understood that analogous versions of this approach can be applied to embodiments using other frames of reference. As one example, polar coordinates can be used for circular travel around a button, which can be used to indicate a spinning-type or whirling-type swipe-like gesture.

In some embodiments, a swipe interaction with an MSE capacitive button is determined (and indicated if appropriate) if a total lateral distance traveled by the input object relative to the MSE capacitive button satisfies a threshold swipe distance. Generally, in some embodiments a total lateral distance that is greater than the threshold swipe distance is desired. For example, the threshold swipe distance can be set to be greater than a threshold concerning an acceptable lateral distance at a "press" or at a "lift" of an input objects providing an input that results in button actuation. This helps to indicate that the user input is not meant for button actuation. However, in some embodiments, a total lateral distance less than the threshold swipe distance is desired. For example, some inputs that exhibits too much lateral distance may indicate that the input is not meant to be a swipe interaction. The input may be intended for cursor control, game play, and the like.

Analogous to the lateral speed criterion, the direction of the swipe can also be determined, and indicated as appropriate. For example, in some embodiments using Cartesian X-Y coordinates, an input may be considered a Y-swipe if the distance traveled in the Y direction is substantially greater than the distance traveled in the X direction, and vice versa. A diagonal swipe may be determined if the distances traveled in the Y and X directions are relatively close in magnitude.

In some embodiments, a swipe interaction may be determined, and indicated as appropriate, if a comparison of distances traveled in different directions show substantially greater distance traveled in one direction than other direction(s). For example, in some embodiments using Cartesian X-Y coordinates, a Y-swipe may be determined, and indicated as appropriate, if the total distance in Y is greater than the total distance in X, and vice versa.

In some embodiments, the capacitive button arrangement may be responsive to swipes only after the input object is determined not to be a capacitive button actuation. For example, the capacitive button device may run a swipe check in response to an input object that involves a "sloppy press" followed by a "sloppy lift" or some other set of state transitions. Other embodiments may determine swipe interactions in a parallel process to determining button actuation.

As discussed above, in some embodiments, a capacitive button device is capable of recognizing and monitoring swipes using criteria such as a high lateral speed (the absolute lateral speed, or the lateral speed in particular directions), a large total distance traveled, any combination thereof, or the like.

As discussed above, some implementations can also distinguish the direction of a swipe input. For example, in some embodiments, if $\|d\vec{y}/dt\|$ is much greater than $\|d\vec{x}/dt\|$, then this may be considered a Y-swipe. The capacitive button device can also check that the total distance traveled in various directions is appropriate. For example, for a Y-swipe, the total distance traveled in Y may be greater than some threshold $$\left(\text{e.g.} \int \left\| \frac{d\vec{x}}{dt} + \frac{d\vec{y}}{dt} \right\| dt \text{ is greater than some threshold}\right),$$

the total distance traveled in X may be less than some threshold $$\left(\text{e.g.} \int \left\| \frac{d\vec{x}}{dt} + \frac{d\vec{y}}{dt} \right\| dt \text{ is less than some threshold}\right),$$

or both. For an X-swipe, the foregoing instance is reversed.

Where the capacitive button arrangement includes multiple, non-contiguous capacitive buttons, then any button positional output of the multiple MSE capacitive buttons may be examined and used together. For example, for a swipe that spans four MSE capacitive buttons lined up in a row, an input object that interacts with the MSE capacitive buttons in sequence may be assumed to indicate a swipe input across the MSE capacitive buttons.

In such a case, it may be useful to check that the swipe actually traversed multiple MSE capacitive buttons of a group of MSE capacitive buttons that the swipe spanned (e.g. the first and second MSE capacitive buttons, the first and the last MSE capacitive buttons, every other MSE capacitive button, or all MSE capacitive buttons). Further, the time-history of the "Z"s of the four MSE capacitive buttons can be examined for an input object interaction with each MSE capacitive button in turn. Additionally, or in substitution, the capacitive button device can check to make sure that all of the MSE capacitive buttons swiped exhibited a swipe rate above some threshold (e.g. the lateral speed as the input object traveled proximate to each MSE capacitive button is greater than some threshold).

In some embodiments, a sampling rate of indicia from the at least three distinct sensor electrodes is changed based at least in part on whether the change in capacitive coupling of the at least one of the at least three distinct sensor electrodes over a time period. An MSE capacitive button may operate at different rates of sampling measurement depending on received indicia. For example, if electrode values derived from indicia received are above a threshold for a time period, then the MSE capacitive button will change its sampling rate of measurement to be faster. However, if electrode values derived from the indicia received are below a threshold for a time period, then the MSE capacitive button will change its sampling rate of measurement to be slower. For example, the MSE capacitive button may switch to a slower, "doze" state. In this manner, the capacitive button device may reduce power consumption and save energy.

In many embodiments, this can be implemented as follows. The change in capacitive coupling of the at least three distinct sensor electrodes comprises a plurality of variations in capacitive coupling, each of the plurality of variations in capacitive coupling associated with one of the at least three distinct sensor electrodes. The rate of receiving indicia from the at least three distinct sensor electrodes is increased responsive to at least one of the plurality of variations in capacitive coupling satisfying an activation threshold for a first time period.

In many embodiments, the variations in capacitive coupling may also cause a decrease in the rate of receiving indicia from the at least three distinct sensor electrodes. For example, the rate of receiving indicia may be reduced be in response to at least one of the plurality of variations in capacitive coupling satisfying a deactivation threshold for a second time period.

As another example, in a state machine embodiment, a device with a capacitive button arrangement may start out in a "doze" state. In response to a sensor electrode reporting an indicia satisfying a threshold, the sensor electrode is considered activated, and the device enters a "wake" state. In the "wake" state, sensor electrode values are collected and positional characteristics are calculated. Based on the positional characteristics, the device can transition to a "sloppy press" state or "clean press" state. These state changes may be internal with in a controller having one or more physically discrete components.

In some embodiments, the device enters a "clean press" state in response to the following: a centered position (e.g. distance of position from center is less than some threshold) for a duration of time; sufficient user engagement (e.g. "Z" is greater than some threshold) for a duration of time.

In some embodiments, the device would also look for some combination of the following to enter the "clean press" state: sufficient user engagement with the sensor electrodes of an MSE capacitive button (e.g. $S_i$ is greater than some threshold); a fast approach/press rate (e.g. dZ/dt is greater than some threshold); "vertical" approach (e.g. $\|d\vec{x}+d\vec{y}\|dZ$ is less than some threshold); low lateral speed (e.g. $\|d\vec{x}+d\vec{y}\|$ is less than some threshold); and small total distance traveled $$\left(\text{e.g.} \int \left\|\frac{d\vec{x}}{dt} + \frac{d\vec{y}}{dt}\right\| dt \text{ is less than some threshold for some time period before a lift}\right).$$

In some embodiments, the device enters a "sloppy press" state in response to a set of positional characteristics that meet some but not all of the criteria for transitioning to a "clean press" state. For example, the positional characteristics may show that the input object is not engaging with all of the sensor electrodes as required, has a slower approach rate than required, has a slanted approach angle that is beyond that which is required, has a higher lateral speed than required, has a larger total distance traveled than is required, a combination of the above, or the like.

Moreover, the device may transition to a "clean lift" state or "sloppy lift" state from a "sloppy press" state or a "clean press" state. For example, the device may enter a "clean lift" state in response to the positional characteristics showing the following: the position characteristics show a centered position before lifting (e.g. r is less than some threshold); sufficient user disengagement with the entire MSE capacitive button (e.g. "Z" is less than some threshold); and all of the above being satisfied for a duration of time.

In some embodiments, the device also looks for some combination of the following to enter a "clean lift" state: sufficient user disengagement with the sensor electrodes of the MSE capacitive button (e.g. $S_i$ is less than some threshold); recession or lifting, (e.g. dZ/dt of the capacitive button is less than zero), and lifting at a sufficient speed shown by a large negative approach rate (e.g. dZ/dt of the capacitive button is less than some threshold); "vertical" recession (e.g. $\|d\vec{x}+d\vec{y}\|dZ$ is less than some threshold); low lateral speed (e.g. $\|d\vec{x}+d\vec{y}\|$ is less than some threshold); and small total distance traveled $$\left(\text{e.g.} \int \left\|\frac{d\vec{x}}{dt} + \frac{d\vec{y}}{dt}\right\| dt \text{ is less than some threshold}\right).$$

In some embodiments, the device enters a "sloppy lift" state in response to the positional characteristics meeting part but not all of the requirements for entering a "clean lift" state. For example, the positional characteristics may show that the input object is still interacting with one or more of the sensor electrodes in the MSE capacitive button, a low lifting rate, a slanted recession, a higher lateral speed, a larger total distance traveled, a combination thereof, or the like.

From the "clean lift" state or the "sloppy lift" state, the device can return to a "doze" state some time after a sensor electrode associated with the MSE capacitive button has been activated. The device can define certain state transitions to be capacitive button actuations, certain state transitions not to be capacitive button actuations, and certain state transitions to indicate non-button actuation input (e.g. swipes). In some embodiments, the type of actuation indicated or resulting response differs depending on the press and lift events that triggered it. For example, different actuations may exist for "clean press" actuations, "sloppy press" actuations, "clean lift" actuations, "clean press followed by clean lift" actuations, and the like.

In one example, capacitive button actuation may be reported in response to any or all of the following sequences. The capacitive button actuation may be determined in response to a sequence of state transitions such as: "Doze, then Wake, then Clean Press, then Clean Lift"; or "Doze, then Wake, then Clean Press, then Sloppy Lift". In some embodiments, both sequences may result in button actuation on reaching the "clean press" state.

In some examples, a sequence of state transitions such as "Doze, then Wake, then Sloppy Press, then Clean Lift" may also result in a capacitive button actuation. In some embodiments, however, since the press is a "sloppy press", the MSE capacitive button device may report capacitive button actuation on the "clean lift" from of the MSE capacitive button instead of on the "sloppy press".

In some embodiments, a sequence of state transitions such as "Doze, then Wake, then Sloppy Press, then Sloppy Lift" results in no button actuation. However, this sequence can be used to generate other types of input instead of capacitive button actuation (e.g. some inputs triggering such state transitions may be swipe inputs, and may be used by devices supporting swipe interaction inputs).

In some embodiments with multiple capacitive buttons, the controller identifies which capacitive button(s) is(are) being interacted with. Where sensor electrodes are not shared among multiple MSE capacitive buttons, this can be done by examining which sensor electrodes are providing indicia indicative of user interaction. Where sensor electrodes are shared, this can be done by examining which combinations of sensor electrodes are providing indicia indicative of user interaction, and which combinations of sensor electrodes are valid capacitive button combinations. That is, which combinations of sensor electrodes are used in the capacitive buttons of the arrangement. Thus, the capacitive button device may identify which capacitive button to evaluate for button actuation from a plurality of capacitive buttons, especially where the plurality of capacitive buttons share at least one sensor electrode.

Referring now to FIG. 7, two sets of MSE capacitive buttons, m and n are shown. Each set of MSE capacitive buttons shares different groups of sensor electrodes (m sharing sensor electrodes A-D and n sharing sensor electrodes E-H). Embodiments of the present technology enable distinguishing signals of a particular sensor electrode element of a distinct set of at least three electrode elements from other sensor electrode elements.

For example, in some embodiments, the capacitive button arrangement device receives indicia from all of the sensor electrodes A-H, a group of MSE capacitive buttons arranged as in FIG. 7. Embodiments of the present technology determine which capacitive button(s) are experiencing user input based on which combinations of sensor electrodes are providing indicia indicative of input. The capacitive button arrangement does not receive very few if any signals from the set of sensor electrode elements E-H. The capacitive button arrangement then ignores any signals that come from the sensor electrode elements E-H that do not indicate that an MSE capacitive button is being actuated. Only sensor electrodes A-B-C that experience interaction may indicate that button 700 of group m is being interacted with, for example. However, only sensor electrodes A-B-E exhibiting interaction may indicate that no button in the arrangement is experiencing sufficient interaction for button actuation.

It is understood that embodiments can apply different sets of criteria. The different sets of criteria can include different combinations of the conditions described above, and other conditions as well, as appropriate.

For example, in some embodiments, a capacitive button device comprises a plurality of sensor electrodes, a first capacitive button, a second capacitive button, and a controller. The first capacitive button comprises at least three sensor electrode elements associated with a first subset of the plurality of sensor electrodes. The second capacitive button comprises at least three sensor electrode elements associated with a second subset of the plurality of sensor electrodes. The first subset and the second subset includes at least one sensor electrode in common. The controller is coupled to the plurality of sensor electrodes, and is configured to: receive indicia from the plurality of sensor electrodes; determine interaction of the input object with the first capacitive button based at least in part on the indicia; and determine actuation of the first capacitive button based at least in part on satisfaction of a set of criteria.

The set of criteria comprises: a location condition, a coupling condition, and duration condition. The location condition concerns a location of the input object relative to a center of the first capacitive button, where the location of the input object is gauged at least in part based on the indicia. The coupling condition concerns a magnitude of change in capacitive coupling of the first subset of the plurality of sensor electrodes, where the coupling condition comprises the magnitude of the change in capacitive coupling satisfying a first threshold magnitude. The duration condition concerns an amount of time the input object interacts with the first capacitive button. The duration condition comprises the amount of time being greater than a first threshold duration. The location of the input object, the magnitude of the change in capacitive coupling, and the amount of time the input objects interacts with the capacitive button are all gauged at least in part based on the indicia.

In some embodiments, the controller is also configured to change a rate of receiving indicia from the plurality of sensor electrodes responsive to satisfaction of a coupling condition for a time period.

In some embodiments, the location condition comprises the location of the input object being within a threshold distance of the center of the first capacitive button.

In some embodiments, the set of criteria comprises a maximum lateral motion condition concerning a lateral motion of the input object. The condition is applicable to lateral motion occurring during a time when a coupling condition is satisfied.

Figure 10:
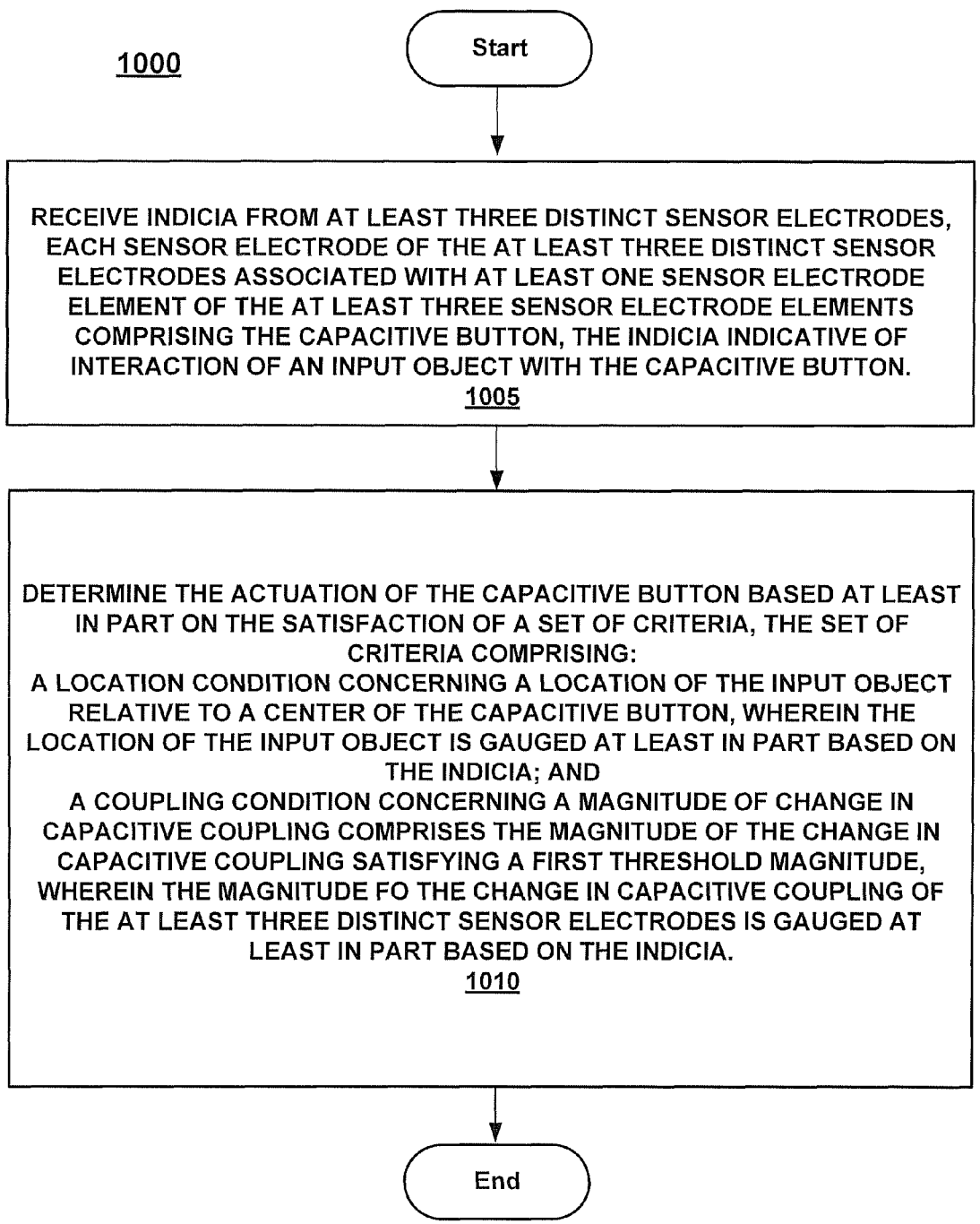
FIG. 10 is a flowchart of an example method for indicating actuation of a capacitive button comprising at least three sensor electrode elements associated with at least three distinct sensor electrodes in accordance with embodiments of the present technology.

FIG. 10 is a flowchart of an example method 1000 for indicating actuation of a capacitive button comprising at least three sensor electrode elements. With reference now to 1005 of FIG. 10 and to FIG. 2A, indicia from at least three distinct sensor electrodes, A, B, and C, associated with the at least three sensor electrode elements comprising first capacitive button 205, are received. The indicia indicate interaction of an input object with the at least three distinct sensor electrodes elements, $A_1$, $B_1$, and $C_1$, of first capacitive button 205.

With reference to 1010 of FIG. 10 and to FIG. 2A, actuation of first capacitive button 205 is determined, based at least in part on satisfaction of a set of criteria. The set of criteria comprises a location condition concerning a location of the input object relative to a center of first capacitive button 205, wherein the location of the input object is gauged at least in part based on the indicia. The set of criteria also comprises a coupling condition concerning a magnitude of change in capacitive coupling of the at least three distinct sensor electrodes, wherein the coupling condition comprises the magnitude of the change in capacitive coupling satisfying a first threshold magnitude, wherein the magnitude of the change in capacitive coupling of the at least three distinct sensor electrodes, A, B, and C, is gauged at least in part based on the indicia.

Tuning at Least One Threshold Using Neural Network

In general, neural network methods can be used to determine capacitive button actuations based on indicia received from sensor electrodes of MSE capacitive buttons. For example, indicia may be collected or modeled, correlated with estimated capacitive button actuation probabilities, and used to train a neural network. Once the neural network has reached a satisfactory level of accuracy, it can be used to determine capacitive button actuation in systems supporting MSE capacitive buttons within some amount of variation from the configuration used to tune the neural network.

Similarly, neural networks may also be used to classify and respond to a swipe or other non-button actuation triggering input. Depending on the results, this neural network approach may result in tuning a neural network that classifies capacitive button actuation by effectively watching for positional characteristic responses, even though the positional characteristics may not be explicitly calculated or compared.

Figure 11:
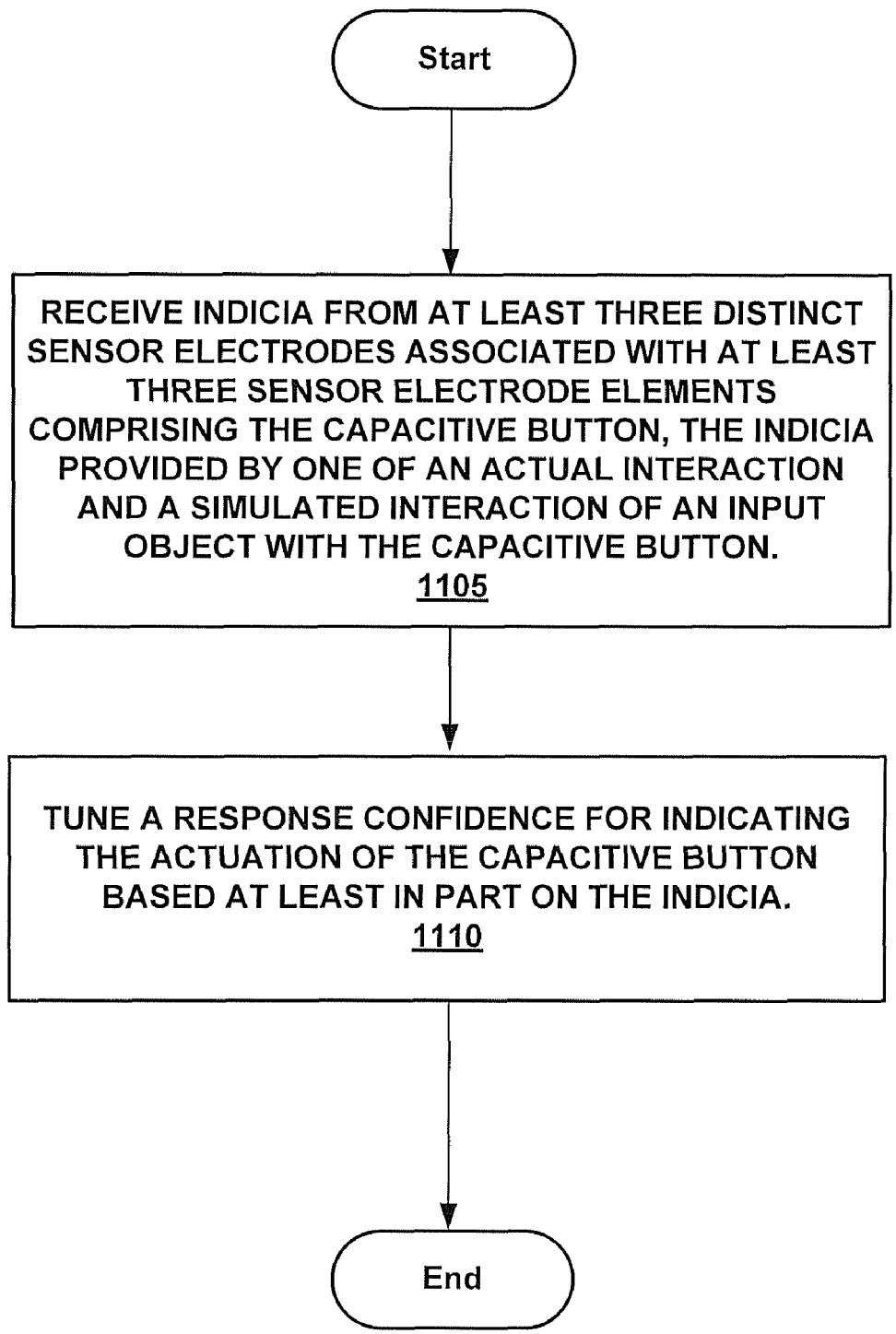
FIG. 11 is a flowchart of an example method for tuning at least one threshold in a system comprising a capacitive button comprising at least three sensor electrode elements associated with at least three distinct sensor electrodes in accordance with embodiments of the present technology.

More particularly, and referring to FIG. 1100 of FIG. 11, a flowchart of an example method 1100 of tuning at least one threshold in a system comprising a capacitive button comprising at least three sensor electrode elements associated with at least three distinct sensor electrodes, is shown in accordance with embodiments of the present technology. Referring now to 1105 of FIG. 11 and to FIG. 2A, some embodiments receive indicia from at least three distinct sensor electrodes, A, B, and C, associated with the at least three sensor electrode elements, $A_1$, $B_1$, and $C_1$, comprising first capacitive button 205, the indicia provided by one of an actual interaction and a simulated interaction of an input object with first capacitive button 205.

For example, for a system having m MSE capacitive buttons, where each of the m MSE capacitive buttons ($B_j$) has n total observations over sensor electrodes and time, a linear equation describing the relationship between indicia and the estimated capacitive button actuation confidences or probabilities (as $B_j$) can be expressed as in Equation 9. The latter of the Equations 9 show that multiple, non-linear modified electrode values may be used.

$$[B_1 ... B_n] = [M_1 ... M_n] \begin{bmatrix} S_{11} & \cdots & S_{1m} \\ \vdots & \ddots & \vdots \\ S_{n1} & \cdots & S_{mn} \end{bmatrix} \quad \text{(Eqs. 9)}$$

$$[B_1 \ ... \ B_m] = [M_1 \ ... \ M_n]_1 \begin{bmatrix} S_{11} & \cdots & S_{1j} \\ \vdots & \ddots & \vdots \\ S_{i1} & \cdots & S_{ij} \end{bmatrix} + ... +$$

$$[M_1 \ ... \ M_n]_N \begin{bmatrix} S_{11}^N & \cdots & S_{1j}^N \\ \vdots & \ddots & \vdots \\ S_{i1}^N & \cdots & S_{ij}^N \end{bmatrix}$$

The M vector can be determined using any type of error minimizing method. For example, least squares or minimum energy considerations can be used to solve for M. With a known M vector, the button actuation responses can be solved as a set of linear equations of the S values associated with each MSE capacitive button.

Referring now to 1110 of FIG. 11 and to FIG. 2A, in some embodiments, a response confidence for indicating an actuation of first capacitive button 205 is tuned, the tuning based at least in part on indicia. The response confidence may be a binary result based on a threshold, or a discrete or continuous response indicating the probability (confidence in) of intended capacitive button actuation. The confidence can be above or below a threshold to result in button actuation.

In some embodiments, the indicia are inputted into a neural network for classifying indicia according to a level of accuracy. In some embodiments, indicia are classified using state variables. For example, depending on M, this state variable method may result in the equivalent of watching for select positional characteristic responses, even though the positional characteristics may not be explicitly calculated or compared. For example, a matrix that relates capacitive button actuation to sensor electrode indicia can be created that is related to the positional characteristics described above. In such a case, even though the positional characteristics may not be explicitly calculated, they are inherently captured in the matrix and its inverse (for solving for capacitive button actuation).

Determining Position of an Input Object Using Centroid Approach

More generally, when an input object comes into proximity with a capacitive button, the input object will interact with the sensor electrode elements of the MSE capacitive button. However, the input object may not be centered over the MSE capacitive button. Many different methods may be used to determine the position of the input object with respect to the capacitive button. Discussed below is a centroid approach to determine the position of an input object with respect to the capacitive button. In many embodiments, the capacitive button device requires that the input object cause one or more indicia to be above a threshold for calculating position. Referring to 1200 of FIG. 12, in embodiments in accordance with the present technology, the capacitive button arrangement described herein is used to determine a position of an input object using an MSE capacitive button comprising a center position and comprising at least three sensor electrode elements associated with at least three distinct sensor electrodes, wherein each sensor electrode of the at least three distinct sensor electrodes is associated with at least one sensor electrode element of the at least three sensor electrode elements comprising the capacitive button.

Figure 12:
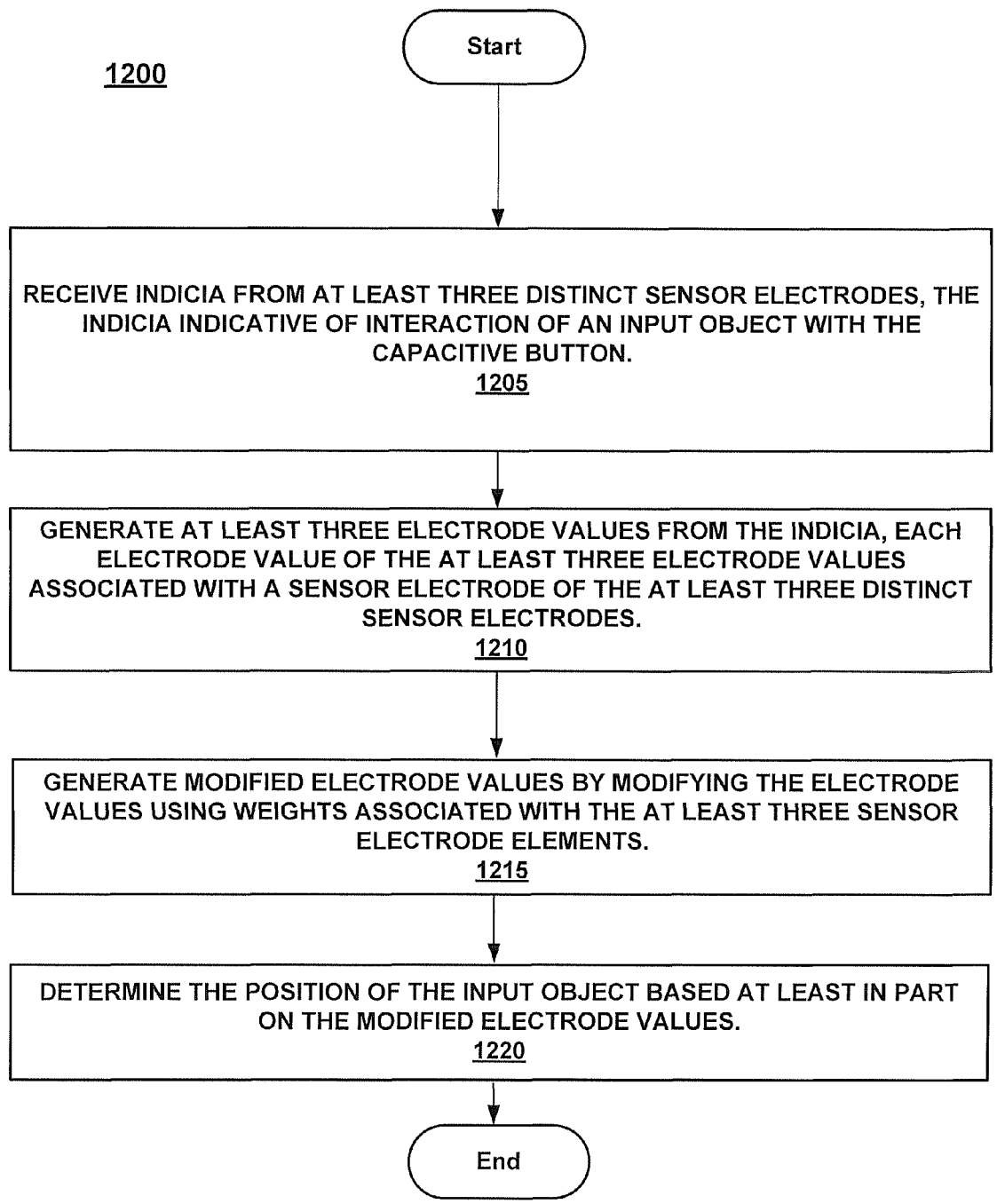
FIG. 12 is a flowchart of an example method for determining a position of an input object using a capacitive button comprising at least three sensor electrode elements associated with at least three distinct sensor electrodes in accordance with embodiments of the present technology.

Referring now to 1205 of FIG. 12 and to FIG. 2A, in some embodiments, the indicia are received from the at least three distinct sensor electrodes, A, B, and C. The indicia are indicative of interaction of the input object with first capacitive button 205. In Equation 10 below, $S_A$, $S_B$, and $S_C$ are electrode values or modified electrode values derived from the indicia received from sensor electrodes A, B, and C, respectively, that are utilized to calculate position.

$$\text{Position} = \frac{(S_A \vec{V}_A + S_B \vec{V}_B + S_C \vec{V}_C)}{(S_A + S_B + S_C)} \quad \text{(Eq. 10)}$$

Furthermore, in one example, the electrode values are effectively adjusted by weighting vectors. For example, the electrode value for sensor electrode A, that being $S_A$, is multiplied by weighting vector $V_A$.

In some embodiments, indicia are received from a plurality of at least four sensor electrodes when the capacitive buttons in the embodiments all have three or fewer sensor electrode elements. Which capacitive button is to be considered is then determined, based at least in part on the indicia. Thus, the capacitive button device identifies which capacitive button(s) may be actuated from a plurality of capacitive buttons. This is especially useful where the plurality of capacitive buttons shares at least one sensor electrode.

Referring now to 1210 of FIG. 12 and to FIG. 2A, some embodiments generates at least three electrode values from the indicia, each electrode value of the at least three electrode values is associated with a sensor electrode of the at least three distinct sensor electrodes, A, B, and C.

Referring now to 1215 of FIG. 12 and to FIG. 2A, some embodiments generate modified electrode values by modifying the electrode values using weights associated with the at least three sensor electrode elements $A_1$, $B_1$, and $C_1$. A weight is based at least in part on a location of an associated sensor electrode element relative to the center position. In some embodiments, the weights are based at least in part on a location, relative to said center position, of an associated sensor electrode element of said at least three sensor electrode elements. In some embodiments, a weight of an associated sensor electrode element is related to a location of a geometric center of the associated sensor electrode element. Additionally, in some embodiments, the center position of an MSE capacitive button is a geometric center of a shape outlined by the at least three distinct sensor electrode elements A, B, and C.

For example, referring to 1220 of FIG. 12 and to FIG. 2A, a position of the input object is determined based at least in part on the modified electrode values. For example, the position of the input object relative to an MSE capacitive button can be estimated by multiplying the electrode values obtained from the sensor electrodes of an MSE capacitive button by their respective sensor electrode elements, summing the thus-weighted vectors, and dividing by the sum of the received electrode values. In some embodiments, determining a position of an input object based at least in part on the modified electrode values comprises comparing a sum of modified electrode values to a sum of the electrode values.

Furthermore, in embodiments of the present technology, the centroid approach may be implemented in a variety of ways, and any appropriate coordinate system may be used. An example coordinate system includes a Cartesian coordinate system (X and Y values) and a Polar coordinate (r and θ values) system.

Determining Position of an Input Object Using Peak Approach

Figure 13:
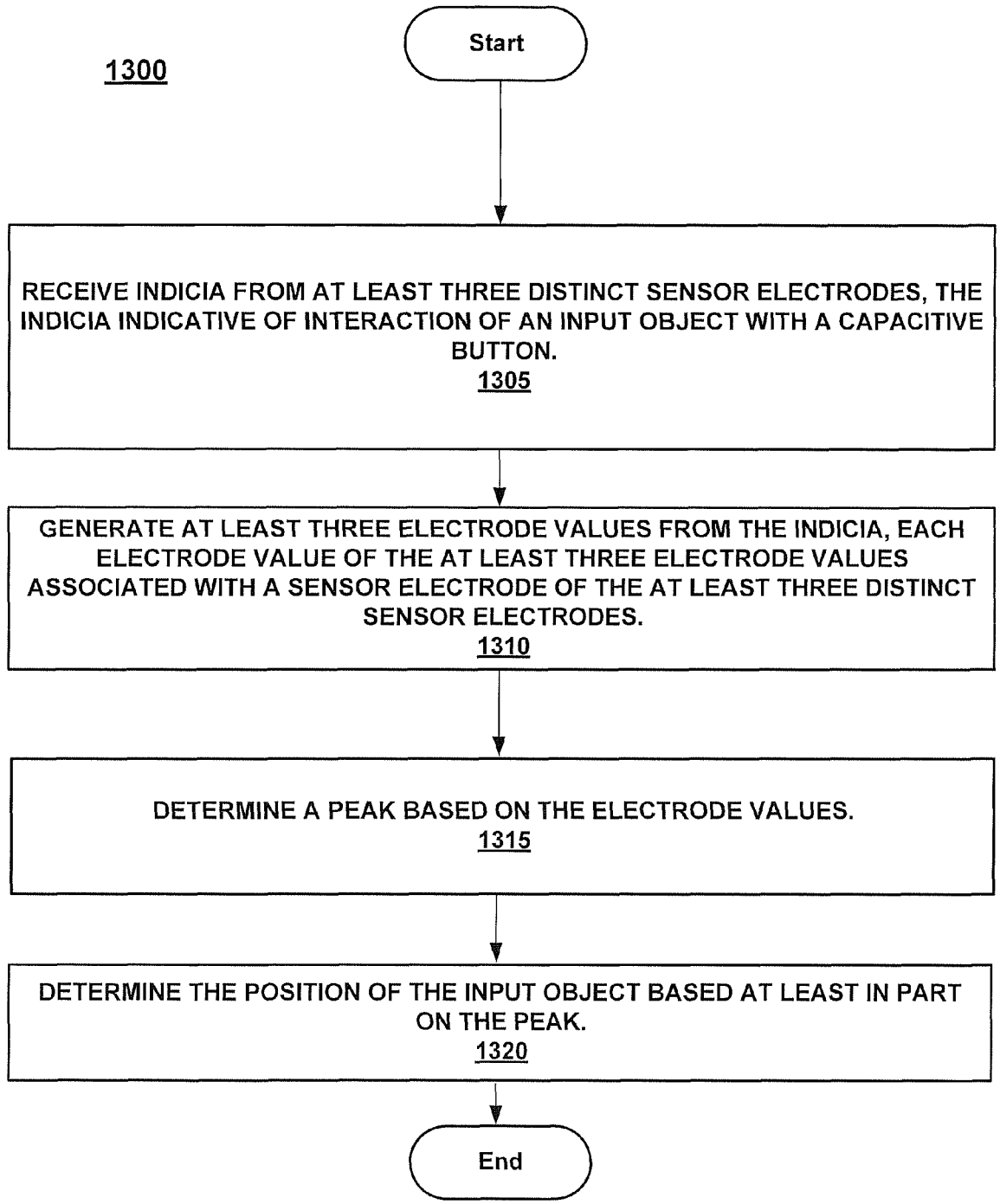
FIG. 13 is a flowchart of an example method for determining a position of an input object using a capacitive button comprising at least three sensor electrode elements associated with at least three distinct sensor electrodes in accordance with embodiments of the present technology.

More generally, in embodiments of the present technology, and referring to 1300 of FIG. 13, the capacitive button arrangement described herein is used to determine a position of an input object using an MSE capacitive button having a center position and comprising at least three sensor electrode elements associated with at least three distinct sensor electrodes, wherein each sensor electrode of the at least three distinct sensor electrodes is associated with at least one sensor electrode element of the at least three sensor electrode elements comprising the capacitive button. Indicia are received from at least three distinct sensor electrodes, a peak is determined based at least in part on the indicia, and a position of the input objects is determined based at least in part on the peak. A position of an input object with respect to the MSE capacitive button may be determined with a peak approach. Discussed below is a peak approach for determining the position of an input object by locating angular and radial aspects of the position of the input object.

More particularly, in some embodiments utilizing peak detect approaches to locate an angular aspect of a position of an input object, the indicia from different sensor electrodes, A, B, and C, are compared to determine which sensor electrode element, $A_1$, $B_1$, and $C_1$, has experienced the greatest change in capacitive coupling. The comparison can be direct (e.g. using the raw indicia) or indirect (e.g. using derivatives of the indicia, such as electrode values or modified electrode values). The input object is assumed to be over that sensor electrode element that has experienced the greatest change in capacitive coupling (e.g. in some embodiments, the input object is further assumed to be over the center of that sensor electrode element).

Referring to 1305 of FIG. 13 and to FIG. 2A, in some embodiments, indicia from at least three distinct sensor electrodes, A, B, and C is received. The indicia is indicative of interaction of the input object with first capacitive button 205.

In some embodiments, indicia are received from a plurality of at least four sensor electrodes when the capacitive buttons in the embodiments all have three or fewer sensor electrode elements. Which capacitive button is to be considered is then determined, based at least in part on the indicia. Thus, the capacitive button device identifies which capacitive button(s) may be actuated from a plurality of capacitive buttons. This is especially useful where the plurality of capacitive buttons shares at least one sensor electrode.

Referring now to 1310 of FIG. 13 and to FIG. 2A, in some embodiments, at least three electrode values are generated from the indicia. Each electrode value of the at least three electrode values are associated with a sensor electrode of the at least three distinct sensor electrodes, A, B, and C.

Referring now to 1315 of FIG. 13 and to FIG. 2A, in some embodiments, a peak is determined, based on the electrode values or modified electrode values. In some embodiments, it is determined which sensor electrode of the at least three distinct sensor electrodes, A, B, and C, has the largest electrode value. In another peak detect approach to locate an angular aspect of a position of an input object, the electrode values may be used to generate estimated electrode values by at least one of extrapolation and interpolation. The estimated electrode values can then be used to determine position. Many different methods can be used to interpolate or extrapolate.

For example, one way to calculate the angular aspect of a position is shown in Equation 11 below. In many embodiments, the offset is determined by examining the sensor electrode element associated with the peak sensor electrode, and one or more sensor electrodes having adjacent sensor electrode elements.

$$\text{Angular Aspect of Position} = \frac{(\max\lfloor S_{A-C}\rfloor - (\text{second largest})\lfloor S_{A-C}\rfloor)}{(\max[S_{A-C}])} + \text{offset} \quad \text{(Eq. 11)}$$

$$\text{Angular Aspect of Position} = \frac{(\max\lfloor S_{A-C}\rfloor - (\text{second largest})\lfloor S_{A-C}\rfloor)}{(\max[S_{A-C}])} \quad \text{(Eq. 11)}$$

If indicated externally, the angular aspect of a position can be expressed in polar coordinates (e.g. θ) or in any other appropriate coordinate system.

In some embodiments, determining the peak based on the electrode values comprises generating estimated electrode values by at least one of extrapolating and interpolating the electrode values.

Referring now to 1320 of FIG. 13 and to FIG. 2A, in some embodiments, a position of the input object is determined based at least in part on the peak. In some embodiments, the location of the peak relative to the capacitive button is determined. In some embodiments, determining the radial aspect of the position of the input object based at least in part on the peak comprises determining a span (e.g. maximum electrode value) of at least three electrode values. The position of the input object relative to the MSE capacitive button is then determined based at least in part on the span of the at least three electrode values. In some embodiments, this can be implemented by the capacitive button device determining a peak based on the electrode values, determining a trough based on the electrode values, and comparing a difference between the peak and the trough with a sum of the peak and the trough.

Additionally, in some embodiments, determining the position of the input object relative to the MSE capacitive button based at least in part on the span of the at least three electrode values comprises comparing the difference between a largest and a smallest indicia with a sum of a greatest and a smallest indicia.

For example, the radial aspect of a position can be determined as a function of the values of the indicia, rather than merely which indicia ("indicia" is used here to mean a single indicium) is greatest. For example, the radial aspect of a position can be based on the difference between the maximum electrode value and the minimum electrode value (i.e. radial aspect of a position=function (max $[S_{A-C}]$–min $[S_{A-C}]$). One way to calculate the radial aspect of a position is shown in Equation 12 below:

$$\text{Radial Aspect of Position} = \frac{(\max\lfloor S_{A-C}\rfloor - \min\lfloor S_{A-C}\rfloor)}{(\max[S_{A-C}] + \min[S_{A-C}])} \quad (12)$$

The radial aspect of a position can be expressed in polar coordinates (e.g. r) or in any other appropriate coordinate system.

In some cases, especially where nonlinearities are predictable and significant, it may be desirable to apply a correction to the uncorrected positions. One method to accomplish this is discussed in relation to Equation 13. The corrected position may also be some other measurement, indicia, or other values not directly related to the uncorrected positions. This is shown in Equation 13 below:

Corrected Position=Function(Uncorrected Position, Optional Other Items). (Eq. 13)

In many cases where the MSE capacitive button is circular and the sensor electrode elements are regular, the angular aspect of a position would likely not need to be corrected. This means that correcting the radial aspect of a position only may be sufficient, as is shown in Equation 14 below:

Corrected Radial Aspect of Position=Function(Uncorrected Position) (Eq. 14)

The correction may be implemented as a correction function, a look-up table of offsets, multiplicative factors, or other adjustment factors, and the like.

The foregoing descriptions of specific embodiments have been presented for purposes of illustration and description. They are not intended to be exhaustive or to limit embodiments of the presented technology to the precise forms disclosed, and many modifications and variations are possible in light of the above teaching. The embodiments were chosen and described in order to best explain the principles of the present technology and its practical application, to thereby enable others skilled in the art to best utilize embodiments of the present technology and various embodiments with various modifications as are suited to the particular use contemplated. It is intended that the scope of embodiments of the present technology be defined by the claims appended hereto and their equivalents.

What is claimed is:

1. A method for indicating actuation of a capacitive button comprising at least three sensor electrode elements, said method comprising:
receiving indicia from at least three distinct sensor electrodes, each sensor electrode of said at least three distinct sensor electrodes associated with at least one sensor electrode element of said at least three sensor electrode elements comprising said capacitive button, said indicia indicative of interaction of an input object with said capacitive button; and
identifying said capacitive button from a plurality of capacitive buttons, said plurality of capacitive buttons sharing at least one sensor electrode of said at least three distinct sensor electrodes;
determining actuation of said capacitive button based at least in part on satisfaction of a set of criteria, said set of criteria comprising:
a location condition concerning a location of said input object relative to a center of said capacitive button, wherein said location of said input object is gauged at least in part based on said indicia; and
a coupling condition concerning a magnitude of change in capacitive coupling of said at least three distinct sensor electrodes, wherein said coupling condition comprises said magnitude of said change in capacitive coupling satisfying a first threshold magnitude, wherein said magnitude of said change in capacitive coupling of said at least three distinct sensor electrodes is gauged at least in part based on said indicia.

2. The method of claim 1 wherein said location condition comprises said location of said input object being within a threshold distance of said center of said capacitive button.

3. The method of claim 1 further comprising:
indicating actuation of said capacitive button at a time when said set of criteria is satisfied.

4. The method of claim 1 wherein said location of said input object is a location of said input object at a time defined by when said set of criteria is no longer satisfied, wherein said time when said set of criteria is no longer satisfied occurs substantially immediately after a time when said set of criteria is satisfied, and wherein said location condition comprises said location being within a threshold distance of said center of said capacitive button, the method further comprising:
indicating actuation of said capacitive button no earlier than said time when said set of criteria is no longer satisfied.

5. The method of claim 1 wherein said magnitude of said change in capacitive coupling of said at least three distinct sensor electrodes is gauged at least in part based on said indicia by using said indicia to determine at least three distinct electrode values, each distinct electrode value of said at least three distinct electrode values associated with a different sensor electrode of said at least three distinct sensor electrodes, and wherein
said coupling condition comprises said magnitude of said change in capacitive coupling satisfying a first threshold magnitude by: requiring at least one of said distinct electrode values to be greater than said first threshold magnitude.

6. The method of claim 1 wherein said coupling condition comprises said change in said capacitive coupling occurring at least at a predetermined rate.

7. The method of claim 1 wherein said set of criteria further comprises:
a duration condition concerning an amount of time said input object interacts with said capacitive button, wherein said duration condition comprises said amount of time being greater than a first threshold duration, and wherein said amount of time said input object interacts with said capacitive button is gauged at least in part based on said indicia.

8. The method of claim 1 wherein said set of criteria further comprises:
a speed condition concerning a lateral speed of said input object relative to said capacitive button, said speed condition comprising said lateral speed of said input object being less than a threshold speed during a time when said coupling condition is satisfied, wherein said lateral speed of said input object is gauged at least in part based on said indicia.

9. The method of claim 1 wherein said set of criteria further comprises:
a distance condition concerning a total lateral distance traveled by said input object relative to said capacitive button during a time when said coupling condition is satisfied, wherein said distance condition comprises said total lateral distance being less than a threshold lateral distance, and wherein said total lateral distance is gauged based at least in part on said indicia.

10. The method of claim 1 wherein said set of criteria further comprises:
an approach condition concerning a direction of approach by said input object relative to said capacitive button during a time when said coupling condition is satisfied, wherein said approach condition comprises said direction of approach being substantially orthogonal to a surface associated with said capacitive button, and wherein said direction of approach is gauged based at least in part on said indicia.

11. The method of claim 1, wherein said magnitude of said change in capacitive coupling of said at least three distinct sensor electrodes is gauged at least in part based on said indicia by:
using said indicia to determine at least three distinct electrode values, each distinct electrode value of said at least three distinct electrode values associated with a different sensor electrode of said at least three distinct sensor electrodes, and
using a total of said distinct electrode values, and wherein said coupling condition comprises said magnitude of said change in capacitive coupling satisfying a first threshold magnitude by:
requiring said total of said distinct electrode values to be greater than said first threshold magnitude.

12. The method of claim 11, wherein said coupling condition further comprises:
said magnitude of said change in capacitive coupling being less than a second threshold magnitude, wherein said second threshold magnitude is greater than said first threshold magnitude.

13. The method of claim 1 further comprising:
receiving indicia from an unassociated sensor electrode, said unassociated sensor electrode not associated with any sensor electrode elements of said capacitive button, wherein said magnitude of said change in capacitive coupling of said at least three distinct sensor electrodes is gauged at least in part based on said indicia by:
using said indicia from said at least three distinct sensor electrodes to determine distinct electrode values for said at least three distinct sensor electrodes,
using said indicia from said unassociated sensor electrode to determine an unassociated electrode value, and
using a difference between total of said distinct electrode values and said unassociated electrode value.

14. The method of claim 1 further comprising:
determining a swipe interaction with said capacitive button if a lateral speed of said input object relative to said capacitive button is in a first range of lateral speeds, wherein said lateral speed of said input object is gauged at least in part based on said indicia.

15. The method of claim 1 further comprising:
determining a swipe interaction with said capacitive button if a total lateral distance traveled by said input object relative to said capacitive button is greater than a threshold lateral distance, wherein said total lateral distance traveled by said input object is gauged at least in part based on said indicia.

16. The method of claim 1 wherein said change in capacitive coupling of said at least three distinct sensor electrodes comprises a plurality of variations in capacitive coupling, each of said plurality of variations in capacitive coupling associated with one of said at least three distinct sensor electrodes, the method further comprising:
increasing a rate of receiving indicia from said at least three distinct sensor electrodes responsive to at least one of said plurality of variations in capacitive coupling satisfying an activation threshold for a first time period.

17. The method of claim 16 further comprising:
decreasing said rate of receiving indicia from said at least three distinct sensor electrodes responsive to at least one of said plurality of variations in capacitive coupling satisfying a deactivation threshold for a second time period.

18. A method for tuning at least one threshold in a system comprising a capacitive button comprising at least three sensor electrode elements associated with at least three distinct sensor electrodes, said method comprising:
receiving indicia from said at least three distinct sensor electrodes associated with said at least three sensor electrode elements comprising said capacitive button, said indicia provided by one of an actual interaction and a simulated interaction of an input object with said capacitive button;
identifying said capacitive button from a plurality of capacitive buttons, said plurality of capacitive buttons sharing at least one sensor electrode of said at least three distinct sensor electrodes; and
tuning a response confidence for indicating an actuation of said capacitive button based at least in part on said indicia.

19. A method for determining a position of an input object using a capacitive button comprising at least three sensor electrode elements associated with at least three distinct sensor electrodes, wherein each sensor electrode of said at least three distinct sensor electrodes is associated with at least one sensor electrode element of said at least three sensor electrode elements comprising said capacitive button, said method comprising:
receiving indicia from said at least three distinct sensor electrodes, said indicia indicative of interaction of said input object with said capacitive button;
identifying said capacitive button from a plurality of capacitive buttons, said plurality of capacitive buttons sharing at least one sensor electrode of said at least three distinct sensor electrodes;
generating at least three electrode values from said indicia, each electrode value of said at least three electrode values associated with a sensor electrode of said at least three distinct sensor electrodes;
generating modified electrode values by modifying said electrode values using weights associated with said at least three sensor electrode elements; and
determining said position of said input object based at least in part on said modified electrode values.

20. The method of claim 19, wherein each of said weights is based at least in part on a location, relative to a center position, of an associated sensor electrode element of said at least three sensor electrode elements.

21. The method of claim 20 wherein said location of said associated sensor electrode element is a geometric center of said associated sensor electrode element, and wherein a center position of said capacitive button is a geometric center of a shape outlined by said at least three sensor electrode elements.

22. The method of claim 19 wherein said determining said position of said input object based at least in part on said modified electrode values comprises:

comparing a sum of said modified electrode values with a sum of said electrode values.

23. A method for determining a position of an input object using a capacitive button having a center position and comprising at least three sensor electrode elements associated with at least three distinct sensor electrodes, wherein each sensor electrode of said at least three distinct sensor electrodes is associated with at least one sensor electrode element of said at least three sensor electrode elements comprising said capacitive button, said method comprising:
- receiving indicia from at least three distinct sensor electrodes, said indicia indicative of interaction of said input object with said capacitive button;
- identifying said capacitive button from a plurality of capacitive buttons, said plurality of capacitive buttons sharing at least one sensor electrode of said at least three distinct sensor electrodes;
- generating at least three electrode values from said indicia, each electrode value of said at least three electrode values associated with a sensor electrode of said at least three distinct sensor electrodes;
- determining a peak based on said electrode values; and
- determining said position of said input object based at least in part on said peak.

24. The method of claim 23 wherein said determining said peak based on said electrode values comprises:
- determining which sensor electrode of said at least three distinct sensor electrodes has a largest electrode value.

25. The method of claim 23 wherein said determining said position of said input object based at least in part on said peak comprises:
- generating estimated electrode values by at least one of extrapolating and interpolating said at least three electrode values.

26. The method of claim 23 further comprising:
- determining a trough based on said electrode values
- comparing a difference between said peak and said trough with a sum of said peak and said trough.

27. A capacitive button device comprising:
- a plurality of sensor electrodes;
- a first capacitive button comprising at least three sensor electrode elements associated with a first subset of said plurality of sensor electrodes;
- a second capacitive button comprising at least three sensor electrode elements associated with a second subset of said plurality of sensor electrodes, wherein said first subset and said second subset includes at least one sensor electrode in common; and
- a controller coupled to said plurality of sensor electrodes, said controller configured to:
  - receive indicia from said plurality of sensor electrodes, said indicia indicative of interaction of an input object with said first capacitive button;
  - determine interaction of said input object with said first capacitive button based at least in part on said indicia; and
  - determine actuation of said first capacitive button based at least in part on satisfaction of a set of criteria, said set of criteria comprising:
    - a location condition concerning a location of said input object relative to a center of said first capacitive button, wherein said location of said input object is gauged at least in part based on said indicia;
    - a coupling condition concerning a magnitude of change in capacitive coupling of said first subset of said plurality of sensor electrodes, wherein said coupling condition comprises said magnitude of said change in capacitive coupling satisfying a first threshold magnitude, wherein said magnitude of said change in capacitive coupling of said first subset of said plurality of sensor electrodes is gauged at least in part based on said indicia; and
    - a duration condition concerning an amount of time said input object interacts with said first capacitive button, wherein said duration condition comprises said amount of time being greater than a first threshold duration, and wherein said amount of time said input object interacts with said first capacitive button is gauged at least in part based on said indicia.

28. The device of claim 27 wherein said controller is further configured to change a rate of receiving indicia from said plurality of sensor electrodes responsive to satisfaction of said coupling condition for a time period.

29. The device of claim 27 wherein said location condition comprises said location of said input object being within a threshold distance of said center of said first capacitive button.

30. The device of claim 27 wherein said set of criteria further comprises:
- a maximum lateral motion condition concerning a lateral motion of said input object during a time when said coupling condition is satisfied, wherein said lateral motion of said input object is gauged at least in part based on said indicia.

* * * * *